US012493390B2

(12) United States Patent
Jang et al.

(10) Patent No.: US 12,493,390 B2
(45) Date of Patent: *Dec. 9, 2025

(54) DISPLAY DEVICE

(71) Applicant: SAMSUNG DISPLAY CO., LTD., Yongin-si (KR)

(72) Inventors: Min Jun Jang, Yongin-si (KR); Sung Hoon Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/650,067

(22) Filed: Apr. 29, 2024

(65) Prior Publication Data

US 2024/0284750 A1 Aug. 22, 2024

Related U.S. Application Data

(63) Continuation of application No. 17/878,067, filed on Aug. 1, 2022, now Pat. No. 11,974,487, which is a
(Continued)

(30) Foreign Application Priority Data

Nov. 27, 2018 (KR) .................. 10-2018-0148162

(51) Int. Cl.
*H10K 59/40* (2023.01)
*G06F 3/044* (2006.01)
(Continued)

(52) U.S. Cl.
CPC ......... *G06F 3/0446* (2019.05); *H10K 59/121* (2023.02); *H10K 59/131* (2023.02); *H10K 59/40* (2023.02); *H10K 59/8731* (2023.02)

(58) Field of Classification Search
CPC ...... H10K 59/40; H10K 50/84; H10K 59/121; H10K 59/131; H10K 59/8731;
(Continued)

(56) References Cited

U.S. PATENT DOCUMENTS 10,840,313 B2  11/2020  Jang et al.
11,411,055 B2  8/2022  Jang et al.
(Continued)

FOREIGN PATENT DOCUMENTS

CN  108132732 A  6/2018
KR  10-2017-0066767  6/2017
(Continued)

OTHER PUBLICATIONS

Notice of Allowance dated Aug. 26, 2020, in U.S. Appl. No. 16/596,050.
(Continued)

*Primary Examiner* — Tong-Ho Kim
(74) *Attorney, Agent, or Firm* — Womble Bond Dickinson (US) LLP

(57) ABSTRACT

A display device includes: a light-emitting substrate including a base substrate having a non-display area and a display area that surrounds the non-display area; an input sensing unit disposed on the light-emitting substrate; and a hole penetrating front and rear surfaces of each of the light-emitting substrate and the input sensing unit, wherein the light-emitting substrate includes a plurality of recesses, the non-display area includes a hole area which overlaps with the hole, a recess area in which the plurality of recesses are disposed and surrounds the hole area, and a peripheral area which surrounds the recess area, and the input sensing unit includes a plurality of first sensor members overlapping the display area and a first connector connecting the first sensor members and overlapping the groove area.

22 Claims, 37 Drawing Sheets

Related U.S. Application Data continuation of application No. 17/066,797, filed on Oct. 9, 2020, now Pat. No. 11,411,055, which is a continuation of application No. 16/596,050, filed on Oct. 8, 2019, now Pat. No. 10,840,313.

(51) Int. Cl.
  *H10K 50/84* (2023.01)
  *H10K 59/121* (2023.01)
  *H10K 59/131* (2023.01)
  *H10K 59/80* (2023.01)

(58) Field of Classification Search
  CPC ........ H10K 59/65; H10K 59/87; H10K 59/88; H10K 77/10; G06F 3/0412; G06F 3/04164; G06F 3/0443; G06F 3/0446
  USPC .......................................................... 257/40
  See application file for complete search history.

(56) References Cited

U.S. PATENT DOCUMENTS

| | | | |
|---|---|---|---|
| 11,974,487 B2* | 4/2024 | Jang | ...................... G06F 3/0443 |
| 2017/0287992 A1 | 10/2017 | Kwak et al. | |
| 2018/0246608 A1 | 8/2018 | Huh et al. | |
| 2018/0329552 A1 | 11/2018 | Song et al. | |
| 2020/0110525 A1 | 4/2020 | Park et al. | |
| 2020/0127233 A1 | 4/2020 | Sung et al. | |

FOREIGN PATENT DOCUMENTS

| KR | 10-2017-0096565 | 8/2017 |
|---|---|---|
| KR | 10-2017-0115177 | 10/2017 |
| KR | 2017-0111827 | 10/2017 |
| KR | 10-2017-0064598 | 12/2017 |
| KR | 2020-0033376 | 3/2020 |
| KR | 2020-0039894 | 4/2020 |

OTHER PUBLICATIONS

Non-Final Office Action dated Dec. 15, 2021, in U.S. Appl. No. 17/066,797.

Notice of Allowance dated Mar. 29, 2022, in U.S. Appl. No. 17/066,797.

Korean Notice of Allowance issued in corresponding Application No. KR 10-2024-0050604, dated Dec. 11, 2024, 2 pages.

\* cited by examiner

DISPLAY DEVICE

CROSS-REFERENCE TO RELATED APPLICATIONS

This application is a continuation of U.S. patent application Ser. No. 17/878,067, filed Aug. 1, 2022, which is a continuation of U.S. patent application Ser. No. 17/066,797, filed Oct. 9, 2020, now U.S. Pat. No. 11,411,055, which is a continuation of U.S. patent application Ser. No. 16/596,050, filed Oct. 8, 2019, now U.S. Pat. No. 10,840,313, which claims priority to and the benefit of Korean Patent Application No. 10-2018-0148162, filed Nov. 27, 2018, the entire content of all of which is incorporated herein by reference

BACKGROUND

Field

Exemplary implementations of the invention relate generally to a display device and, more particularly, to a display device having a touch screen display and one or more holes in the display to accommodate features like cameras.

Discussion of the Background

Display devices have become increasingly important with the development of multimedia. Accordingly, various display devices such as an organic light-emitting diode (OLED) display device, a liquid crystal display device (LCD), and the like have been developed and used.

Meanwhile, a touch sensing unit, which is a type of information input device, may be provided and used in a display device. For example, a touch sensor may be attached to one surface of a display panel or may be formed in one integral body with the display panel. Then, a user can enter information by pressing or touching the touch sensing unit while viewing images displayed on the screen of the display device.

The display device may include a hole in its display area, and the sensors of a camera or the like may be disposed in the hole.

The above information disclosed in this Background section is only for understanding of the background of the inventive concepts, and, therefore, it may contain information that does not constitute prior art.

SUMMARY

Display devices constructed according to exemplary implementations of the invention have improved touch recognition in areas near a hole in the display to accommodate a feature like a camera. According to the principles and exemplary embodiments of the invention, signal interference between the electrical components in the display can be reduced, as can dead spaces. Fro example, in exemplary embodiments of the invention the signal interference between signal lines connected to pixels and connecting wires connected to touch electrodes can be reduced, and as a result, touch performance can be improved. Also, dead space in the display device between a hole and a display area can be reduced, which increases touch sensitivity.

Additional features of the inventive concepts will be set forth in the description which follows, and in part will be apparent from the description, or may be learned by practice of the inventive concepts.

According to an embodiment of the invention, a display device includes: a light-emitting substrate including a base substrate having a non-display area and a display area that surrounds the non-display area are defined; an input sensing unit disposed on the light-emitting substrate; and a hole penetrating front and rear surfaces of the light-emitting substrate and front and rear surfaces of the input sensing unit, wherein the light-emitting substrate includes a plurality of recesses, the non-display area includes a hole area which overlaps with the hole, a recess area in which the plurality of recesses are disposed and surrounds the hole area, and a peripheral area which surrounds the recess area, and the input sensing unit includes a plurality of first sensor members overlapping the display area and a first connector connecting the plurality of first sensor members overlapping with the recess area.

The recesses may include grooves from which parts of the base substrate are removed, and the recess area may include a groove area.

The light-emitting substrate may further include a circuit layer which is disposed on the base substrate, a light-emitting element layer which is disposed on the circuit layer, a thin-film encapsulation layer which is disposed on the light-emitting element layer, and a first capping layer which is disposed on the thin-film encapsulation layer and includes an inorganic material, and the input sensing unit is disposed on the first capping layer.

The peripheral area may not include the plurality of grooves and may be disposed between the groove area and the display area, and a sum of thicknesses of the base substrate, the circuit layer, the light-emitting element layer, and the thin-film encapsulation layer is substantially the same in both the peripheral area and the display area.

The thin-film encapsulation layer may include a first inorganic film, an organic film, and a second inorganic film, and the light-emitting substrate may further include a hole overcoat layer which is disposed between the second inorganic film and the first capping layer.

The hole overcoat layer may overlap with the groove area.

The first capping layer may be disposed on substantially an entire surface of the base substrate, and the input sensing unit may be disposed on the first capping layer.

Two of the plurality of first sensor members may be disposed adjacent to each other in a first direction with the hole interposed therebetween.

The input sensing unit may further include second sensor members, two of which are disposed adjacent to each other in a second direction that intersects the first direction with the hole interposed therebetween and a second connector connecting the two second sensor members, and the second connector is disposed to overlap with the groove area.

The first connector may include a first connecting wire and the second connector may include a second connecting wire insulated from the first connecting wire.

The input sensing unit may include a first touch conductive layer, a second touch conductive layer, and a touch insulating layer disposed between the first and second touch conductive layers, and the first sensor members, the second sensor members, the first connecting wire, and the second connecting wire may be disposed in the first touch conductive layer.

The input sensing unit may further include a first bridge connector which is disposed in the second touch conductive layer, and the first connecting wire may be connected to the first bridge connector.

The first bridge connector and the second connecting wire intersect and may be insulated from each other.

The input sensing unit may further include two first electrode patterns which are disposed in each of the two of the plurality of first sensor members and a third connector which connects the two first electrode patterns, the two first electrode patterns are insulated from each of the two first sensor members, and the third connector is disposed to overlap with the groove area.

The input sensing unit may further include two second electrode patterns disposed in each of the two second sensor members, and the two second electrode patterns may be insulated from each of the two second sensor members.

The two second electrode patterns may be dummy patterns.

The first sensor members may include sensing electrodes, and the second sensor members may include driving electrodes.

The input sensing unit may further include two second sensor members disposed adjacent to each other in a second direction that intersects the first direction and a second connector which connects the two second sensor members, and the second connector is disposed to overlap with the peripheral area.

According to another embodiment of the invention, a display device includes: a light-emitting substrate including a hole penetrating front and rear surfaces of the light-emitting substrate; and an input sensing unit disposed on the light-emitting substrate and including first detection electrodes extending in a first direction, wherein the light-emitting substrate includes a base substrate having a display area and a hole area, a recess area, and a peripheral area that are surrounded by the display area, a plurality of pixels disposed on the base substrate, and signal lines connected to the pixels, the base substrate includes a plurality of recesses in the recess area, the hole area overlaps with the hole, the recess area overlaps with the plurality of recesses, the peripheral area is disposed between the recess area and the display area, the first detection electrodes include two first sensor members disposed adjacent to each other with the hole interposed therebetween in a plan view and a first connector connecting the first two sensor members, the signal lines overlap with the peripheral area, but not with the recess area, and the first connector overlaps with the groove area.

The recess area may include a groove area, the recesses may include grooves from which parts of the base substrate are removed, and the first connector may include a connecting wire.

The pixels may include light-emitting elements, the light-emitting elements may be disposed in the display area, but may not be in the peripheral area and the recess area.

The input sensing unit may further include second detection electrodes extending in a second direction that intersects the first direction, the second detection electrodes may include a plurality of second sensor members disposed adjacent to one another in the second direction, and the second detection electrodes may be insulated from the first detection electrodes.

The input sensing unit may include a first touch conductive layer, a second touch conductive layer, and a touch insulating layer disposed between the first and second touch conductive layers, the first sensor members may be disposed in the first touch conductive layer, and the second sensor members may be disposed in the second touch conductive layer.

The second sensor members may include two second sensor members disposed adjacent to each other with the hole area interposed therebetween, and the input sensing unit may further include a second connector connecting the two second sensor members.

The second connector may be disposed in the groove area.

The second connector may bypasses the hole area from an outside of the first connector and may be disposed in the peripheral area, but not in the groove area.

According to another exemplary embodiment, a display device including a display area and a non-display area having a hole area disposed adjacent to the display area, the display device includes: a light-emitting display unit including signal lines; and a touch sensing unit disposed on the light-emitting display unit and including touch sensing wires, wherein the hole area includes a through hole penetrating both the light-emitting display unit and the touch sensing unit in a thickness direction and a recess area disposed near the through hole, a portion of the signal lines are disposed in the non-display area, the touch sensing wires are disposed in the display area and in the recess area, and the touch sensing wires in the recess area do not overlap with the signal lines.

According to still another exemplary embodiment, a display device includes: a light-emitting unit including a base substrate having a non-display area and a display area that surrounds the non-display area; a sensing unit disposed on the light-emitting unit; and a hole penetrating front and rear surfaces of the light-emitting unit and front and rear surfaces of the sensing unit, wherein the base substrate includes at least one recess, the non-display area includes a first area which overlaps with the hole, a second area in which the at least one recess is disposed and surrounds the first area, and a third area which surrounds the second area, and the sensing unit includes a plurality of first electrodes overlapping the display area and a first connector connecting the plurality of first electrodes and overlapping the second area.

Other features and embodiments may be apparent from the following detailed description, the drawings, and the claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
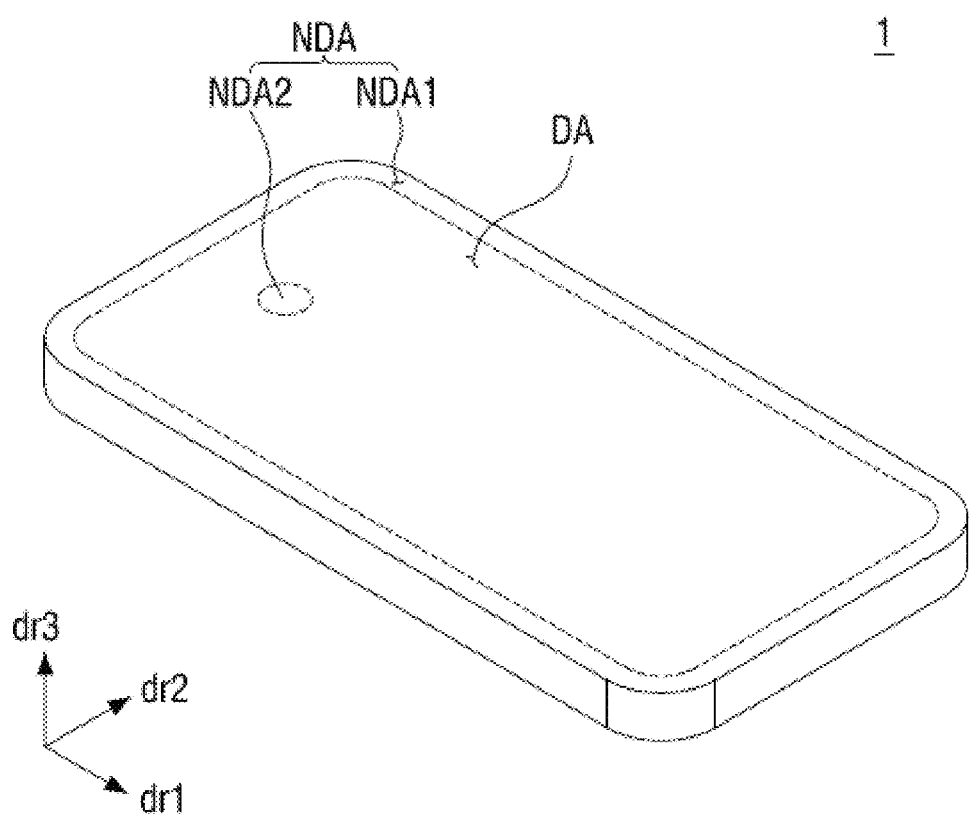
FIG. 1 is a perspective view of an organic light-emitting diode (OLED) display device constructed according to an embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Display devices according to various embodiments of the invention are devices for displaying moving images or still images, or stereoscopic images, and can be used not only in mobile electronic devices such as mobile communication terminals, smartphones, tablet PCs, smartwatches, and navigation devices, but also in various other products such as televisions (TVs), notebook computers, monitors, billboards, or Internet of Things (IoT) devices.

Embodiments of the invention will hereinafter be described with reference to the accompanying drawings. In the description that follows, an organic light-emitting diode (OLED) display device will be described as an exemplary display device, but the inventive concepts are not limited thereto. That is, the inventive concepts are also applicable to other display devices such as a liquid crystal display (LCD) device, a field emission display (FED) device, an electrophoretic display (EPD) device, a quantum dot light-emitting diode (QLED) display device, or a micro light-emitting diode (mLED) display device. In the drawings, like (or similar) reference numerals indicate like elements.

Figure 2:
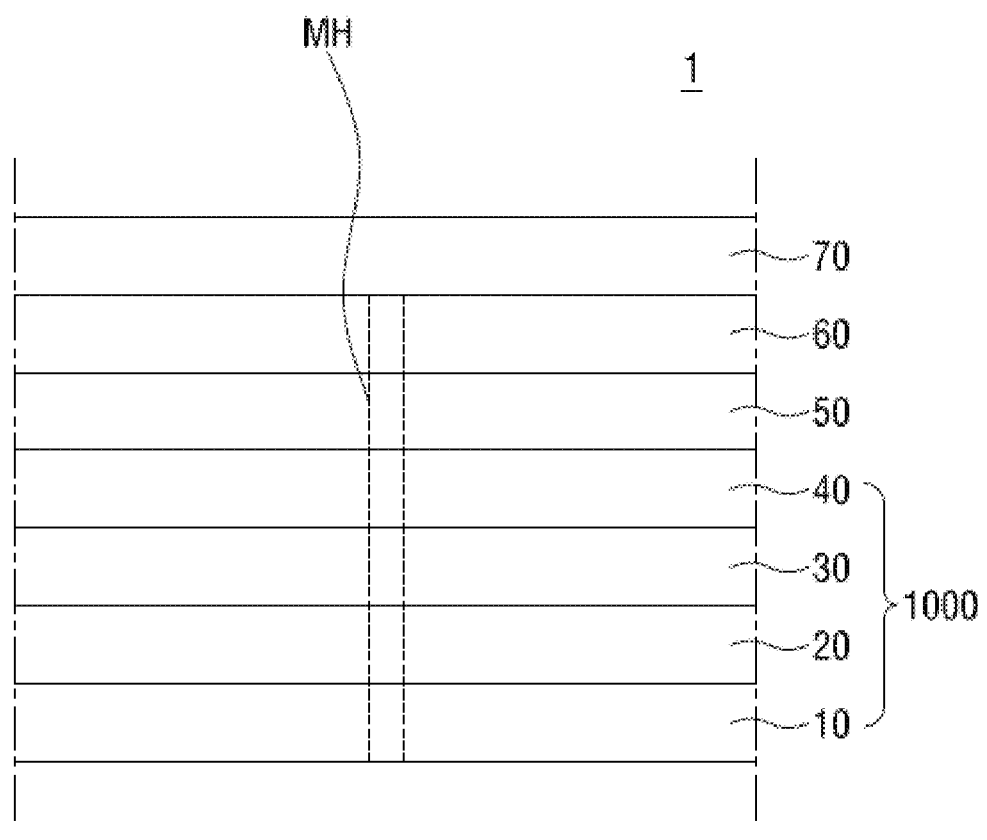
FIG. 2 is a cross-sectional view of the OLED display device according to the embodiment of FIG. 1.

FIG. 1 is a perspective view of an OLED display device according to an embodiment of the invention. FIG. 2 is a cross-sectional view of the OLED display device according to the embodiment of FIG. 1.

Referring to FIGS. 1 and 2, an OLED display device 1 may include a display area DA and a non-display area NDA.

The display area DA is defined as an area in which an image is displayed. The OLED display device 1 may include a plurality of pixels. The display area DA may include multiple-color light-emitting areas, and one pixel corresponds to one light-emitting area. The display area DA may be used not only as an area for displaying an image, but also as an area for recognizing touch input from a user.

The OLED display device 1 may display an image in the display area DA (or on a front display surface thereof). The display area DA may be generally parallel to a surface defined by a first directional axis (i.e., an axis extending in a first direction dr1) and a second directional axis (i.e., an axis extending in a second direction dr2). The normal direction of the display surface, i.e., the thickness direction of the OLED display device 1, may be defined as a third direction dr3.

The front (or top) surfaces and the rear (or bottom) surfaces of the elements or units of the OLED display device 1 may be defined with respect to the third direction dr3. However, the first, second, and third directions dr1, dr2, and dr3 are exemplary and may thus be replaced with other directions. The first, second, and third directions dr1, dr2, and dr3 refer to the same directions throughout the accompanying drawings.

In one embodiment, the OLED display device 1 may include a flat display area DA, but the inventive concepts are not limited thereto. In other embodiments, the OLED display device 1 may include a curved display area or a stereoscopic display area. The stereoscopic display area may include multiple display areas indicating different directions and may include, for example, a polygonal columnar display surface.

The non-display area NDA is defined as an area in which no image is displayed. The non-display area NDA includes a first non-display area NDA surrounding the display area DA and a second non-display area NDA2 disposed inside the display area DA.

The display area DA may have a rectangular shape and may have rounded corners. The first non-display area NDA1 may surround the display area DA, but the inventive concepts are not limited thereto. The shapes of the display area DA and the first non-display area NDA1 may be designed in relation to each other. A speaker module, a camera module, and the like may be disposed in a part of the first non-display area NDA1.

In one embodiment, the OLED display device 1 may include the second non-display area NDA2, which is formed to be surrounded by the display area DA. That is, the second non-display area NDA2 may be disposed inside the display area DA. The second non-display area NDA2 is defined as an area which includes a hole AH (or an inner groove) and in which no image is displayed.

In one embodiment, the hole AH may have a circular shape in a plan view. The hole AH may be in a cylindrical shape, but the inventive concepts are not limited thereto. That is, the hole AH may have various shapes other than a cylindrical shape. In some embodiments, the hole AH may have a polygonal shape or an irregular shape in a plan view, in which case, the hole AH may be in the shape of a polygonal or irregular column.

Since the OLED display device 1 includes the hole AH, a thin display device can be realized.

The second non-display area NDA2 may include a main hole area MH, which overlaps with the hole AH, a groove area GA, and a peripheral area AHA. The peripheral area AHA may be disposed between the main hole area MH and the display area DA.

A camera module and a sensor module may be disposed on a lower side of the OLED display device 1 (e.g., on the rear surface opposite to the front surface of a light-emitting substrate 1000 of FIG. 2). In one embodiment, the sensor module may include at least one of an ambient light sensor, a proximity sensor, an infrared sensor, and an ultrasonic sensor. That is, the camera module and the sensor module may be disposed within and/or to overlap with the hole AH.

The expression "two elements overlap with each other", as used herein, means that the two elements overlap with each other in the thickness direction of the OLED display device 1 (i.e., the third direction dr3), unless specified otherwise.

As described above with reference to FIG. 1, the OLED display device 1 includes the hole AH, which is formed in the second non-display area NDA2, and the camera module and the sensor module are disposed to overlap with the hole AH. Thus, dead space in the OLED display device 1 can be minimized as compared to a case where the camera module and the sensor module are disposed only in the first non-display area NDA1.

The OLED display device 1 may be a rigid device, but the inventive concepts are not limited thereto. Alternatively, the OLED display device 1 may be a flexible device. FIG. 1 illustrates an exemplary OLED display device 1 that is applicable to a smartphone. Electronic modules mounted on a main board, a camera module, a power module, and the like may be arranged in a bracket/case together with the OLED display device 1 to form a smartphone.

The OLED display device 1 may include the light-emitting substrate 1000, an input sensing unit 50, an anti-reflection unit 60, and a window unit 70. At least some of the light-emitting substrate 1000, the input sensing unit 50, the anti-reflection unit 60, and the window unit 70 may be formed by continuous processes and may be bonded to one another by an adhesive member. An optically clear adhesive (OCA) may be used as the adhesive member, but the inventive concepts are not limited thereto. The adhesive member may include a typical adhesive. In other embodiments, the anti-reflection unit 60 and the window unit 70 may be replaced with other elements or may be omitted.

The light-emitting substrate 1000 may generate light. In one embodiment, the light-emitting substrate 1000 may be a light-emitting display unit or an OLED display panel. The light-emitting substrate 1000 may include a first substrate 10, which becomes a base layer, and a circuit layer 20, a light-emitting element layer 30, which includes an organic light-emitting material, and an encapsulation layer 40, and the circuit layer 20, the light-emitting element layer 30, and the encapsulation layer 40 are sequentially disposed on the first substrate 10.

Here, units formed together by continuous processes may be referred to as "layers", and units coupled together by an adhesive member may be collectively referred to as "panels". A "panel" includes a base layer (such as, for example, a synthetic resin film, a composite film, or a glass substrate), which provides a base surface, but a "layer" has no base layer. That is, a unit referred to as a "layer" may be disposed on a base surface provided by another unit.

The input sensing unit 50, the anti-reflection unit 60, and the window unit 70 may be referred to as an input sensing panel, an anti-reflection panel, and a window panel, respectively, or as an input sensing layer, an anti-reflection layer, and a window layer, respectively, depending on whether they have a base layer.

The hole AH may be formed through the front and rear surfaces of each of the light-emitting substrate 1000, the input sensing unit 50, and the anti-reflection unit 60 of the OLED display device 1. That is, each of the light-emitting substrate 1000, the input sensing unit 50, and the anti-reflection unit 60 may include a hole (or a through hole) corresponding to the hole AH.

In one embodiment, the window unit 70 may not include the hole AH, but may cover the main hole area MH, but the inventive concepts are not limited thereto. Alternatively, the hole AH may be formed to penetrate the window unit 70.

The input sensing unit 50 may acquire coordinate information of external input (e.g., a touch event). The input sensing unit 50 may be a touch sensing unit detecting touch input from the user or a fingerprint sensing unit detecting fingerprint information from a finger of the user. The pitch and width of detection electrodes (i.e., detection electrodes (510 and 520) included in the input sensing unit 50) may vary depending on the purpose of use of the input sensing unit 50. For example, the detection electrodes of a touch sensing unit may have a width of several to dozens of millimeters, and the detection electrodes of a fingerprint sensing unit may have a width of dozens to hundreds of micrometers. The input sensing unit 50 will hereinafter be described as being a touch sensing unit.

The input sensing unit 50 may overlap with the display area DA. The input sensing unit 50 may not overlap with the hole AH, but may overlap with some of the second non-display area NDA2 excluding the hole AH. This will be described later with reference to FIG. 10.

The anti-reflection unit 60 may reduce the reflectance of externa light incident from above the window unit 70.

In one embodiment, the anti-reflection unit 60 may include a retarder and a polarizer. The phase retarder may be of a film type or a liquid crystal coating type, and may include a λ/2 retarder and/or a λ/4 retarder. The polarizer may also be of a film type or a liquid crystal coating type. A film-type polarizer may include a stretch-type synthetic resin film, and a liquid crystal coating-type polarizer may include liquid crystal molecules arranged in a predetermined fashion. The anti-reflection unit 60 may further include a protective film. Either the retarder and the polarizer or the protective film may be defined as the base layer of the anti-reflection unit 60.

In one embodiment, the anti-reflection unit 60 may include color filters. The color filters may be arranged in a predetermined fashion. The pattern of arrangement of the color filters may be determined in consideration of colors emitted from the pixels included in the light-emitting substrate 1000. The anti-reflection unit 60 may further include black matrices adjacent to the color filters.

The window unit 70 may protect the light-emitting substrate 1000 and the input sensing unit 50 from external scratches or the like. The top surface of the window unit 70 may be a surface that is to be in contact with the user's input means (e.g., a finger).

The window unit 70 may include a functional coating layer disposed on the top surface and/or the bottom surface thereof. The functional coating layer may include an anti-fingerprint layer, an anti-reflection layer, and a hard coating layer. For convenience, detailed descriptions of the anti-reflection unit 60 and the window unit 70, which are known in the art, will be omitted.

The layout of the light-emitting substrate 1000 will hereinafter be described with reference to FIGS. 3 and 4.

Figure 3:
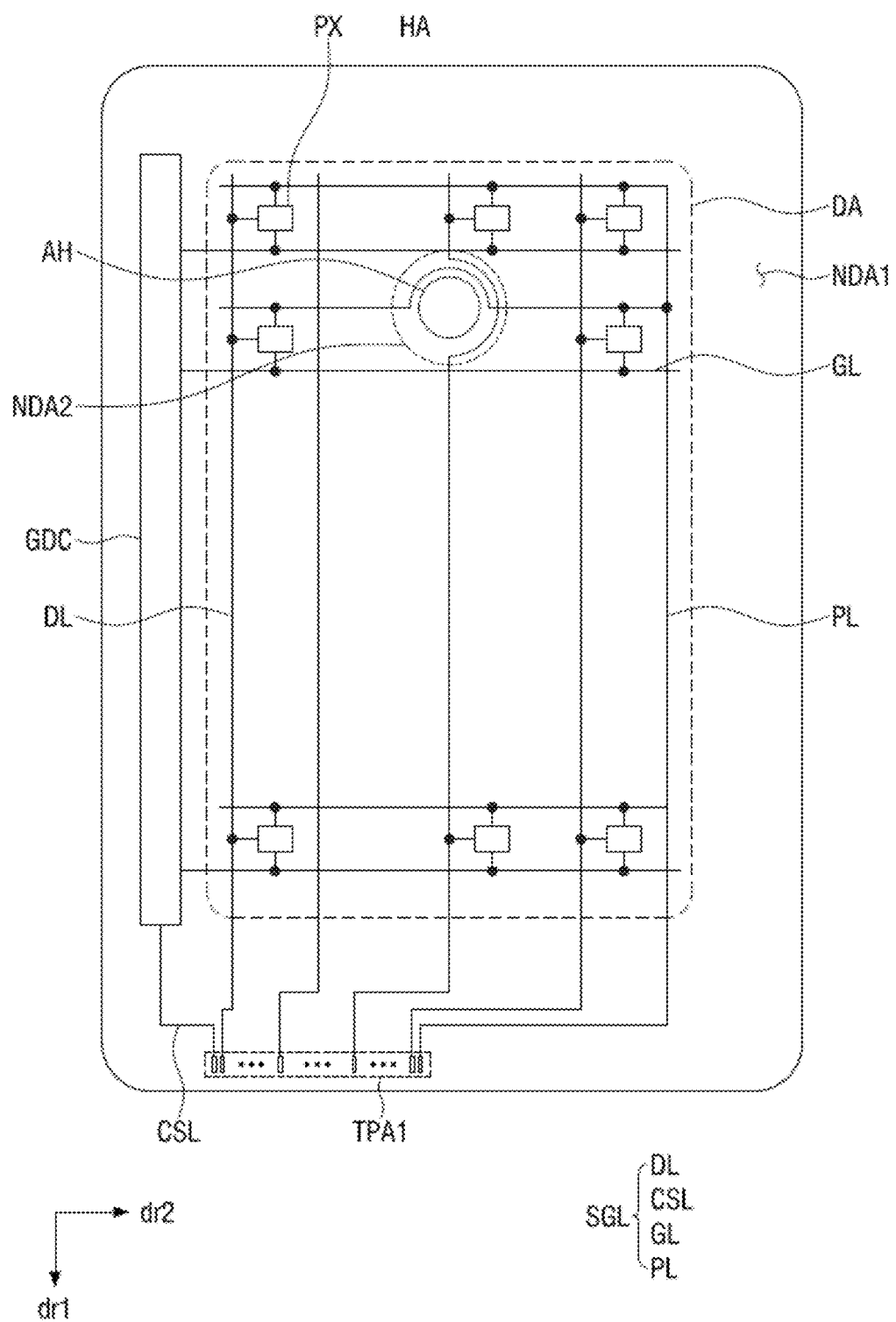
FIG. 3 is a plan view illustrating the layout of a light-emitting substrate included in the OLED display device according to the embodiment of FIG. 1.

FIG. 3 is a plan view illustrating the layout of the light-emitting substrate included in the OLED display device according to the embodiment of FIG. 1. FIG. 4 is a circuit diagram illustrating a pixel included in the light-emitting substrate of FIG. 3.

Referring to FIG. 3, a display area DA and first and second non-display areas NDA1 and NDA2 are defined on the light-emitting substrate 1000 in a plan view. The first non-display area NDA1 may be defined along the edges of the display area DA. The display area DA surrounds the second non-display area NDA2. The display area DA and the first and second non-display areas NDA1 and NDA2 of the light-emitting substrate 1000 correspond to the display area DA and the first and second non-display areas NDA1 and NDA2, respectively, of the OLED display device 1 of FIG. 1.

The light-emitting substrate 1000 may include driving circuitry GDC, signal lines SGL, a first pad area TPA1 (or first pad terminals in the first pad area TPA1), and a plurality of pixels PX. The pixels PX may be disposed in the display area DA. Here, the pixels PX are minimal units for displaying an image (or emitting light), and each of the pixels PX includes a light-emitting element (e.g., an OLED) and pixel driving circuits connected to the light-emitting element. The driving circuitry GDC, the signal lines SGL, signal pads, and the pixel driving circuits of each of the pixels PX may be included in the circuit layer 20 of FIG. 2.

The size of the second non-display area NDA2 may be larger than the size of the hole AH. That is, a part of the second non-display area NDA2 between the hole AH and the display area DA may be an area where no light is emitted from the light-emitting substrate 1000. This part of the second non-display area NDA2 corresponds to the groove area GA and the peripheral area AHA, which will be described later with reference to FIG. 9. The pixels PX may not be disposed in the groove area GA and the peripheral area AHA.

The driving circuitry GDC may include a scan driving circuit. The scan driving circuit generates scan signals and sequentially outputs the scan signals to scan lines GL, which will be described later. The scan driving circuit may further output control signals to the driving circuits of the pixels PX.

The scan driving circuit may include a plurality of thin-film transistors (TFTs) formed by the same process as the driving circuits of the pixels PX, for example, a low temperature polycrystalline silicon (LTPS) process or a low temperature polycrystalline oxide (LTPO) process.

The signal lines SGL include the scan lines GL, data lines DL, a power line PL, and a control signal line CSL. The scan lines GL are connected to the pixels PX, and the data lines DL are connected to the pixels PX. The power line PL is connected to the pixels PX. The control signal line CSL may provide control signals to the scan driving circuit.

The signal lines SGL overlap with the display area, the first non-display area NDA1, and the second non-display area NDA2 except for a part overlapping with the hole AH. The signal lines SGL may be connected to a first pad area TPA1 in the first non-display area NDA1 (i.e., an area in which the first pad terminals are disposed) and may also be connected to the pixels PX.

Each of the signal lines SGL are connected to transistors (TRd and TRs) of each of the pixels PX. The signal lines SGL may have a single- or multilayer structure. Each of the signal lines SGL may be formed as a single body or may include two or more parts, in which case, the two or more parts may be disposed in different layers and may be connected to each other via a contact hole that penetrates an insulating layer disposed between the two or more parts.

The light-emitting substrate 1000 may include a hole AH, which corresponds to the hole AH of the OLED display device 1. The hole AH of the light-emitting substrate 1000 overlaps with the main hole area MH of the OLED display device 1.

The signal lines SGL extend in the first direction dr1 and/or in the second direction dr2 in the display area DA. For example, the data lines DL may extend in the first direction dr1, and the scan lines GL may extend in the second direction dr2. The power line PL may include a part extending in the first direction dr1 and a part extending in the second direction dr2.

Some of the data lines DL, some of the scan lines GL, and a part of the power line PL may be disposed to bypass the hole AH. In this case, some of the signal lines SGL that bypass the hole AH may be disposed in the second non-display area NDA2 (particularly, in the peripheral area AHA). The pixels PX are not disposed in the main hole area MH.

A circuit board may be electrically connected to the first pad area TPA1. The circuit board may be a rigid circuit board or a flexible circuit board. The circuit board may be directly coupled to the first pad area TPA1 or may be connected to the first pad area TPA1 via another circuit board.

Figure 4:
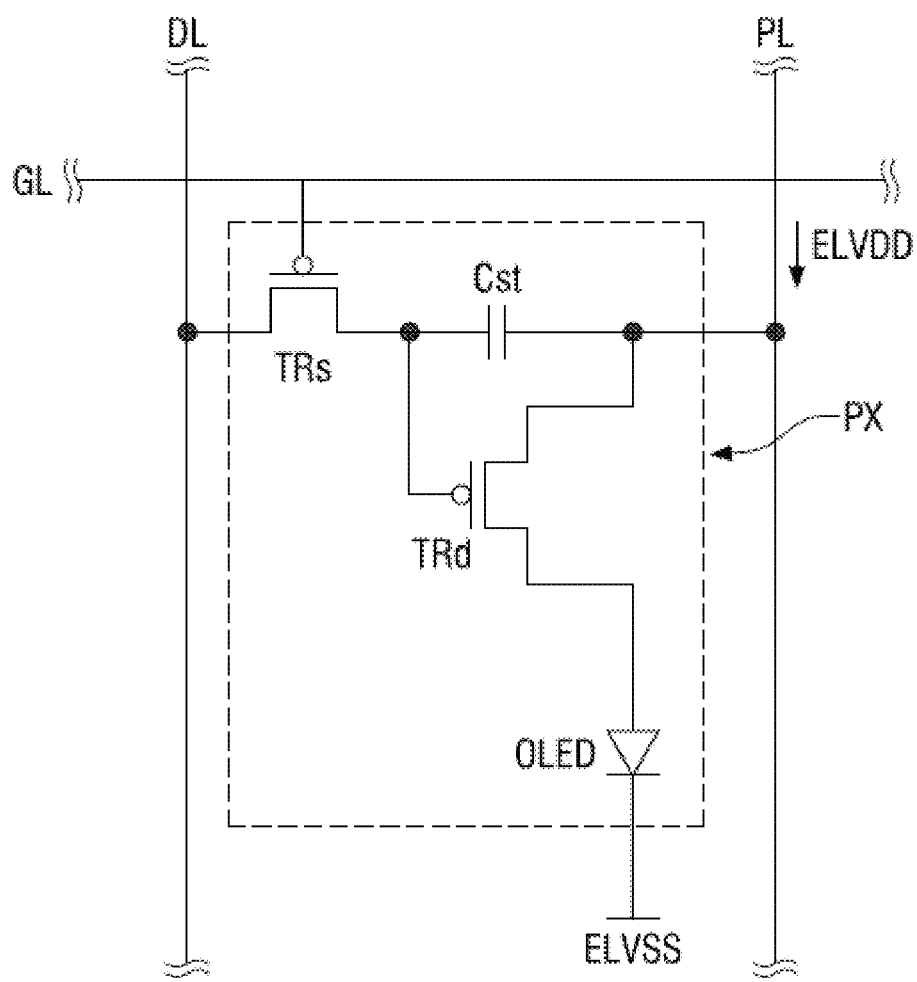
FIG. 4 is a circuit diagram illustrating a representative pixel included in the light-emitting substrate of FIG. 3.

Referring to FIG. 4, an OLED "OLED" of a pixel PX may be of a top emission type or a bottom emission type. The pixel PX may include a switching transistor TRs, a driving transistor TRd, and a sustain capacitor Cst as pixel driving circuits for driving the OLED "OLED".

A first power supply voltage ELVDDD is provided to the driving transistor TRd, and a second power supply voltage ELVSS is provided to the OLED "OLED". The second power supply voltage ELVSS may be lower than the first power supply voltage ELVDD.

The switching transistor TRs outputs a data signal applied to a data line DL in response to a scan signal applied to a scan line GL. The sustain capacitor Cst is charged with a voltage corresponding to the data signal received from the switching transistor TRs. The driving transistor TRd is connected to the OLED "OLED". The driving transistor TRd controls a driving current that flows in the OLED "OLED" in accordance with the amount of charge stored in the sustain capacitor Cst.

The equivalent circuit illustrated in FIG. 4 is merely exemplary, and the structure of the pixel PX is not limited thereto. For example, the pixel PX may further include at least one transistor and may include more than one capacitor. The OLED "OLED" may be connected between a power line PL and the driving transistor TRd.

The layout of the input sensing unit 50 and the stack structure of the OLED display device 1 will hereinafter be described with reference to FIGS. 5 through 10.

Figure 5:
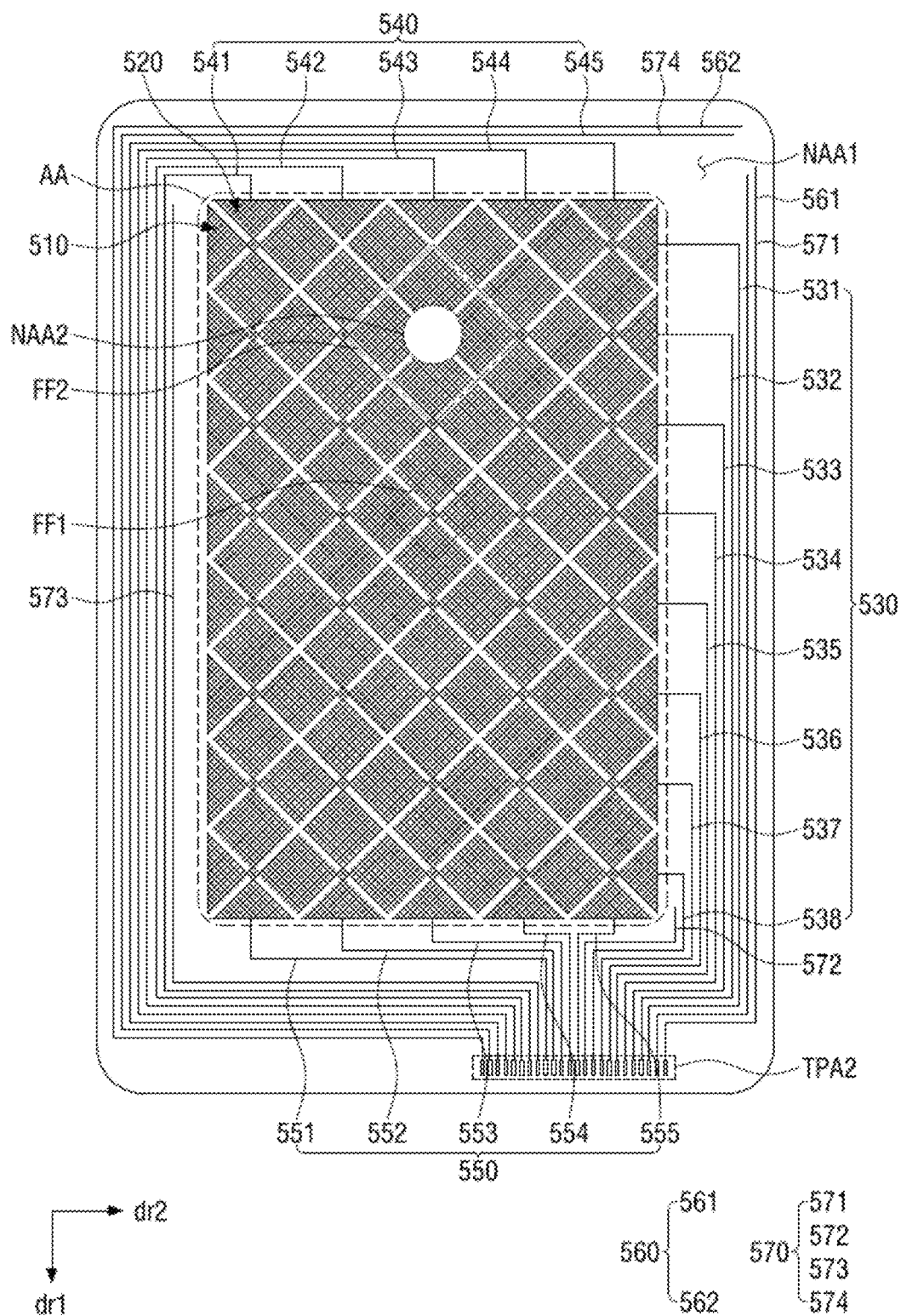
FIG. 5 is a plan view illustrating the layout of an input sensing unit included in the OLED display device according to the embodiment of FIG. 1.
Figure 6:
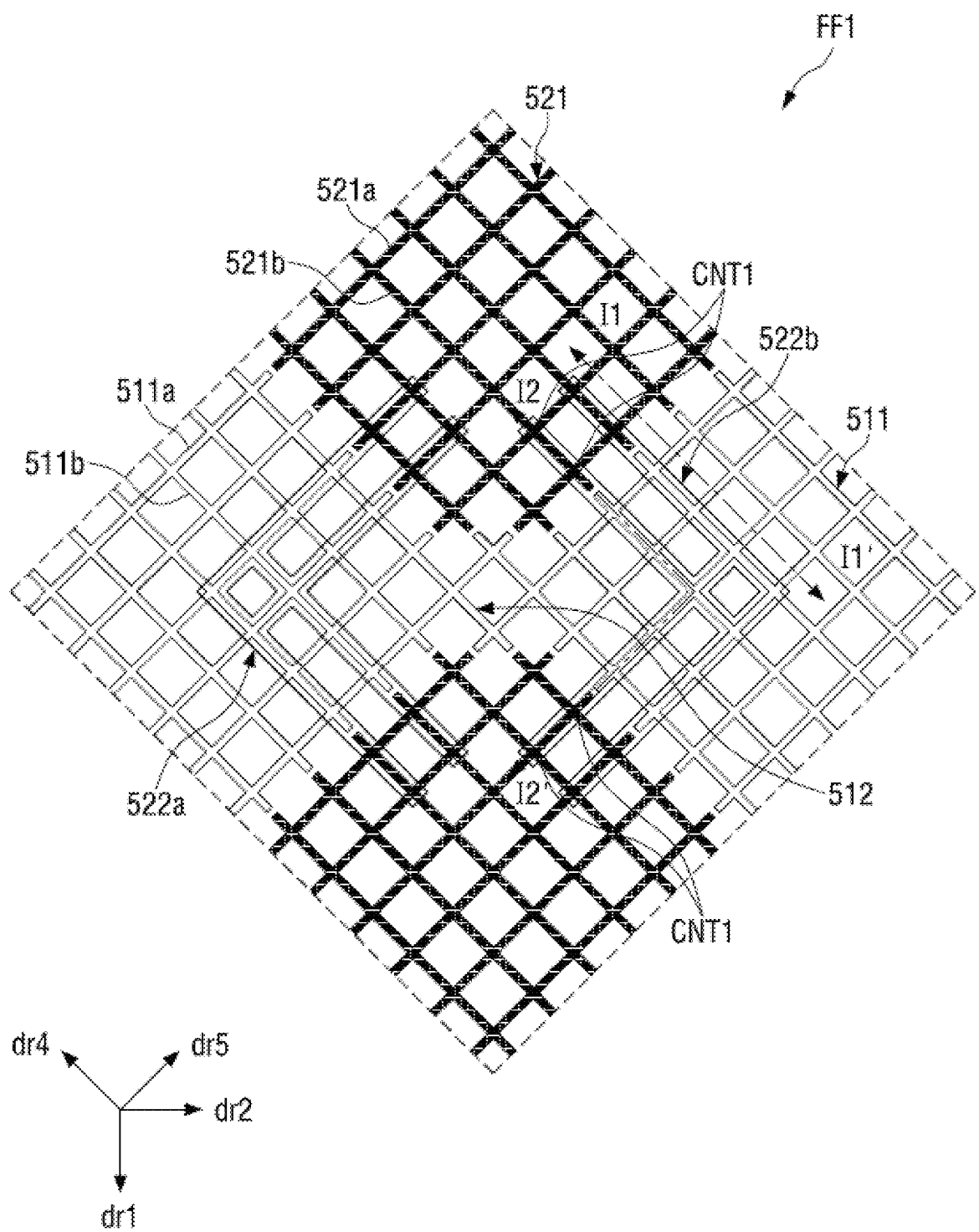
FIG. 6 is an enlarged plan view illustrating an area FF1 of FIG. 5.
Figure 7:
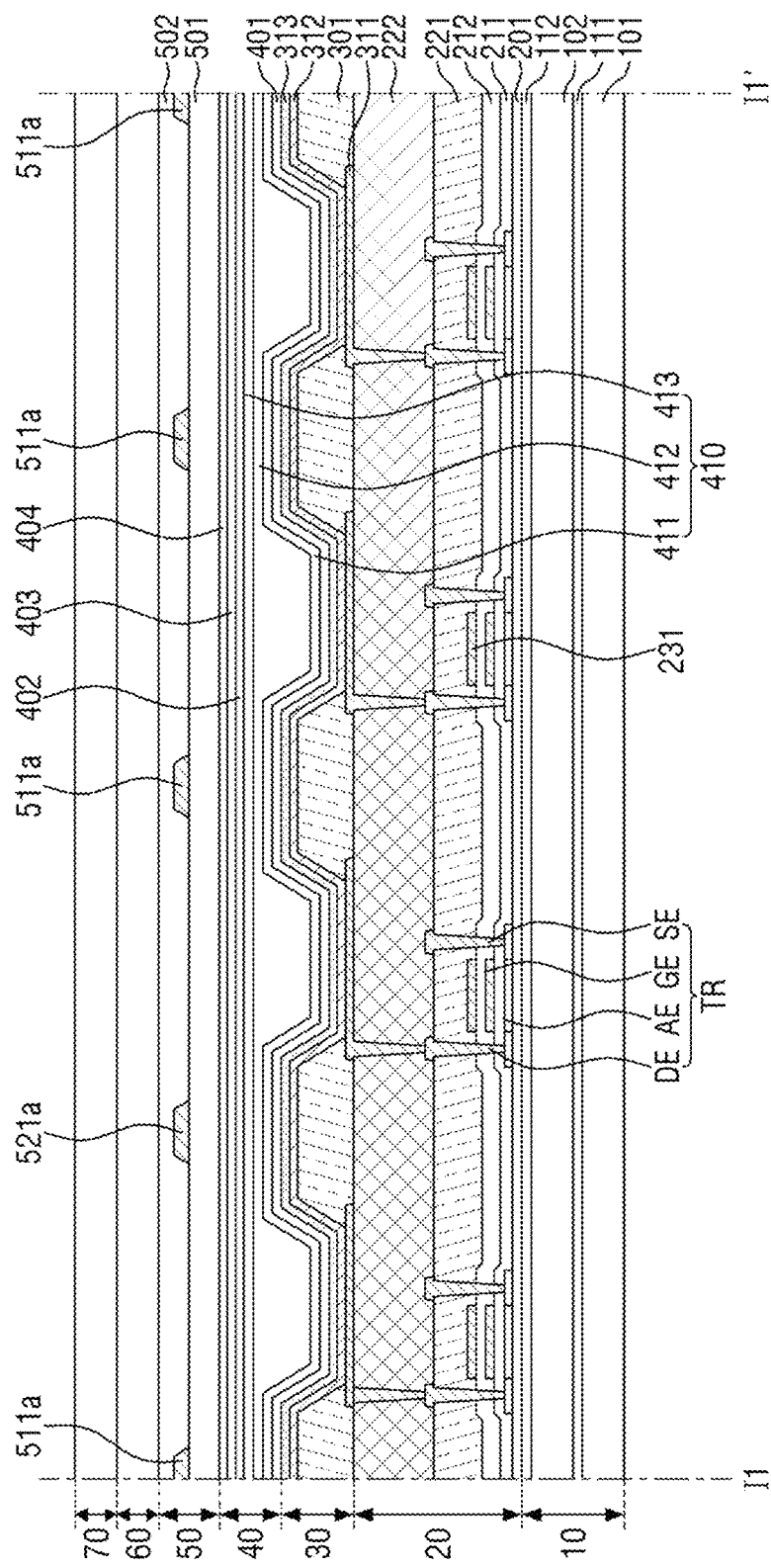
FIG. 7 is a cross-sectional view taken along line I1-I1' of FIG. 6.
Figure 8:
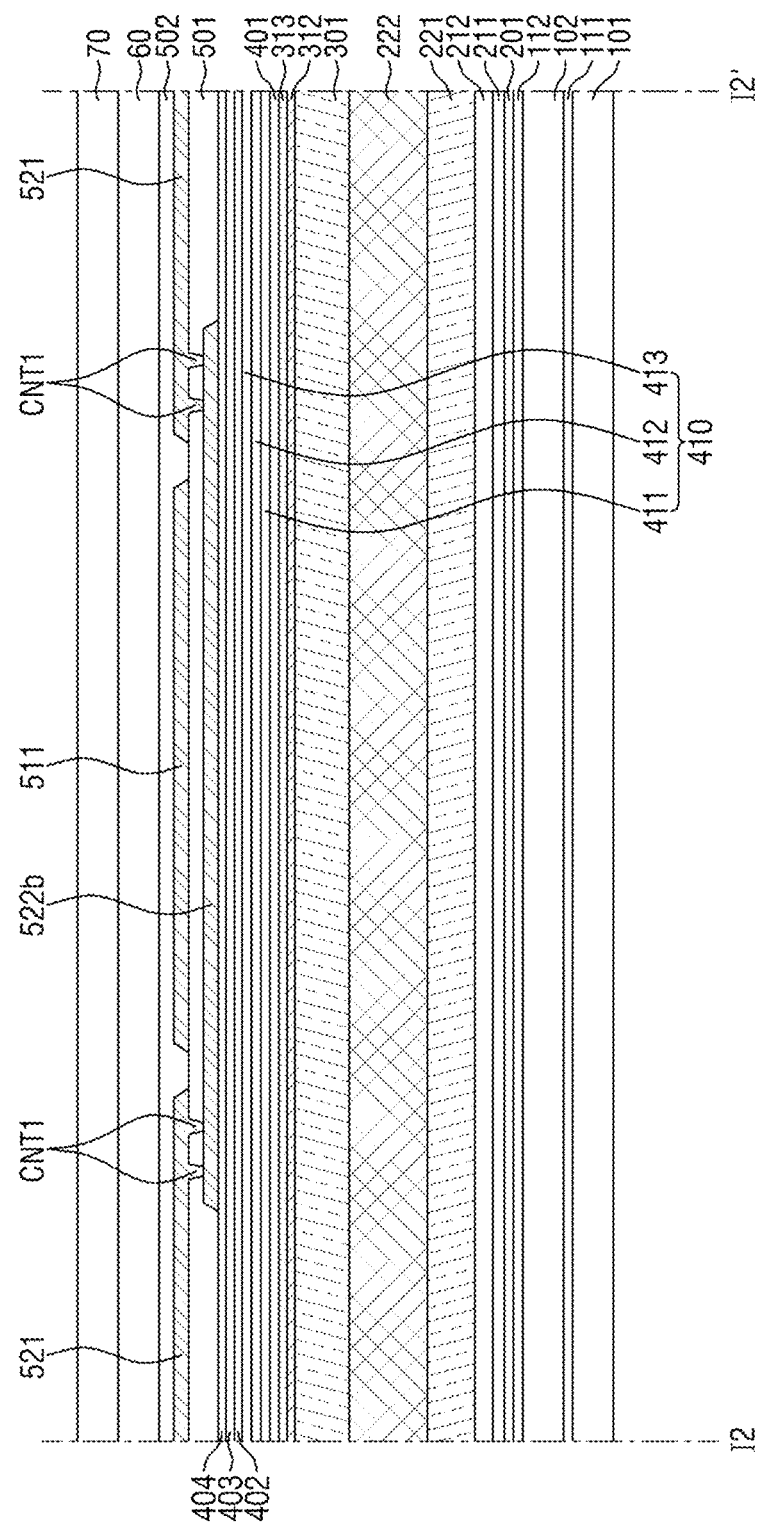
FIG. 8 is a cross-sectional view taken along line I2-I2' of FIG. 6.
Figure 9:
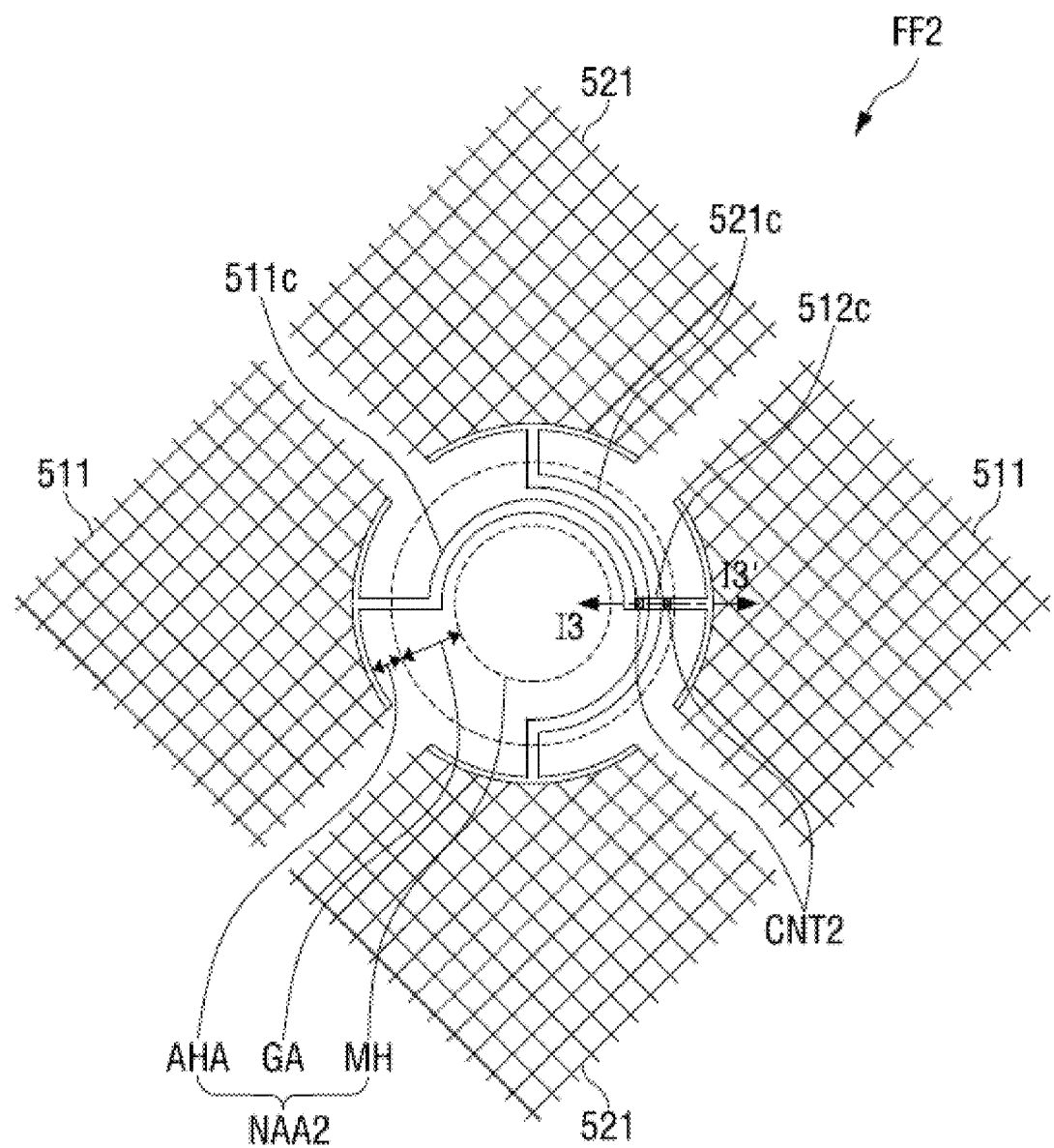
FIG. 9 is an enlarged plan view illustrating an area FF2 of FIG. 5.
Figure 10:
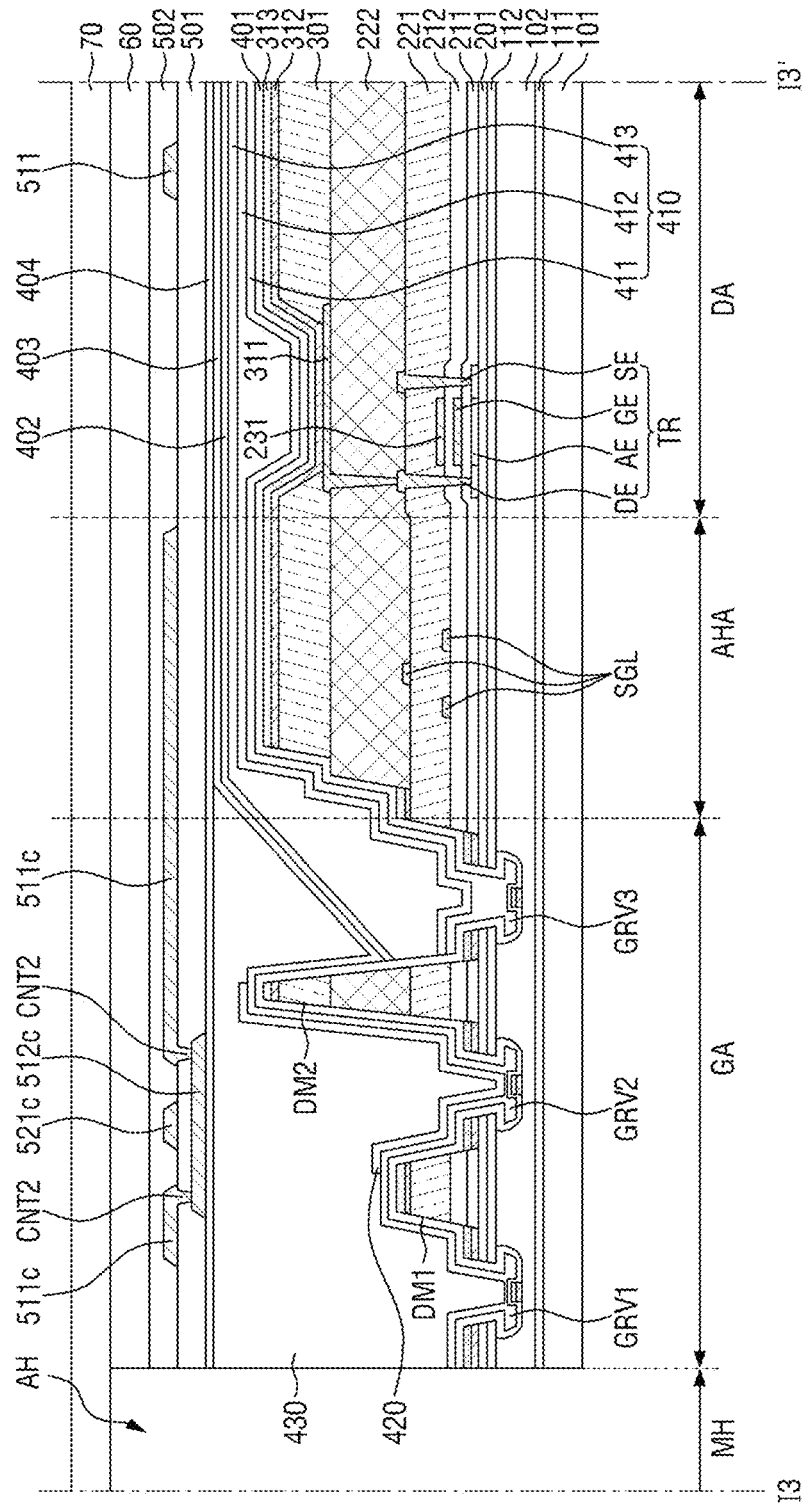
FIG. 10 is a cross-sectional view taken along line I3-I3' of FIG. 9.

FIG. 5 is a plan view illustrating the layout of the input sensing unit included in the OLED display device according to the embodiment of FIG. 1. FIG. 6 is an enlarged plan view illustrating an area FF1 of FIG. 5. FIG. 7 is a cross-sectional view taken along line I1-I1' of FIG. 6. FIG. 8 is a cross-sectional view taken along line I2-I2' of FIG. 6. FIG. 9 is an enlarged plan view illustrating an rea FF2 of FIG. 5. FIG. 10 is a cross-sectional view taken along line I3-I3' of FIG. 9.

Referring to FIGS. 5 through 10, the input sensing unit 50 may have a multilayer structure. The input sensing unit 50 may include detection electrodes (510 and 520), at least one touch conductive layer including signal lines (530, 550, 540, 560, and 570), which are connected to the detection electrodes (510 and 520), and at least one touch insulating layer. For example, the input sensing unit 50 may detect external input in a capacitive manner, but the inventive concepts are not limited thereto. In another example, the input sensing unit 50 may detect external input in an electromagnetic induction manner or a pressure sensing manner.

In one embodiment, the input sensing unit 50 may include a first touch conductive layer, a first touch insulating layer 501, a second touch conductive layer, and a second touch insulating layer 502, which are sequentially stacked. The input sensing unit 50 may further include, below the first conductive layer, a buffer layer for forming the first touch conductive layer, the first touch insulating layer 501, the second touch conductive layer, and the second touch insulating layer 502. The buffer layer may be omitted, but the inventive concepts are not limited thereto.

Each of the first and second touch conductive layers may have a single-layer structure or a multilayer structure consisting of layers that are stacked along the third direction dr3. When having a single-layer structure, each of the first and second touch conductive layers may include a metal layer or a transparent conductive layer. The metal layer may include molybdenum (Mo), silver (Ag), titanium (Ti), copper (Cu), aluminum (Al), or an alloy thereof. The transparent conductive layer may include a transparent conductive oxide such as indium tin oxide (ITO), indium zinc oxide (IZO), zinc oxide (ZnO), or indium tin zinc oxide (ITZO). The transparent conductive layer may also include a conductive polymer such as poly(3,4-ethyelenedioxythiophene) (PEDOT), metal nanowires, or graphene. When having a multilayer structure, each of the first and second touch conductive layers may include multilayer metal layers. The multilayer metal layers may have a triple-layer structure of, for example, titanium (Ti)/aluminum (Al)/titanium (Ti). When having a multilayer structure, each of the first and second touch conductive layers may include at least one metal layer and at least one transparent conductive layer.

The stack structure and the material of the detection electrodes (510 and 520) may be determined in consideration of sensing sensitivity. Detection electrodes 510 and 520 including transparent conductive layers, unlike their counterparts including metal layers, are not visible to the user and can widen an input area to increase capacitance. RC delays may affect sensing sensitivity. Since the detection electrodes (510 and 520) have lower resistance when including metal layers than when including transparent conductive layers, RC values can be lowered, and the amount of time that it takes to charge capacitors defined between the detection electrodes (510 and 520) may decrease. When including metal layers, the detection electrodes (510 and 520) may have a mesh shape, in which case, the metal layers may not be visible to the user.

The first and second touch insulating layers 501 and 502 may have a single- or multilayer structure. Each of the first and second touch insulating layers 501 and 502 may include an inorganic material, an organic material, or a composite material.

Each of the first and second touch insulating layers 501 and 502 may include an organic film and/or an inorganic film. The inorganic film may include at least one of aluminum oxide, titanium oxide, silicon oxide, silicon oxynitride, zirconium oxide, and hafnium oxide. The organic film may include at least one of an acrylic resin, a methacrylic resin, polyisoprene, a vinyl resin, an epoxy resin, a urethane resin, a cellulose resin, a siloxane resin, a polyimide resin, a polyamide resin, and a perylene resin.

The input sensing unit 50 may include first detection electrodes 510, second detection electrodes 520, first signal lines 530, second signal lines 550, third signal lines 540, and fourth signal lines 560. The input sensing unit 50 may further include second pad terminals disposed in a second pad area TPA2.

In the embodiment of FIGS. 5 through 10, the first detection electrodes 510 may be sensing electrodes, and the second detection electrodes 520 may be driving electrodes. In other embodiments, the first detection electrodes 510 may be driving electrodes, and the second detection electrodes 520 may be sensing electrodes.

The first detection electrodes 510 and the second detection electrodes 520 may be disposed in a sensing area AA, which is defined as an area where input can be detected. Here, the sensing area AA may correspond to, and overlap with, the display area DA. That is, the sensing area AA and the display area DA of the OLED display device 1 may be the same.

The first detection electrodes 510 may extend in the second direction dr2 and may be arranged repeatedly along the first direction dr1. The second detection electrodes 520 may extend in the first direction dr1 and may be arranged repeatedly along the second direction dr2. The first detection electrodes 510 may transmit sensing signals, and the second detection electrodes 520 may transmit detection signals.

The first detection electrodes 510 and the second detection electrodes 520 intersect one another. In this case, the input sensing unit 50 may detect external input in a mutual capacitance manner and/or a self-capacitance manner, as is known in the art. The input sensing unit 50 may calculate the coordinates of external input in the mutual capacitance manner during a first period and may recalculate the coordinates of the external input in the self-capacitance manner during a second period.

Each of the first detection electrodes 510 includes first sensor members, which may be in the form of sensing electrodes 511, and first connecting members 512. Similarly, each of the second detection electrodes 520 includes second sensor members, which may be in the form of driving electrodes 521, and second connecting members (522a and 522b).

In each of the first detection electrodes 510, the first sensor members 511 may be arranged along the second direction dr2, and pairs of adjacent first sensor members 511 may be connected to one another via the first connecting members 512. In each of the second detection electrodes 520 may be arranged along the first direction dr1, and pairs of adjacent second sensor members 521 may be connected via the second connecting members (522*a* and 522*b*).

The input sensing unit 50 may include i first detection electrodes 510 (where i is an integer of 2 or greater) and j second detection electrodes 520 (where j is an integer of 2 or greater). For convenience, the input sensing unit 50 is illustrated as including eight first detection electrodes 510 and five second detection electrodes 520, but the inventive concepts are not limited thereto.

The first signal lines 530, the second signal lines 550, the third signal lines 540, and the fourth signal lines 560 may be disposed in a first non-sensing area NAA1. Here, the first non-sensing area NAA1 may correspond to, and overlap with, the first non-display area NDA1. That is, the first non-sensing area NAA1 and the first non-display area NDA1 of the OLED display device 1 may be the same.

The first signal lines 530 may extend from some of the second pad terminals in the second pad area TPA2 along a part of the first non-sensing area NAA1 disposed on a first side (e.g., on the right side) of the input sensing unit 50 and may be connected to first ends of the first detection electrodes 510. The first signal lines 530 may include first through i-th sensing signal lines, and the first through i-th sensing signal lines may be electrically connected to the first ends of the first detection electrodes 510. For example, the first signal lines 530 may include as many sensing signal lines as there are first detection electrodes 510, i.e., first through eighth sensing signal lines 531 through 538, but the inventive concepts are not limited thereto.

The second signal lines 550 may extend from other second pad terminals in the second pad area TPA2 to a third side (e.g., a lower side) of the input sensing unit 50 and may be electrically connected to first ends of the second detection electrodes 520. The second signal lines 550 may include first through j-th detection signal lines, and the first through j-th detection signal lines may be electrically connected to the first ends of the second detection electrodes 520. For example, the second signal lines 550 may include as many detection signal lines as there are second detection electrodes 520, i.e., first through fifth detection signal lines 551 through 555, but the inventive concepts are not limited thereto.

The third signal lines 540 may extend from still other second pad terminals in the second pad area TPA2 along a part of the first non-sensing area NAA1 disposed on a second side (e.g., on a left side) of the input sensing unit 50 and may be connected to second ends of the second detection electrodes 520. The third signal lines 540 may include (j+1)-th through (j+j)-th detection signal lines, and the (j+1)-th through (j+j)-th detection signal lines may be electrically connected to the second ends of the second detection electrodes 520. For example, the third signal lines 540 may include as many detection signal lines as there are second detection electrodes 520, i.e., sixth through tenth detection signal lines 541 through 545, but the inventive concepts are not limited thereto.

The fourth signal lines 560 may extend from yet other second pad terminals in the second pad area TPA2 along the first and second sides of the input sensing unit 50 and may be disposed to surround the first signal lines 530, the second signal lines 550, and the third signal lines 540. In one embodiment, the fourth signal lines 560 may be antistatic wires. The fourth signal lines 560 may include first and second antistatic wires 561 and 562. The first and second antistatic wires 561 and 562 may not be connected to each other.

The first antistatic wire 561 may cover wires disposed on the right side of the first non-sensing area NAA1 and some wires disposed on the lower side of the first non-sensing area NAA1. The second antistatic wire 562 may cover wires located on the left and upper sides of the first non-sensing area NAA1 and other wires disposed on the lower side of the first non-sensing area NAA1.

The first and second antistatic wires 561 and 562 may be wires where a predetermined voltage signal flows or no voltage signal flows. The first and second antistatic wires 561 and 562 can alleviate electrostatic impact that may be caused to the first signal lines 530, the second signal lines 550, and the third signal lines 540.

Fifth signal lines 570 may extend from yet still other second pad terminals in the second pad area TPA2 along the first and second sides of the first non-sensing area NAA1 and may be disposed between the first signal lines 530, the second signal lines 550, the third signal lines 540, and the fourth signal lines 560. In one embodiment, the fifth signal lines 570 may be guard wires. The fifth signal lines 570 may include first through fourth guard wires 571 through 574.

For example, the first guard wire 571 may be disposed between the first signal lines 530, which extend along the right side of the first non-sensing area NAA1, and the first antistatic wire 561. The second guard wire 572 may be disposed between the first signal lines 530 and the second signal lines 550. The third guard wire 572 may be disposed between the second signal lines 550 and the third signal lines 540. The fourth guard wire 574 may be disposed between the third signal lines 540 and the fifth signal lines 570.

The fifth signal lines 570 may be wires where a predetermined voltage signal flows or no voltage signal flows. The fifth signal lines 570 can prevent signal interference between adjacent wires.

The arrangement of, and the connections between, the first sensor members 511 and the arrangement of, and the connections between, the second sensor members 521 will hereinafter be described with reference to FIGS. 6 through 8.

As illustrated in FIG. 6, the first detection electrodes 510 and the second detection electrodes 520 may have a mesh shape. The first sensor members 511, the second sensor members 521, the first connecting members 512, and the second connecting members (522*a* and 522*b*) may include mesh lines. The mesh lines may include lines (511*b* and 521*b*) extending in a fourth direction dr4 and lines (511*a* and 521*b*) extending in a fifth direction dr5. Here, the fourth and fifth directions dr4 and dr5 may be defined on the same plane as the first and second directions dr1 and dr2. For example, the fourth direction dr4 may be an upper left direction, and the fifth direction dr5 may be an upper right direction.

The distance between the first sensor members 511 and the distance between the second sensor members 521 may be several nanometers or less because the mesh lines are separated (or disconnected) so that the boundaries between first pixel electrodes 311 can become distinctive.

The second connecting members (522*a* and 522*b*) may be disposed in a different layer from the first sensor members 511, the second sensor members 521, and the first connecting members 512. In one embodiment, the first sensor members 511, the second sensor members 521, and the first connecting members 512 may be disposed in the second touch conductive layer, and the second connecting members (522a and 522b) may be disposed in the first touch conductive layer. The second sensor members 521, which are spaced apart from one another, may be connected to the second connecting members (522a and 522b) via first contact holes CNT1, which penetrate the first touch insulating layer 501. The first sensor members 511 may be partially removed to reduce the overlapping areas with the second connecting members (522a and 522b). In another embodiment, the first sensor members 511, the second sensor members 521, and the first connecting members 512 may be disposed in the first touch conductive layer, and the second connecting members (522a and 522b) may be disposed in the second touch conductive layer.

At least one first detection electrode 510 and at least one second detection electrode 520 that are adjacent to, or intersect, the hole AH may be separated by the hole AH. That is, some of the first sensor members 511 of the first detection electrode 510 that is adjacent to, or intersects, the hole AH and some of the second sensor members 521 of the second detection electrode 520 that is adjacent to, or intersects, the hole AH may be spaced apart from one another by the hole AH.

The input sensing unit 50 may include first sensor members 511 that are adjacent to, and isolated from each other by, the hole AH and second sensor members 521 that are adjacent to, and isolated from each other by, the hole AH and are spaced apart from each other by the hole AH. The hole AH may be disposed such that the first sensor members 511 that are adjacent to, and isolated from each other by, the hole AH, may have substantially the same area, and that the second sensor members 521 that are adjacent to, and isolated from each other by, the hole AH, may have substantially the same area. That is, the center of the hole AH may coincide with the median point between the first sensor members 511 that are adjacent to, and isolated from each other by, the hole AH and with the median point between the second sensor members 521 that are adjacent to, and isolated from each other by, the hole AH. In this manner, the areas of the first sensor members 511 and the second sensor members 521 can become relatively uniform, and as a result, sensing sensitivity can be prevented from being lowered.

The input sensing unit 50 may further include connectors. The Connectors may include connecting wires (511c and 521c) (or touch sensing wires). The Connectors may electrically connect the first sensor members 511 that are adjacent to, and isolated from each other by, the hole AH and may electrically connect the second sensor members 521 that are adjacent to, and isolated from each other by, the hole AH. The connecting wires (511c and 521c) may be disposed between the main hole area MH of the second non-sensing area NAA2 and the sensing area AA.

The connecting wires (511c and 521c) may be formed on the same plane (or in the same layer) as the first sensor members 511 and the second sensor members 521. In one embodiment, the connecting wires (511c and 521c) may be disposed in the second touch conductive layer together with the first sensor members 511 and the second sensor members 521.

The width of the main hole area MH may be determined by the size of the hole AH. For example, as the size of the hole AH increases, the width of the main hole area MH increases, and as the size of the hole AH decreases, the width of the main hole area MH may decrease and may be saturated to a predetermined value.

A first connecting wire 511c may bypass the main hole area MH along one side (e.g., an upper side) of the main hole area MH and may electrically connect the first sensor members 511, which are spaced apart from one another. Similarly, a second connecting wire 521c may bypass the main hole area MH along another side (e.g., a right side) of the main hole area MH and may electrically connect the second sensor members 521, which are spaced apart from one another.

The first and second connecting wires 511c and 521c may have a predetermined linewidth. For example, the first and second connecting wires 511c and 521c may have a greater line width than the signal lines SGL (having a line width of, for example, several micrometers).

The first and second connecting wires 511c and 521c may be arranged along a relatively short path and may overlap with each other because their extension directions cross each other. However, in order to prevent the first and second connecting wires 511c and 521c from being short-circuited, a bridge connector in the form of a bridge wire may be provided in the first touch conductive layer for one of the first and second connecting wires 511c and 521c. For example, the connectors may include the first and second connecting wires 511c and 521c and the connectors may further include a first bridge wire 512c. The first bridge wire 512c may be provided at the intersection between the first and second connecting wires 511c and 521c so that the first connecting wire 511c can maintain its electrical connection to the second connecting wire 521c while not being in contact with the second connecting wire 521c due to the first bridge wire 512c. The first bridge wire 512c may be connected to the first connecting wire 511c via second contact holes CNT2 of the first touch insulating layer 501, which are formed at both ends of the first bridge wires 512c.

The second non-sensing area NAA2 may include the main hole area MH, which includes the center of the second non-sensing area NDA2, the groove area GA, and the peripheral area AHA. The groove area GA may be an area including grooves (GRV1, GRV2, and GRV3) and may be disposed between the main hole area MH and the peripheral area AHA.

The peripheral area AHA, which accounts for an edge part of the second non-sensing area NDA2, may be disposed between the groove area GA and the sensing area AA. The light-emitting substrate 1000 may not include the grooves (GRV1, GRV2, and GRV3) in the peripheral area AHA. In both the display area DA and the peripheral area AHA, the light-emitting substrate 1000 may include parts in which the sum of the thicknesses of layers ranging from the first substrate 10 to a thin-film encapsulation layer 410 are substantially the same.

The second non-display area NDA2 may also include the main hole area MH, the groove area GA, and the peripheral area AHA, and the main hole area MH, the groove area GA, and the peripheral area AHA of the second non-display area NDA2 may be substantially the same as the main hole area MH, the groove area GA, and the peripheral area AHA, respectively, of the second non-sensing area NAA2.

The first and second connecting wires 511c and 521c bypass the main hole area MH mostly from the groove area GA. On the other hand, the signal lines SGL bypass the main hole area MH mostly from the peripheral area AHA. In the second non-display area NDA2, the data lines DL, the scan lines GL, and the power line PL may be disposed to bypass the main hole area MH mostly from the peripheral area AHA, and the first and second connecting wires 511c and 521c may be disposed to bypass the main hole area MH mostly from the groove area GA. Thus, signal interference between the signal lines SGL and the connecting wires (511c and 521c) can be reduced. Also, dead space between the hole AH and the display area AA can be reduced as compared to a case where the connecting wires (511c and 521c) are disposed to pass through the peripheral area AHA.

The cross-sectional structure of the OLED display device 1 and parts of the second non-display area NDA2 will hereinafter be described with reference to FIGS. 7, 8, and 10.

The first substrate 10 may be the base substrate of the light-emitting substrate 1000. The first substrate 10 may include a first sub-base layer 101 (or a supporting substrate), a first barrier layer 111, a second sub-base layer 102 (or a flexible substrate), and a second barrier layer 112. The first barrier layer 111 may be disposed on the first sub-base layer 101, the second sub-base layer 102 may be disposed on the first barrier layer 111, and the second barrier layer 112 may be disposed on the second sub-base layer 102. Each of the first and second sub-base layers 101 and 102 may include a polymer material having flexibility, such as, for example, polyimide (PI). The first and second barrier layers 111 and 112 may have a barrier characteristic and may prevent external oxygen and moisture from infiltrating into the first and second sub-base layers 101 and 102.

The first non-display area NDA1, the display area DA, and the second non-display area NDA2 may be defined on the first substrate 10. The main hole area MH, the groove area GA, and the peripheral area AHA of the second non-display area NDA2 may also be defined on the first substrate 10.

A plurality of recesses, which may be in the form of grooves (GRV1, GRV2, and GRV3) are defined near the hole AH. The grooves (GRV1, GRV2, and GRV3) may be recessed from the front surface of the first substrate 10 toward the rear surface of the OLED display device 1. The grooves (GRV1, GRV2, and GRV3) may be formed by removing at least some parts of the first substrate 10. Specifically, the grooves (GRV1, GRV2, and GRV3) may be formed by removing at least some parts of the first substrate 10 in a direction from the front surface to the rear surface of the first substrate 10. For example, the grooves (GRV1, GRV2, and GRV3) may be formed by removing the second sub-base layer 102. In another example, the grooves (GRV1, GRV2, and GRV3) may be formed by removing at least some parts of each of the second barrier layer 112, the second sub-base layer 102, the first barrier layer 111, and the first sub-base layer 101.

The grooves (GRV1, GRV2, and GRV3) may be formed to be recessed from the front surface of the first substrate 10. Each of the grooves (GRV1, GRV2, and GRV3) may have the shape of a closed curve surrounding the hole AH in a plan view. Each of the grooves (GRV1, GRV2, and GRV3) may have an annular shape surrounding the hole AH in a plan view. The grooves (GRV1, GRV2, and GRV3) may have a larger diameter than the hole AH.

First, second, and third grooves GRV1, GRV2, and GRV3 may be spaced apart from one another. The diameter of the third groove GRV3 may be greater than the diameter of the second groove GRV2, and the diameter of the second groove GRV2 may be greater than the diameter of the first groove GRV1.

The first, second, and third grooves GRV1, GRV2, and GRV3 are illustrated as having substantially the same width and having substantially the same distance therebetween, but the inventive concepts are not limited thereto. Also, the OLED display device 1 is illustrated as having three grooves surrounding the hole AH, but the inventive concepts are not limited thereto. Alternatively, the OLED display device 1 may include less than three or four or more grooves.

The second sub-base layer 102 may include negative polyimide. In this case, grooves (GRV1, GRV2, and GRV3) having undercut-shape inner surfaces may be formed through patterning. That is, protruding tips may be formed at the grooves (GRV1, GRV2, and GRV3). Due to the grooves (GRV1, GRV2, and GRV3) (and the protruding tips), a light-emitting layer 312 (or an organic light-emitting layer) may be discontinuously formed in the process of stacking the layers of the light-emitting substrate 1000. The grooves (GRV1, GRV2, and GRV3) may be formed by laser etching.

In one embodiment, the light-emitting substrate 1000 may include the first, second, and third grooves GRV1, GRV2, and GRV3. The first groove GRV1 may be disposed relatively close to the main hole area MH, the third groove GRV3 may be disposed relatively close to the peripheral area AHA, and the second groove GRV2 may be disposed between the first and third grooves GRV1 and GRV3.

By defining the grooves (GRV1, GRV2, and GRV3) near the hole AH, the path of penetration of oxygen or moisture from the hole AH can be disconnected.

The circuit layer 20 includes a buffer layer 201, semiconductor layers AE, a first insulating layer 211, a first conductive layer, a second insulating layer 212, a second conductive layer, a third insulating layer 221, a third conductive layer, and a fourth insulating layer 222. Each of these layers may be formed as a single- or multilayer film, and other layers may be further disposed between these layers. In other embodiments, some of these layers may be omitted.

The buffer layer 201 may be disposed on the entire surface of the first substrate 10. The buffer layer 201 can prevent the diffusion of impurity ions and the penetration of moisture or external air and can perform a surface planarization function. The buffer layer 201 may include silicon nitride, silicon oxide, or silicon oxynitride. The buffer layer 201 may be omitted depending on the type of the first substrate 10 or processing conditions.

A plurality of TFTs TR including driving transistors TRd and switching transistors TRs may be disposed on the buffer layer 201. For convenience, only driving transistors TRd are illustrated, but the inventive concepts are not limited thereto. That is, other TFTs including switching transistors TRs may also be disposed. At least one driving transistor TRd may be provided in each pixel PX.

The driving transistors TR may include the semiconductor layers AE, gate electrodes GE, source electrodes SE, and drain electrodes DE. Specifically, the semiconductor layers AE are disposed on the buffer layer 201. The semiconductor layers AE may include amorphous silicon, polysilicon, low-temperature polysilicon, or an organic semiconductor. Alternatively, the semiconductor layers AE may be an oxide semiconductor. Although specifically illustrated, each of the semiconductor layers AE may include a channel region and source and drain regions disposed on both sides of the channel region and doped with impurities.

The first insulating layer 211 is disposed on the semiconductor layers AE. The first insulating layer 211 may be a gate insulating film. The first insulating layer 211 may include a silicon compound or a metal oxide. For example, the first insulating layer 211 may include silicon oxide (SiOx), silicon oxynitride, aluminum oxide, tantalum oxide, hafnium oxide, zirconium oxide, or titanium oxide. These materials may be used alone or in combination with one another. The first insulating layer 211 may be a single-layer film or a multilayer film consisting of a stack of different materials.

The first conductive layer is disposed on the first insulating layer 211. The first conductive layer may be disposed to at least partially overlap with the semiconductor layers AE. The first conductive layer may include the gate electrode GE.

The first conductive layer may include at least one metal selected from among aluminum (Al), platinum (Pt), palladium (Pd), silver, magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may be a single- or multi-layer film.

The second insulating layer 212 is disposed on the first conductive layer. The second insulating layer 212 covers the first conductive layer. The second insulating layer 212 may be a gate insulating film having a gate insulation function. The second insulating layer 212 may include the same material as the first insulating layer 211 or may include at least one selected from among the above-described exemplary materials of the first insulating layer 211. The second insulating layer 212 may be a single-layer film or a multi-layer film consisting of a stack of different materials.

The second conductive layer is disposed on the second insulating layer 212. The second conductive layer may be disposed to at least partially overlap with the semiconductor layers AE and the gate electrodes GE. The second conductive layer may include the same material as the first conductive layer or may include at least one selected from among the above-described exemplary materials of the first conductive layer. The second conductive layer may be a single-layer film or a multilayer film consisting of a stack of different materials.

The second conductive layer may include the sustain capacitor Cst of FIG. 3 and some of the signal lines SGL.

The third insulating layer 221 may be disposed on the second conductive layer. The third insulating layer 221 covers the second conductive layer. The third insulating layer 221 may be an interlayer insulating film.

The third insulating layer 221 may include an inorganic insulating material such as silicon oxide (SiOx), silicon nitride (SiNx), silicon oxynitride, hafnium oxide, aluminum oxide, titanium oxide, tantalum oxide, or zinc oxide or an organic insulating material such as an acrylic resin, an epoxy resin, a phenolic resin, a polyamide resin, a polyimide resin, an unsaturated polyester resin, a polyphenylene resin, polyphenylene sulfide resin, or benzocyclobutene (BCB). The third insulating layer 221 may be a single-layer film or a multilayer film consisting of a stack of different materials.

The third conductive layer is disposed on the third insulating layer 221. The third conductive layer may include the source electrodes SE and the drain electrodes DE, which electrically connect the first pixel electrodes 311 and the semiconductor layers AE, and some of the signal lines SGL. The third conductive layer may be formed of a metal material having conductivity. For example, the source electrodes SE and the drain electrodes DE may include aluminum, copper, titanium, or molybdenum.

The fourth insulating layer 222 is disposed on the third conductive layer. The fourth insulating layer 222 covers the third conductive layer. The fourth insulating layer 222 may be a protective layer, a passivation film, and/or a via layer. The fourth insulating layer 222 may be formed as a single- or multilayer film including an inorganic material, an organic material, or an organic/inorganic composite material and may be formed by various deposition methods. In some embodiments, the fourth insulating layer 222 may be formed of at least one of an acrylic resin, an epoxy resin, a phenolic resin, a polyamide resin, a polyimide resin, an unsaturated polyester resin, a polyphenylene resin, a polyphenylene sulfide resin, and benzocyclobutene.

The light-emitting element layer 30 is disposed on the circuit layer 20 and includes the first pixel electrodes 311, the light-emitting layer 312, and a second pixel electrode 313.

The first pixel electrodes 311 may be disposed on the fourth insulating layer 222. The first pixel electrodes 311 may be the anode electrodes of OLEDs.

The first pixel electrodes 311 may include a material having a high work function. The first pixel electrodes 311 may include a conductive material such as indium tin oxide, indium zinc oxide, zinc oxide, or indium oxide ($In_2O_3$). These exemplary conductive materials have a relatively high work function and are transparent. In a case where the OLED display device is of a top emission type, the first pixel electrodes 311 may further include a reflective material such as silver, magnesium, aluminum, platinum, palladium, gold, nickel, neodymium, iridium, chromium, lithium (Li), calcium, or a mixture thereof. Accordingly, the first pixel electrodes 311 may have a single-layer structure including a conductive material and a reflective material or may have a multilayer structure consisting of a stack of a conductive material and a reflective material.

A pixel defining film 301 is disposed on the first pixel electrodes 311. The pixel defining film 301 includes openings that expose at least some parts of the first pixel electrodes 311. The pixel defining film 301 may include an organic material or an inorganic material. In one embodiment, the pixel defining film 301 may include photoresist, a polyimide resin, an acrylic resin, a silicon compound, or a polyacrylic resin.

The light-emitting layer 312 is disposed on parts of the first pixel electrodes 311 exposed by the pixel defining film 301.

The second pixel electrode 313 is disposed on the light-emitting layer 312. The second pixel electrode 313 may be a common electrode disposed without regard to the distinction between the pixels PX. Also, the second pixel electrode 313 may be the cathode electrodes of OLEDs.

The second pixel electrode 313 may be formed of a material having a low work function. The second pixel electrode 313 may include Li, Ca, LiF/Ca, LiF/Al, Al, Mg, Ag, Pt, Pd, Ni, Au Nd, Ir, Cr, BaF, Ba, or a compound or mixture thereof (e.g., the mixture of Ag and Mg). The second pixel electrode 313 may be connected to the power line PL via electrodes formed in the same layer as the first pixel electrodes 311.

The first pixel electrodes 311, the light-emitting layer 312, and the second pixel electrode 313 may form OLEDs.

The OLED display device 1 may further include a dam member (DM1 and DM2) in the groove area GA. The dam member (DM1 and DM2) may extend along the groove area GA.

The dam member (DM1 and DM2) may include first and second dams DM1 and DM2. The second dam DM2 may be closer than the first dam DM1 to the peripheral area AHA.

The first dam DM1 may include the same material as the third insulating layer 221. The first dam DM1 and the third insulating layer 221 may be formed at the same time and may be disposed in the same layer. The first dam DM1 may be disposed between the first and second grooves GRV1 and GRV2.

The first dam DM1 can additionally block the path of penetration of moisture or oxygen from the hole AH. Also, the first dam DM1 can prevent the hole AH and its surroundings from being damaged by external impact.

The second dam DM2 may include the same material as the pixel defining film 301. The second dam DM2 and the pixel defining film 301 may be formed at the same time and may be disposed in the same layer. The second dam DM2 may be disposed between the second and third grooves GRV2 and GRV3.

The second dam DM2 can additionally block the path of penetration of moisture or oxygen from the hole AH. Also, the second dam DM2 can define a range in which to form the thin-film encapsulation layer 410.

However, the dam member (DM1 and DM2) is exemplary. The dam member (DM1 and DM2) may have a single-layer structure and are not particularly limited.

The OLED display device 1 may further include a first capping layer 401 disposed on the light-emitting element layer 30. The first capping layer 401 may be disposed on the entire surface of the first substrate 10. The first capping layer 401 may emit light generated by the light-emitting element layer 30 to be emitted out of the light-emitting substrate 1000.

The first capping layer 401 may be formed of an inorganic material such as a fluorinated alkali (e.g., LiF), silicon nitride, silicon oxide, or silicon oxynitride, or an organic material such as a-NPD, NPB, TPD, m-MTDATA, Alq$_3$ or CuPc, or an organic/inorganic composite material. The first capping layer 401 may be formed by chemical vapor deposition (CVD) method or atomic layer deposition (ALD). The first capping layer 401 may not only protect the light emitting device layer 30, but also efficiently emit light generated by the organic light emitting diode OLED. Also, the first capping layer 401 may be a buffer layer for arranging the thin-film encapsulation layer 410. In other embodiments, the first capping layer 401 may be omitted.

The thin-film encapsulation layer 410 is disposed on the first capping layer 401 and includes two inorganic films and one organic film. Specifically, the thin-film encapsulation layer 410 includes first and second inorganic films 411 and 413 and a first organic film 412 disposed between the first and second inorganic films 411 and 413.

For example, the first and second inorganic films 411 and 413 may include at least one monomer selected from among AlxOy, TiOx, ZrOx, SiOx, AlOxNy, AlxNy, SiOxNy, SixNy, ZnOx, and TaxOy. Specifically, the first and second inorganic films 411 and 413 may include at least one of Al$_2$O$_3$, TiO$_2$, ZrO, SiO$_2$, AlON, AlN, SiON, Si$_3$N$_4$, ZnO, and Ta$_2$O$_5$. The first and second inorganic films 411 and 413 may be formed by chemical vapor deposition or atomic layer deposition. In one embodiment, the first and second inorganic films 411 and 413 can prevent the penetration of moisture or oxygen into the light-emitting element layer 30 and the circuit layer 20.

The first organic film 412 may be formed by polymerizing at least one monomer selected from the group consisting of pentabromophenyl acrylate, 2-(9H-carbazol-9-yl) ethyl methacrylate, N-vinylcarbazole, bis(methacryloylthiophenyl) sulfide, and zirconium acrylate. In one embodiment, the first organic film 412 may be a planarization film.

In some embodiments, the thin-film encapsulation layer 410 may be configured to include all the first capping layer 401, the first inorganic film 411, the first organic film 412, and the second inorganic film 413. In this case, the first capping layer 401 may include lithium fluoride (LiF).

The second dam DM2 may define an area where a liquid-phase organic material spreads in the process of forming an organic film. The organic film may be formed by applying the liquid-phase organic material on the first inorganic film 411 via inkjet printing, in which case, the second dam DM may set the boundaries of an area in which to dispose the liquid-phase organic material and may prevent the liquid-phase organic material from spilling over the dam member (DM1 and DM2).

Second and third capping layers 402 and 403 may be sequentially disposed on the thin-film encapsulation layer 410. The second and third capping layers 402 and 403 may include the same material as the first capping layer 401 or may include at least one of the above-described exemplary materials of the first capping layer 401.

The second capping layer 402 may be formed to have the same area as the encapsulation layer 40. That is, the area in which the second capping layer 402 is formed may be defined by the second dam DM2. The third capping layer 403 may be formed on the entire surface of the first substrate 10. The second and third capping layers 402 and 403 can serve as buffer layers on the first capping layer 401 and the thin-film encapsulation layer 410. Also, the second and third capping layers 402 and 403 can prevent the penetration of moisture or oxygen into the light-emitting element layer 30. In other embodiments, the second capping layer 402 and/or the third capping layer 403 may be omitted.

In the hole AH, a dam barrier layer 420 and a hole overcoat layer 430 may be sequentially disposed on the third capping layer 403.

The dam barrier layer 420 may be formed even in an area between the first and second dams DM1 and DM2. In one embodiment, the dam barrier layer 420 may extend to the top surfaces of the first and second dams DM1 and DM2.

The hole overcoat layer 430 may be formed over the groove area GA. The hole overcoat layer 430 may serve as a planarization layer for flattening the light-emitting substrate 1000 by matching the height in the groove area GA with the top surface of the third capping layer 403 in the display area DA, and may also serve as a passivation layer for protecting the light-emitting substrate 1000.

The hole overcoat layer 430 may be formed of an organic insulating material including at least one of an epoxy polymer, benzocyclobutene, and photo acryl.

The fourth capping layer 404 may be disposed on the hole overcoat layer 430 and the third capping layer 403. The fourth capping layer 404 may include the same material as the first capping layer 401 or may include at least one of the above-described exemplary materials of the first capping layer 401.

The fourth capping layer 404 may be formed on the entire surface of the first substrate 10. The fourth capping layer 404 may planarize the top surface of the light-emitting substrate 1000 and may protect the elements disposed therebelow from the outside. The fourth capping layer 404 may serve as a buffer layer on the hole overcoat layer 430. In other embodiments, the fourth capping layer 404 may be omitted.

The first capping layer 401, the thin-film encapsulation layer 410, the second and third capping layers 402 and 403, the hole overcoat layer 430, and the fourth capping layer 404 correspond to the encapsulation layer 40.

The input sensing unit 50 may be disposed on the fourth capping layer 404.

OLED display devices according to other embodiments of the invention will hereinafter be described. In FIGS. 1 through 37, like reference numerals indicate like elements, and thus, detailed descriptions thereof will be omitted to avoid redundancy.

Figure 11:
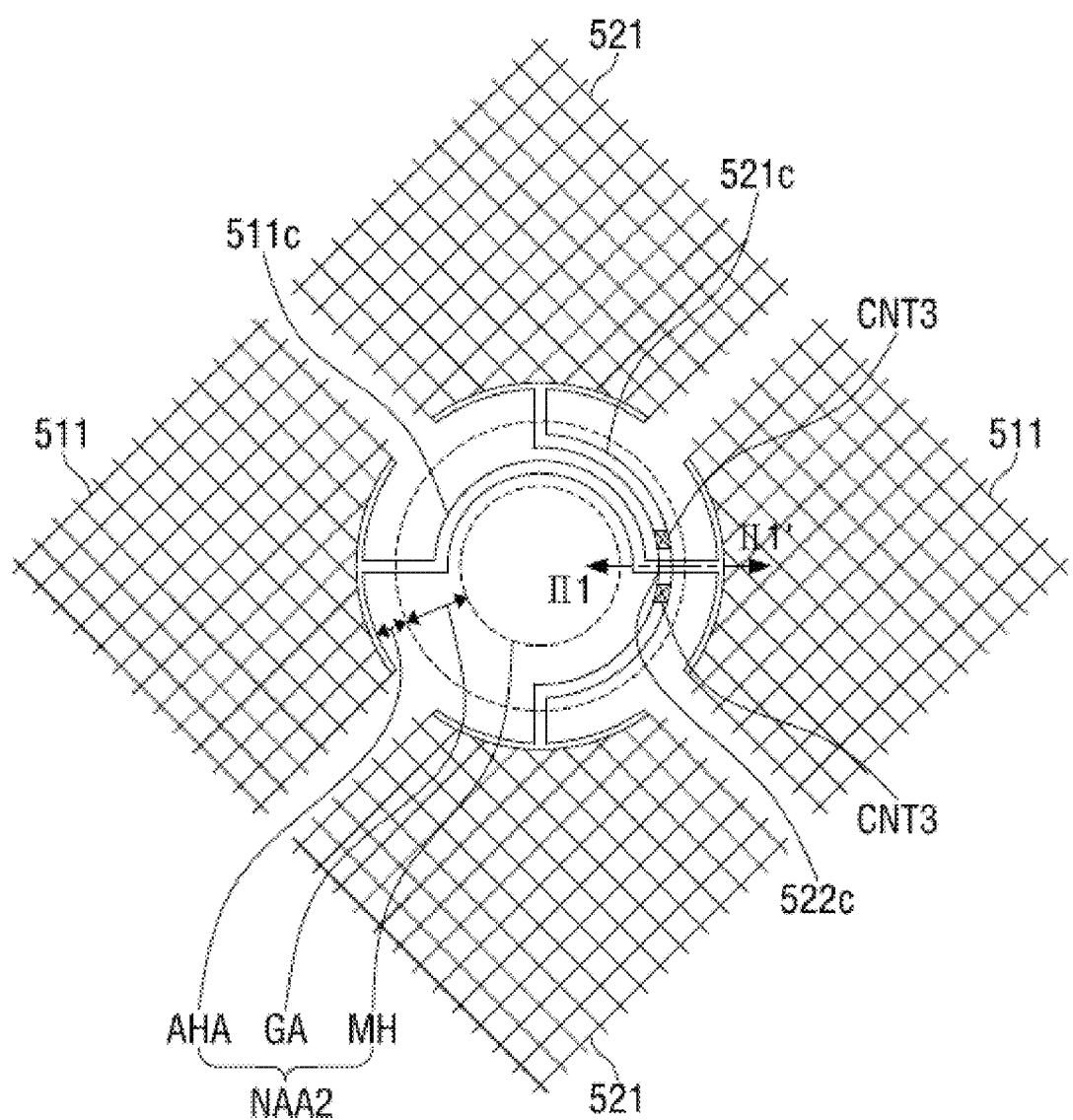
FIG. 11 is an enlarged plan view illustrating a part of an input sensing unit of an OLED display device constructed according to another embodiment of the invention.
Figure 12:
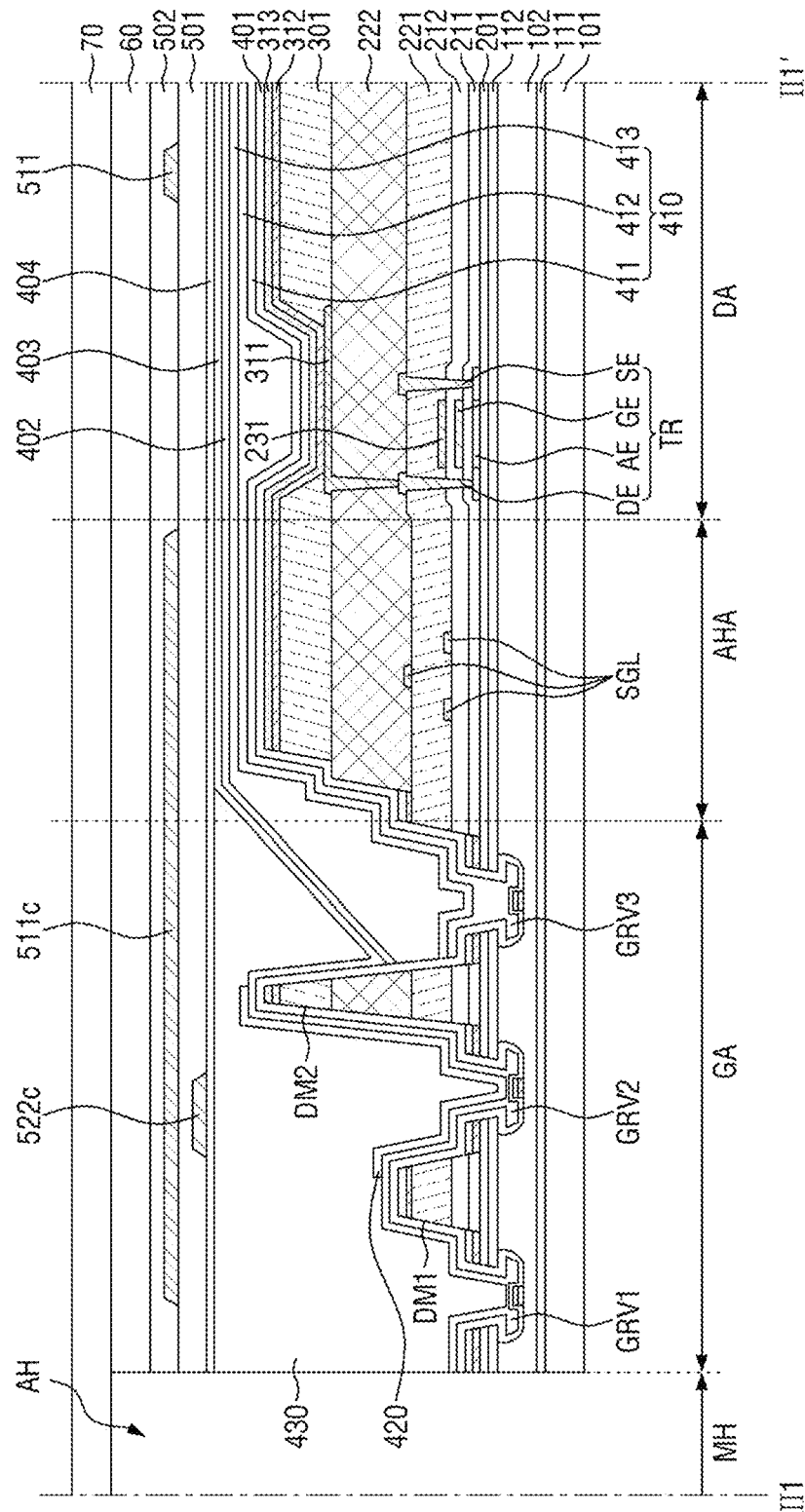
FIG. 12 is a cross-sectional view taken along line II1-II1' of FIG. 11.

FIG. 11 is an enlarged plan view illustrating a part of an input sensing unit of an OLED display device according to another embodiment of the invention. FIG. 12 is a cross-sectional view taken along line II1-II1' of FIG. 11. FIGS. 11 and 12 illustrate a modified example of the input sensing unit 50 of FIGS. 9 and 10.

Referring to FIGS. 11 and 12, an input sensing unit 50 differs from its counterpart of FIGS. 9 and 10 in that it does not include a first bridge wire 512c, but includes a second bridge wire 522c.

The connectors may include the first and second connecting wires 511c and 521c and the connectors may further include the second bridge wire 522c. The first and second connecting wires 511c and 521c may both be disposed in a second touch conductive layer and may intersect each other. In order to prevent the first and second connecting wires 511c and 521c from being short-circuited, the second connecting wire 521c may be insulated from the first connecting wire 511c via the second bridge wire 522c.

The second connecting wire 521c may be disconnected from the second touch conductive layer at the intersection between the first and second connecting wires 511c and 521c. The second bridge wire 522c may be disposed in a first conductive layer. A first touch insulating layer 501 may include third contact holes CNT3, which expose the second bridge wire 522c. The second connecting wire 521c may be connected to the second bridge wire 522c via the third contact holes CNT3, and as a result, a second detection electrode including the second bridge wire 522c can maintain its electrical connection.

Figure 13:
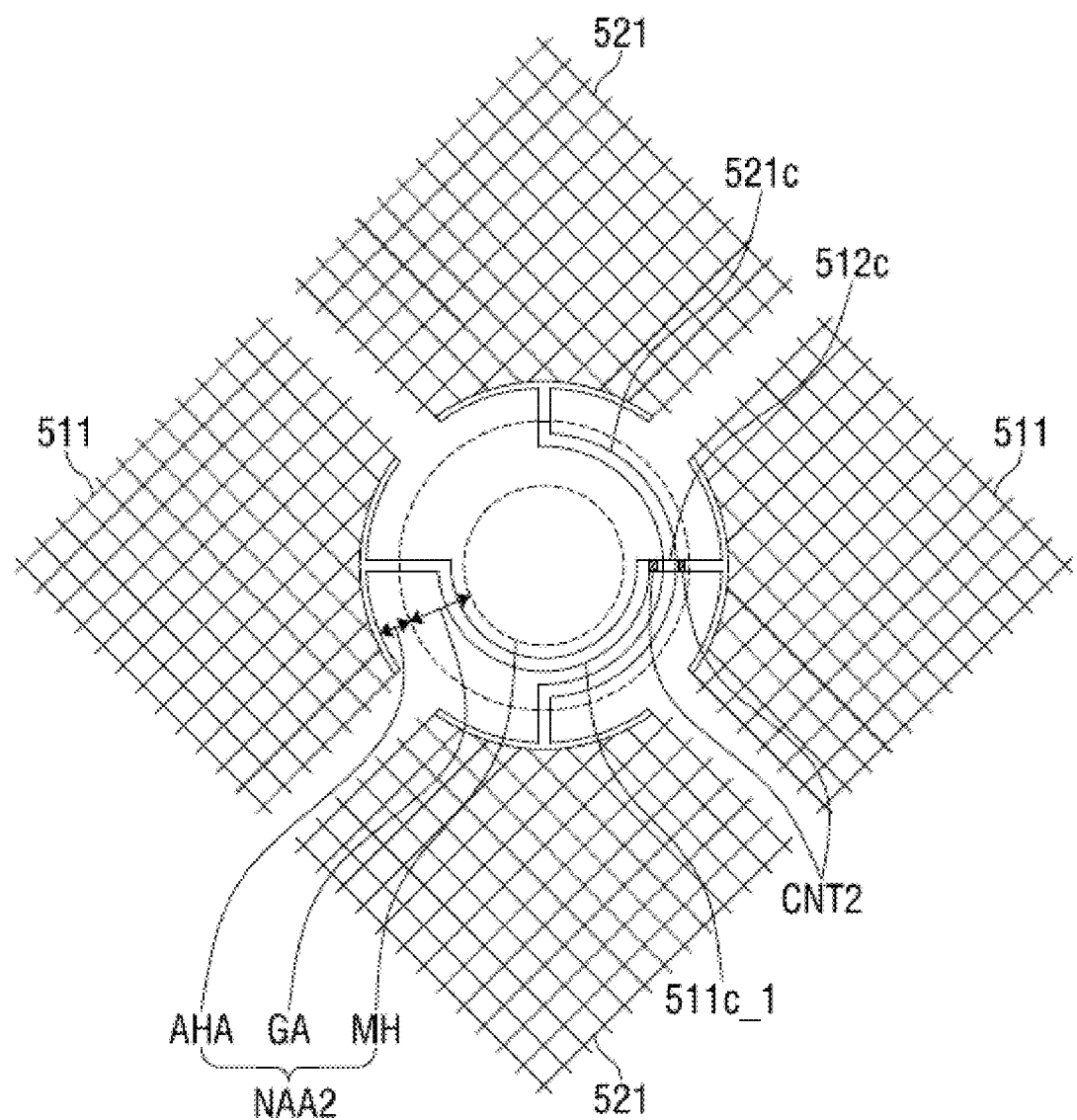
FIGS. 13 through 15 are enlarged plan views illustrating parts of input sensing units of OLED display devices constructed according to other embodiments of the invention.
Figure 14:
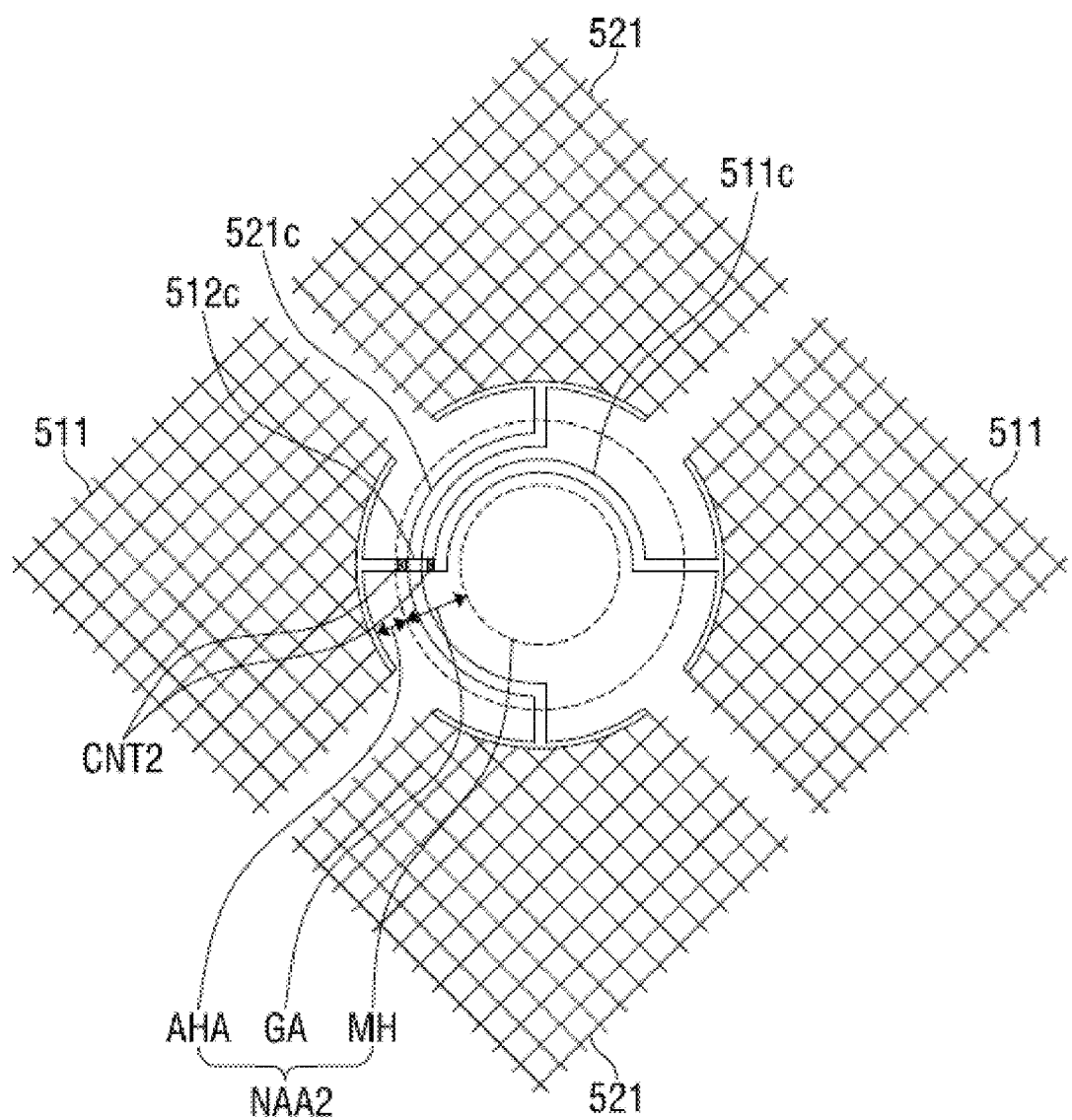
Figure 15:
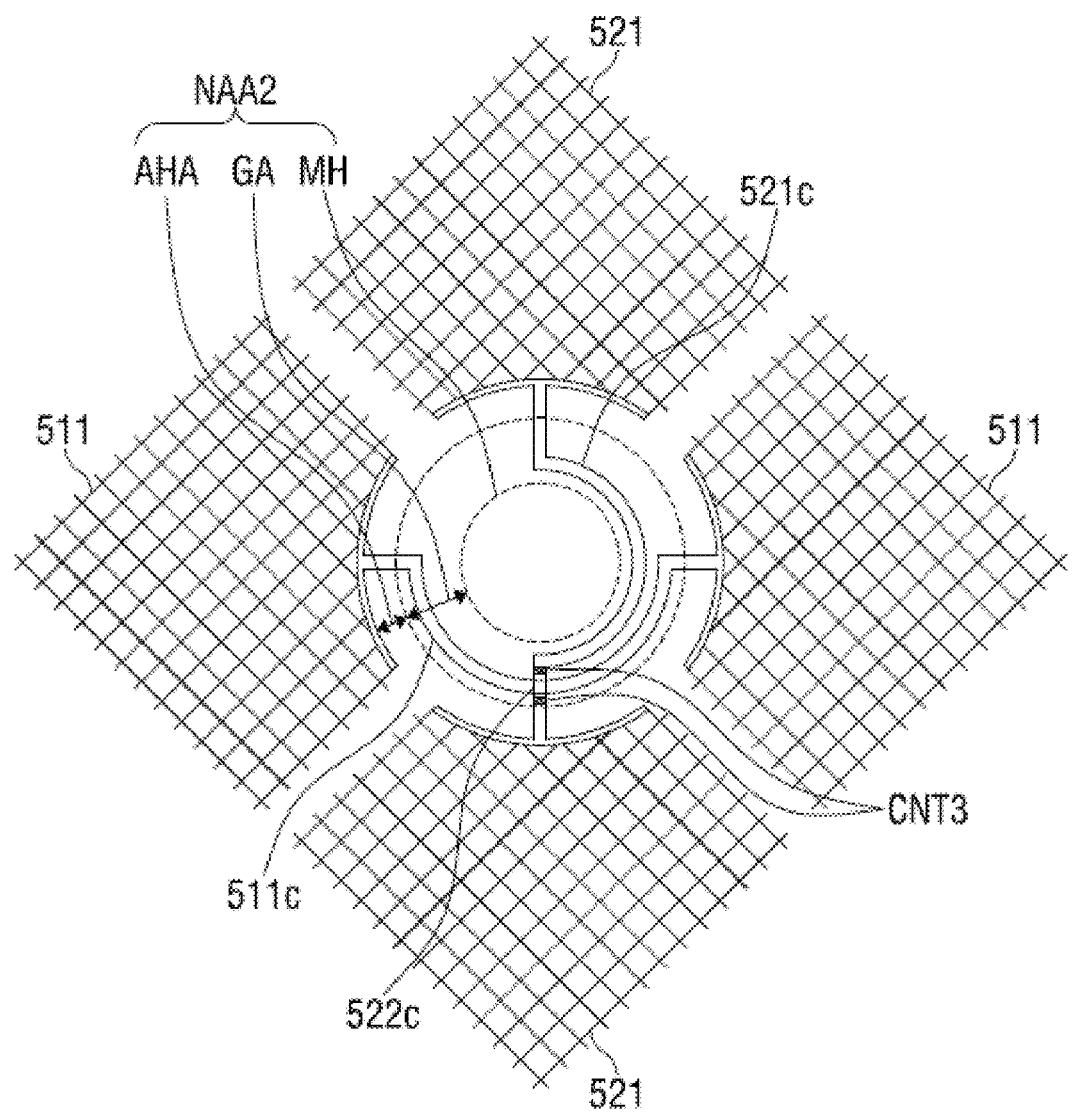

FIGS. 13 through 15 are enlarged plan views illustrating parts of input sensing units of OLED display devices according to other embodiments of the invention. FIGS. 13 through 15 illustrate other modified examples of the input sensing unit of FIG. 9.

Referring to FIG. 13, an input sensing unit differs from its counterpart of FIG. 9 in that a first connecting wire 511c bypasses a main hole area MH below a groove area GA.

A second connecting wire 521c may bypass a central part of a hole AH from the left side of the groove area GA.

Referring to FIG. 14, an input sensing unit 50 differs from its counterpart of FIG. 9 in the location of the intersection between first and second connecting wires 511c and 521c.

The intersection between the first and second connecting wires 511c and 521c is not limited to being on the right side of a groove area GA. The first and second connecting wires 511c and 521c may intersect each other on the left side of a main hole area MH. In this case, a first bridge wire 512c may be disposed on the right side of the groove area GA.

Referring to FIG. 15, an input sensing unit 50 differs from its counterpart of FIG. 9 in that a first connecting wire 511c bypasses a central part of a main hole area MH from the outside of a second connecting wire 521c.

The first and second connecting wires 511c and 521c both pass through a groove area GA when bypassing the main hole area MH, but the first connecting wire 511c may bypass a central part of a hole AH from the outside of the second connecting wire 521c.

Figure 16:
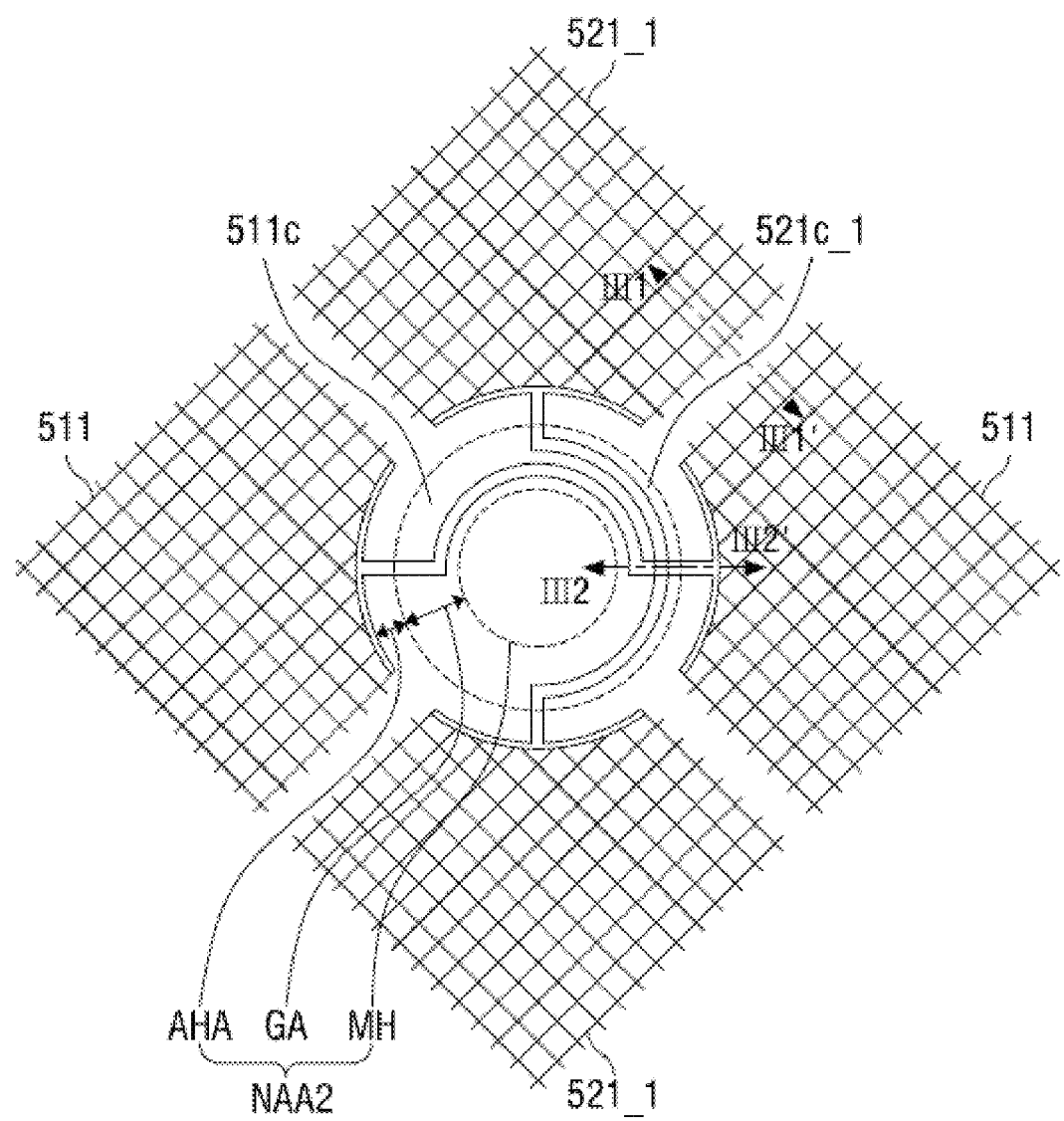
FIG. 16 is an enlarged plan view illustrating a part of an input sensing unit of an OLED display device constructed according to another embodiment of the invention.
Figure 17:
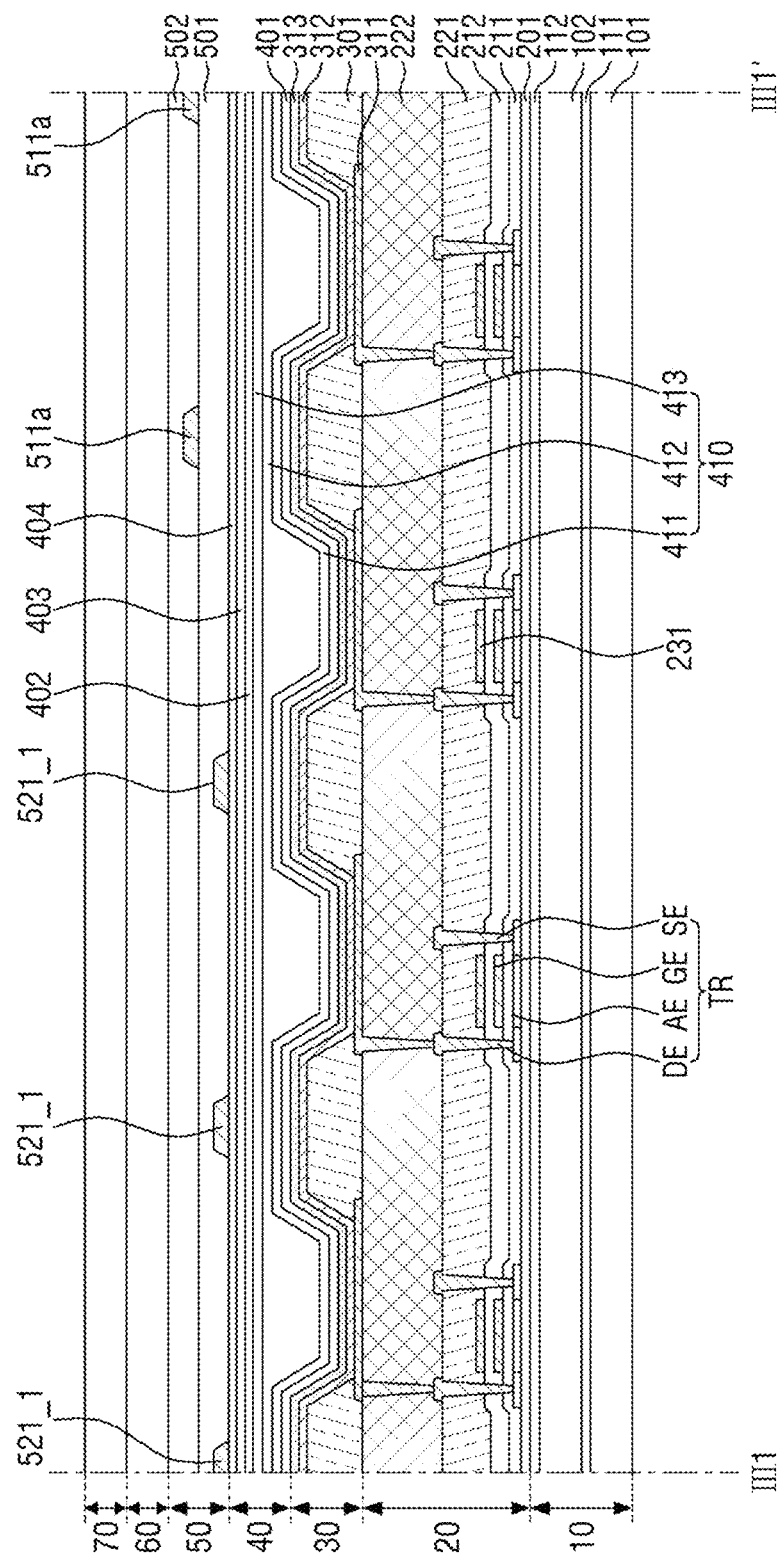
FIG. 17 is a cross-sectional view taken along line III1-III1' of FIG. 16.
Figure 18:
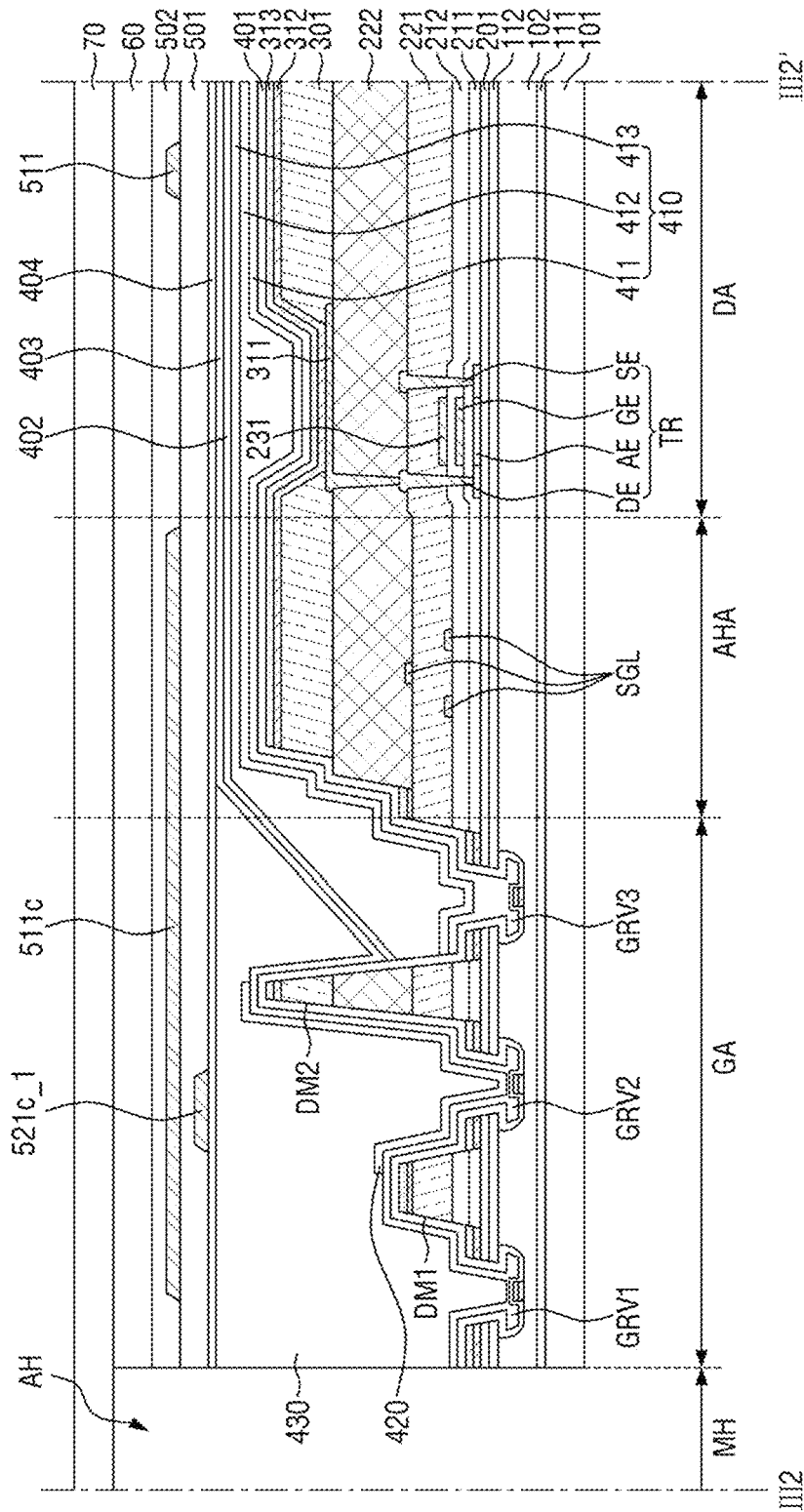
FIG. 18 is a cross-sectional view taken along line III2-III2' of FIG. 16.

FIG. 16 is an enlarged plan view illustrating a part of an input sensing unit of an OLED display device according to another embodiment of the invention. FIG. 17 is a cross-sectional view taken along line III1-III1' of FIG. 16. FIG. 18 is a cross-sectional view taken along line III2-III2' of FIG. 16.

Referring to FIGS. 16 through 18, an input sensing unit 50 differs from its counterparts of FIGS. 7, 9, and 10 in that first detection electrodes 510 are disposed in a first touch wire layer.

The first detection electrodes 510 may be disposed in the first touch wire layer. That is, first sensor members 511, first connecting members 512, and a first connecting wire 511c may be disposed in the first touch wire layer.

Second detection electrodes 520 may be disposed in a second touch wire layer. That is, second sensor members 521, second connecting members (522a and 522b), and a second connecting wire 521c may be disposed in the second touch wire layer.

The first detection electrodes 510 and the second detection electrodes 520 are disposed in different layers and a first touch insulating layer 501 is interposed between the first detection electrodes 510 and the second detection electrodes 520, no additional bridge wires may be needed for preventing a short circuit. Similarly, in a hole AH, no additional bridge wires may be needed because the first and second connecting wires 511c and 521c intersect each other in a plan view but are insulated from each other.

Figure 19:
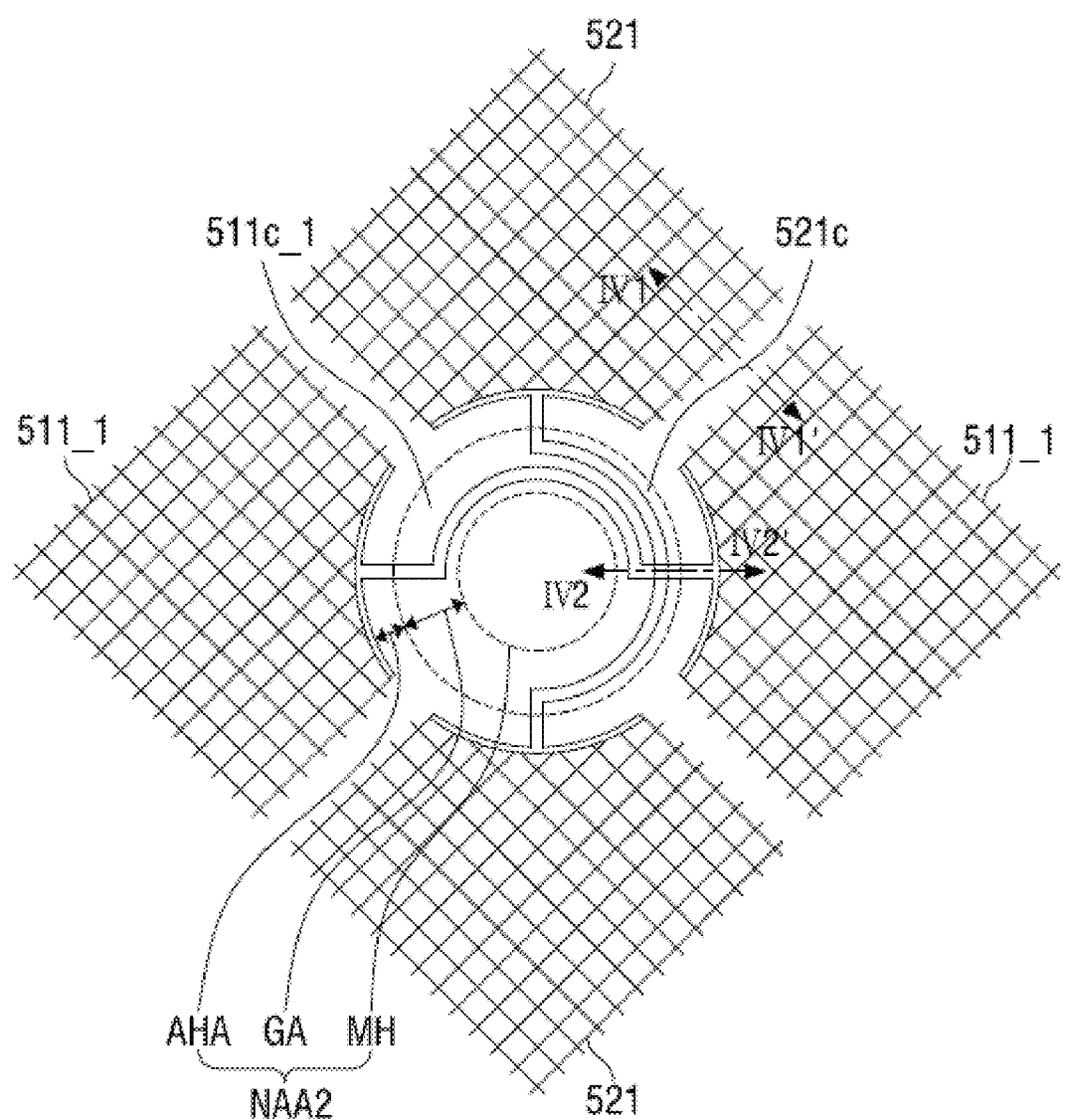
FIG. 19 is an enlarged plan view illustrating a part of an input sensing unit of an OLED display device constructed according to another embodiment of the invention.
Figure 20:
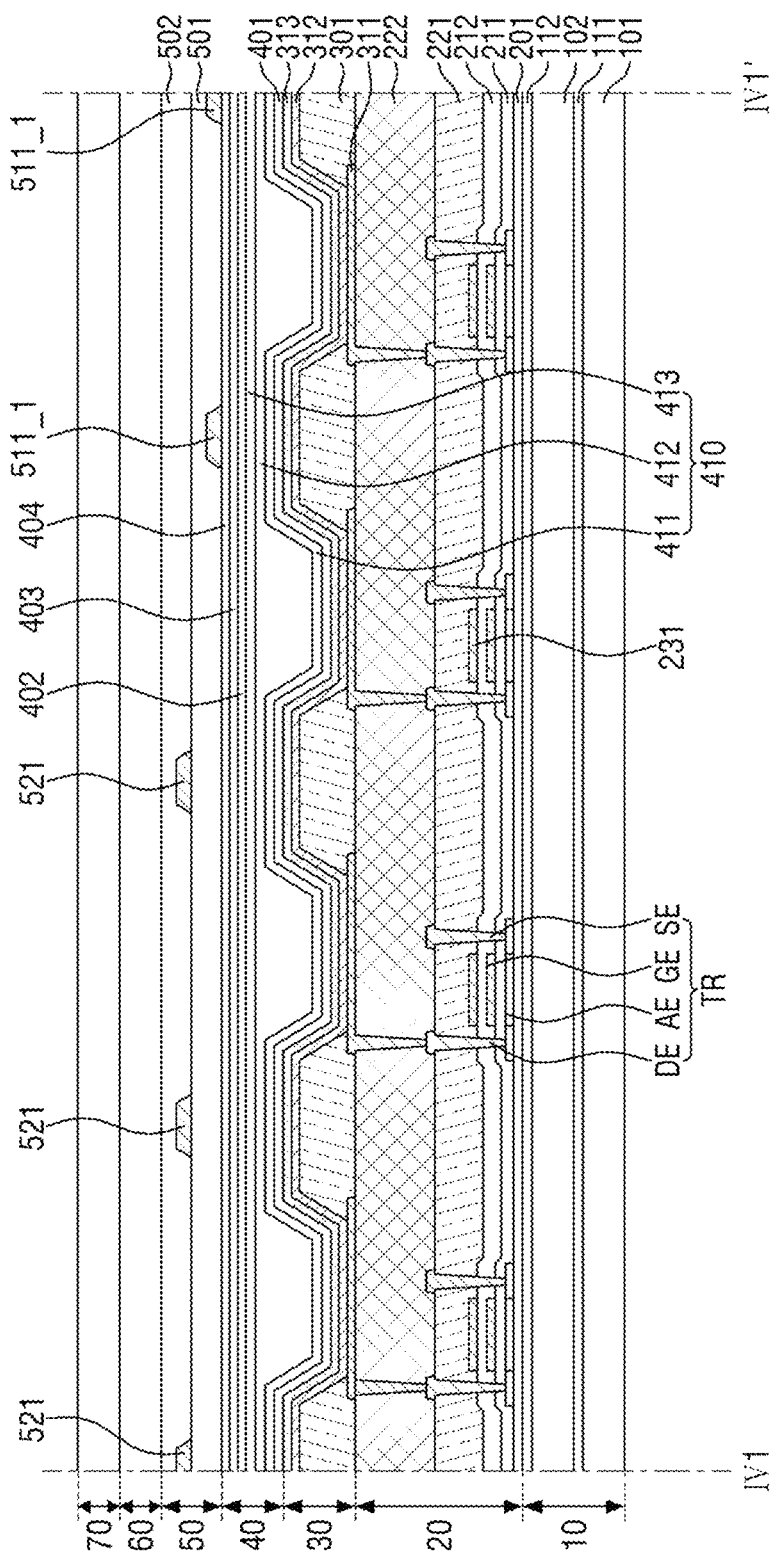
FIG. 20 is a cross-sectional view taken along line IV1-IV1' of FIG. 19.
Figure 21:
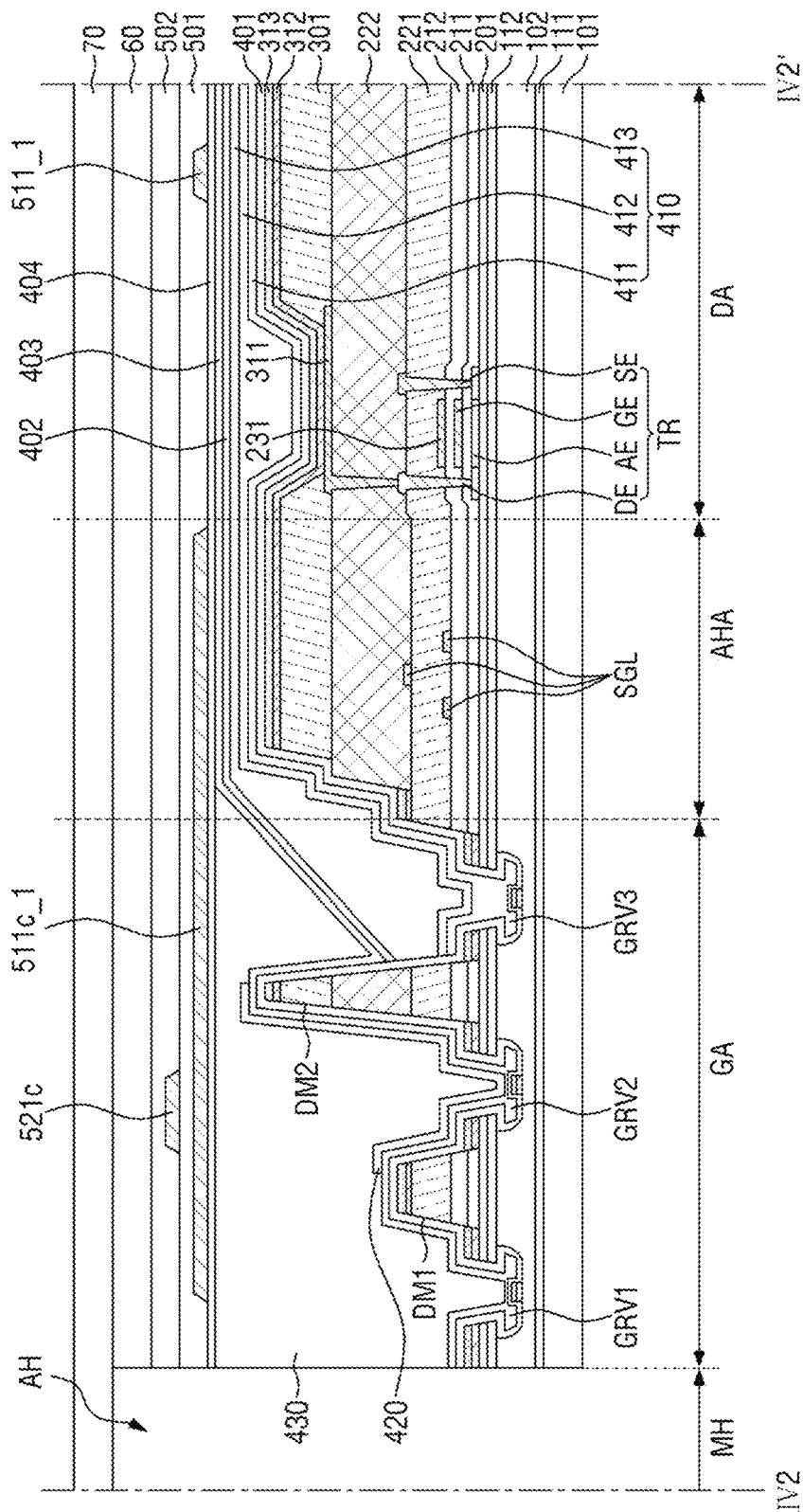
FIG. 21 is a cross-sectional view taken along line IV2-IV2' of FIG. 19.

FIG. 19 is an enlarged plan view illustrating a part of an input sensing unit of an OLED display device according to another embodiment of the invention. FIG. 20 is a cross-sectional view taken along line IV1-IV1' of FIG. 19. FIG. 21 is a cross-sectional view taken along line IV2-IV2' of FIG. 19.

Referring to FIGS. 19 through 21, an input sensing unit 50 differs from its counterparts of FIGS. 7, 9, and 10 in that second detection electrodes 520 are disposed in a first touch wire layer.

First detection electrodes 510 may be disposed in a second touch wire layer. That is, first sensor members 511, first connecting members 512, and a first connecting wire 511c may be disposed in the second touch wire layer.

The second detection electrodes 520 may be disposed in the first touch wire layer. That is, second sensor members 521, second connecting members (522a and 522b), and a second connecting wire 521c may be disposed in the first touch wire layer.

The first detection electrodes 510 and the second detection electrodes 520 are disposed in different layers and a first touch insulating layer 501 is interposed between the first detection electrodes 510 and the second detection electrodes 520, no additional bridge wires may be needed for preventing a short circuit. Similarly, in a groove area GA, no additional bridge wires may be needed because the first and second connecting wires 511c and 521c intersect each other in a plan view but are insulated from each other.

Figure 22:
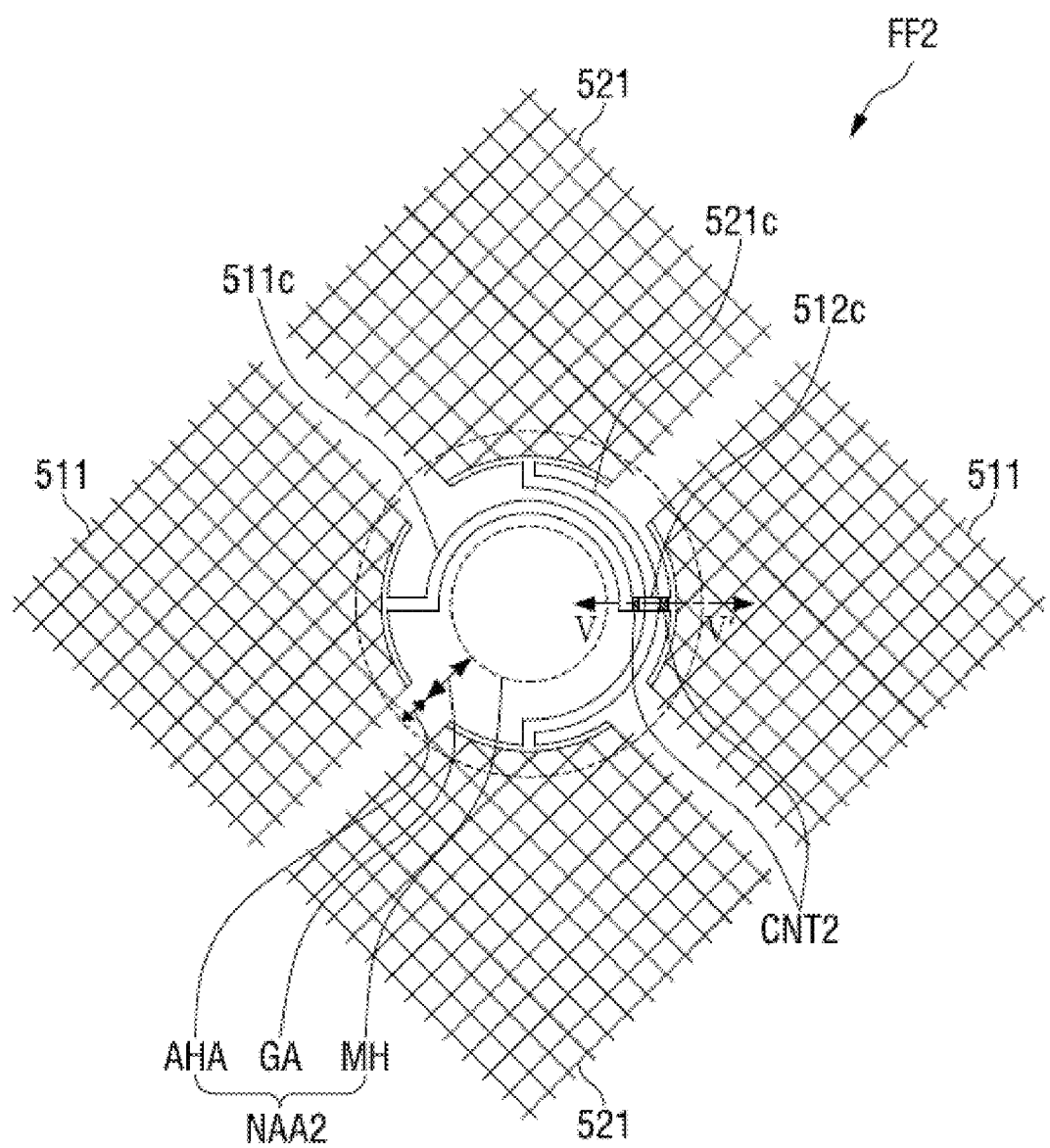
FIG. 22 is an enlarged plan view illustrating a part of an input sensing unit of an OLED display device constructed according to another embodiment of the invention.
Figure 23:
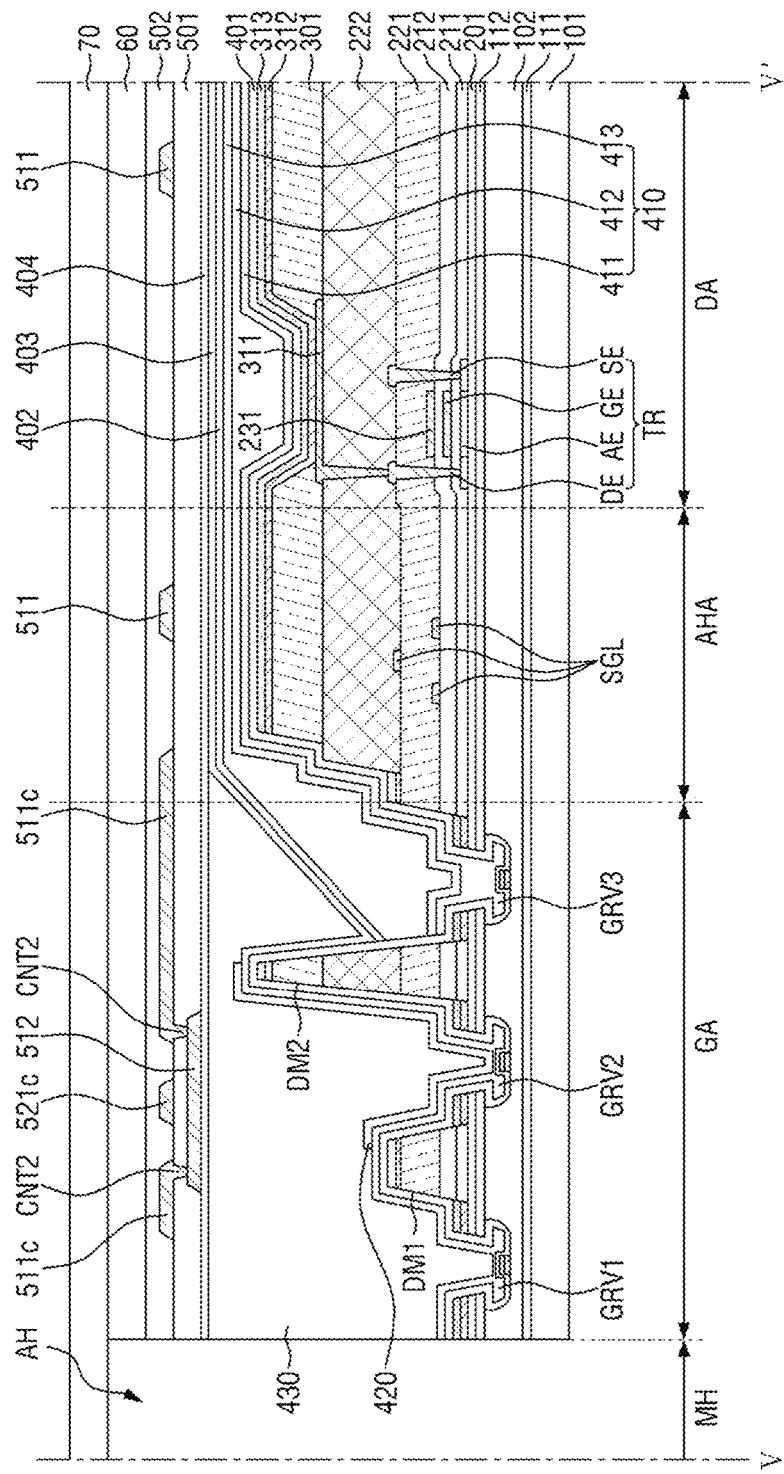
FIG. 23 is a cross-sectional view taken along line V1-V1' of FIG. 22.

FIG. 22 is an enlarged plan view illustrating a part of an input sensing unit of an OLED display device according to another embodiment of the invention. FIG. 23 is a cross-sectional view taken along line V1-V1' of FIG. 22.

Referring to FIGS. 22 and 23, an input sensing unit 50 differs from its counterpart of FIGS. 9 and 10 in that some first sensor members 511 and some second sensor members 521 are disposed in a second non-display area NDA2.

FIG. 22 illustrates that two first sensor members 511 are disposed adjacent to each other in a second direction dr2 with a hole AH interposed therebetween. The first sensor members 511 may extend even to a peripheral area AHA of the second non-display area NDA2. Since a first connecting wire 511c is disposed in a groove area GA, the first sensor members 511 may also be disposed in the peripheral area AHA.

Similarly, FIG. 22 illustrates that two second sensor members 521 are disposed adjacent to each other in a first direction dr1 with the hole AH interposed therebetween. Since a second connecting wire 521c is disposed in the groove area GA, the second sensor members 521 may also be disposed in the peripheral area AHA.

In the embodiment of FIGS. 22 and 23, since the areas of sensor members (511 and 521) that are disconnected by the second non-display area NDA2 can be compensated for, touch sensitivity can be improved.

Figure 24:
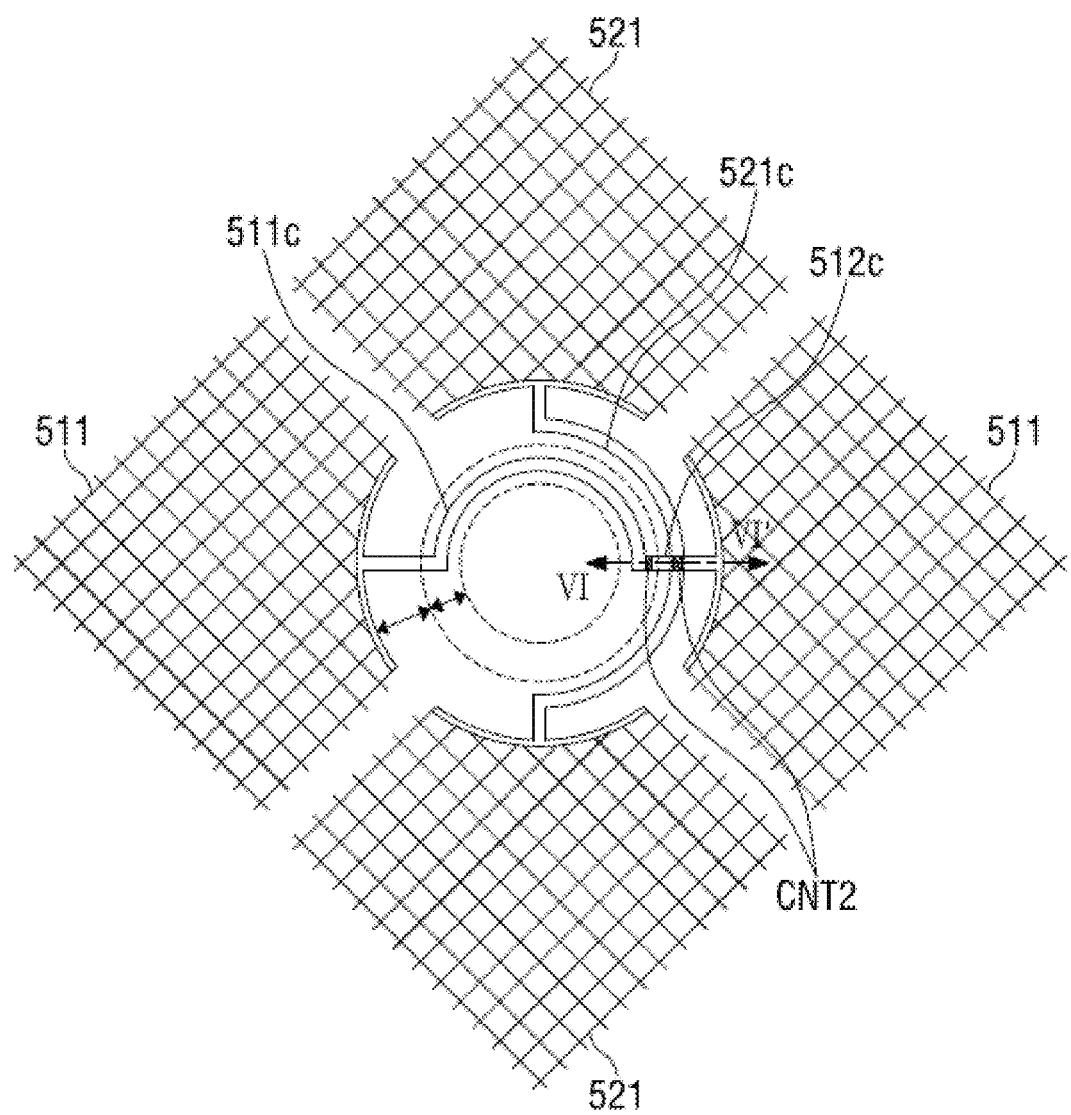
FIG. 24 is an enlarged plan view illustrating a part of an input sensing unit of an OLED display device constructed according to another embodiment of the invention.
Figure 25:
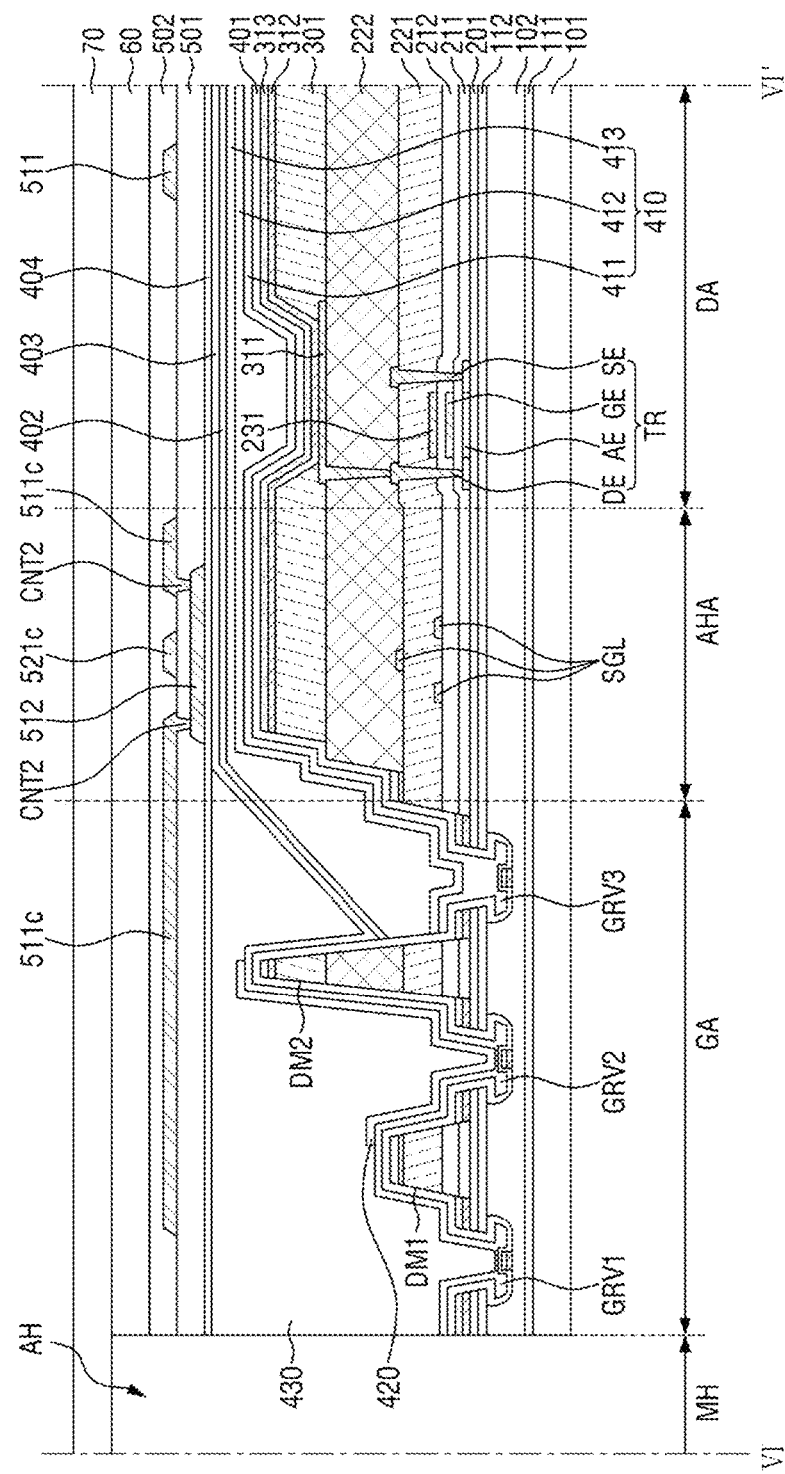
FIG. 25 is a cross-sectional view, taken along line V1-V1' of FIG. 22, of the input sensing unit of FIG. 24.

FIG. 24 is an enlarged plan view illustrating a part of an input sensing unit of an OLED display device according to another embodiment of the invention. FIG. 25 is a cross-sectional view, taken along line V1-V1' of FIG. 22, of the input sensing unit of FIG. 24.

Referring to FIGS. 24 and 25, an input sensing unit 50 differs from its counterpart of FIGS. 9 and 10 in that a second connecting wire 521c is disposed in a peripheral area AHA.

One of a first connecting wire 511c and the second connecting wire 521c may be disposed to pass through a groove area GA, and the other connecting wire may be disposed not to pass through the groove area GA, but to pass through the peripheral area AHA. The connecting wire disposed not to pass through the groove area GA, but to pass through the peripheral area AHA may be whichever of the first and second connecting wires 511c and 521c bypasses a main hole area MH from the outside of the other connecting wire.

For example, the second connecting wire 512c may bypass the main hole area MH from the outside of the first connecting wire 511c. In this case, the first connecting wire 511c may be disposed to bypass a central part of a hole AH from the groove area GA, and the second connecting wire 521c may be disposed to bypass the main hole area MH from the peripheral area AHA. Also, in a case where the first and second connecting wires 511c and 521c intersect each other in the peripheral area AHA, a first bridge wire 512c may be disposed in the peripheral area AHA.

Figure 26:
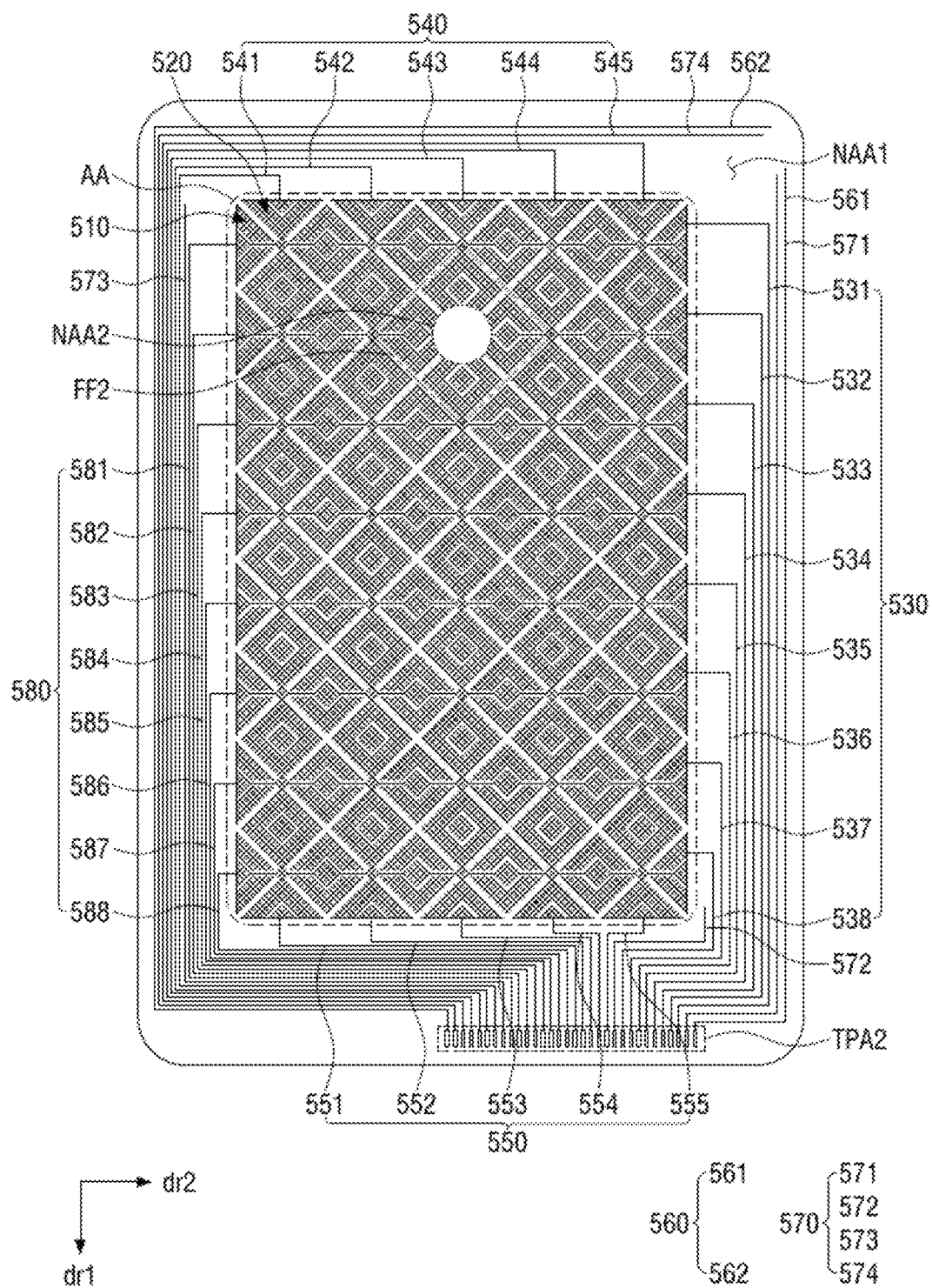
FIG. 26 is a plan view illustrating the layout of an input sensing unit included in an OLED display device constructed according to another embodiment of the invention.
Figure 27:
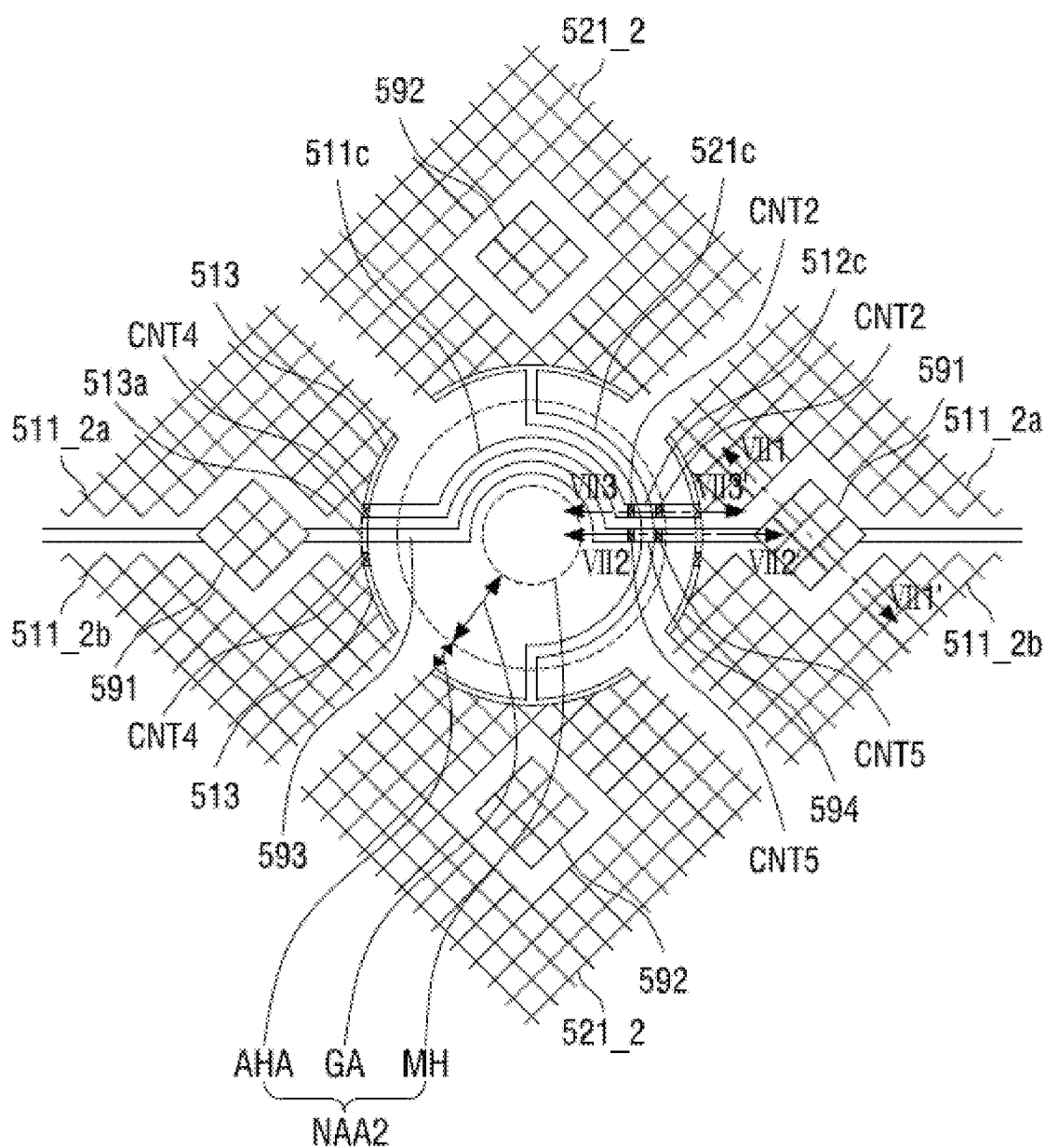
FIG. 27 is an enlarged plan view illustrating an area FF3 of FIG. 26.
Figure 28:
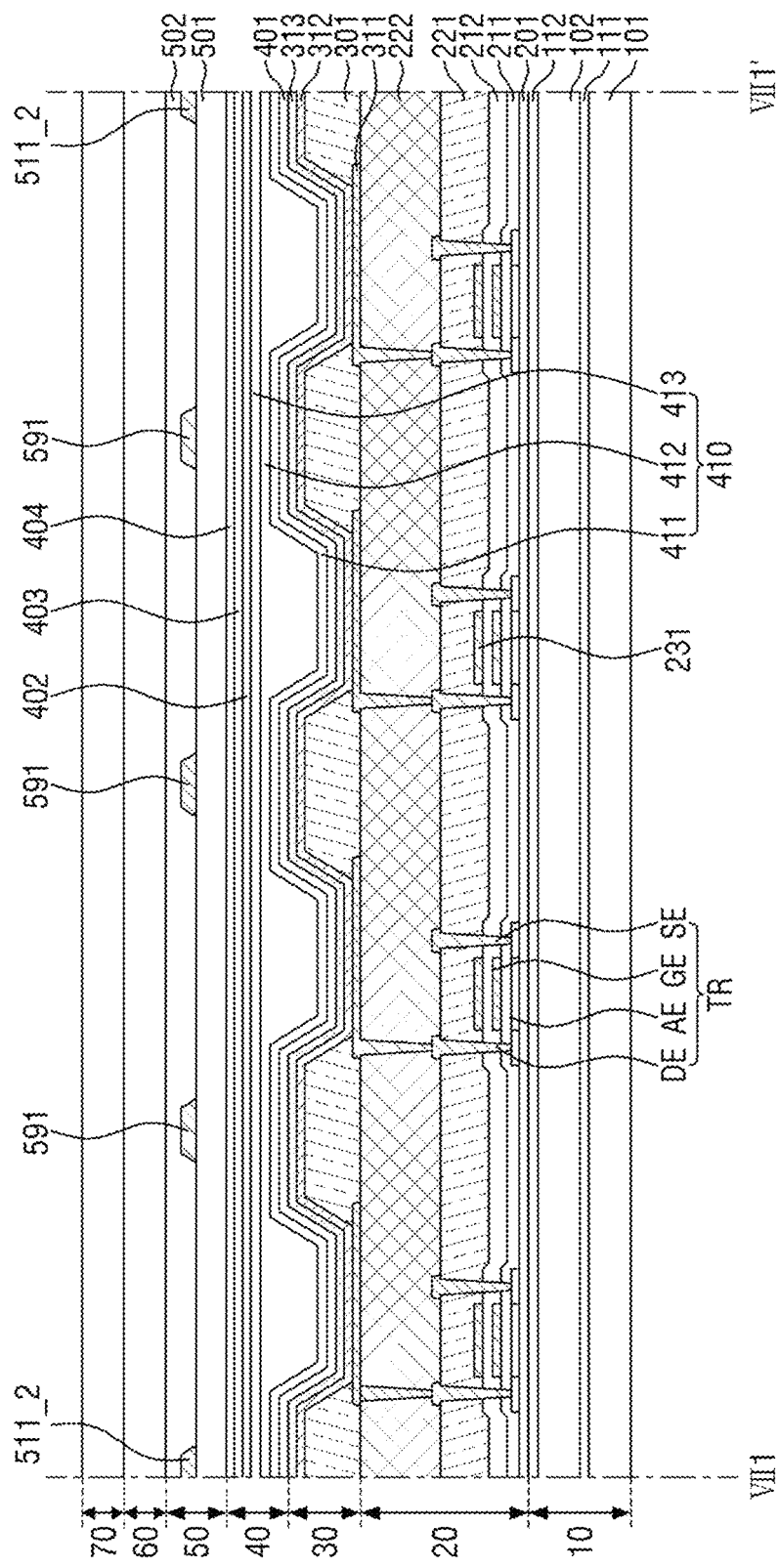
FIG. 28 is a cross-sectional view taken along line VII1-VII1' of FIG. 27.
Figure 29:
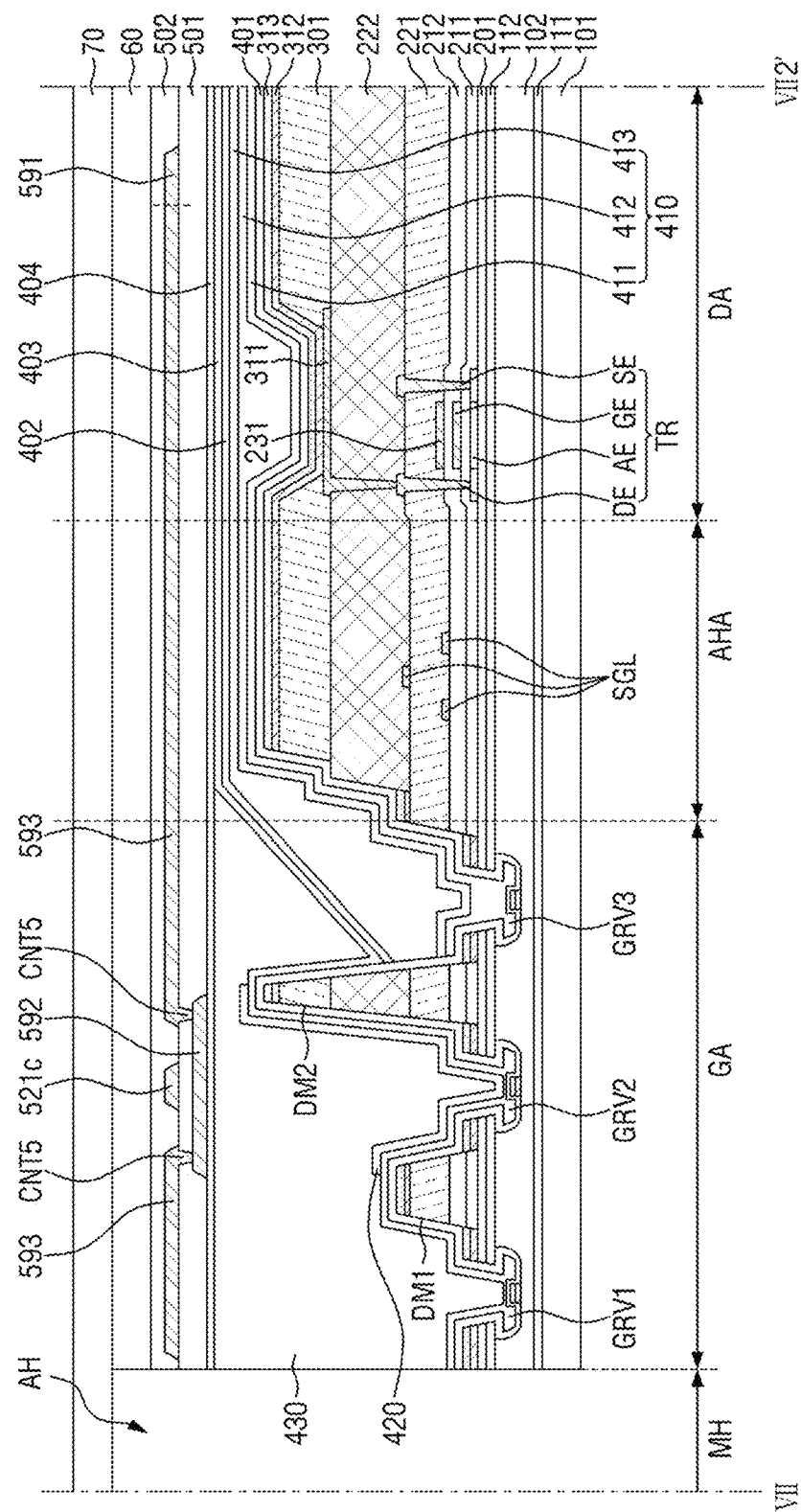
FIG. 29 is a cross-sectional view taken along line VII2-VII2' of FIG. 27.
Figure 30:
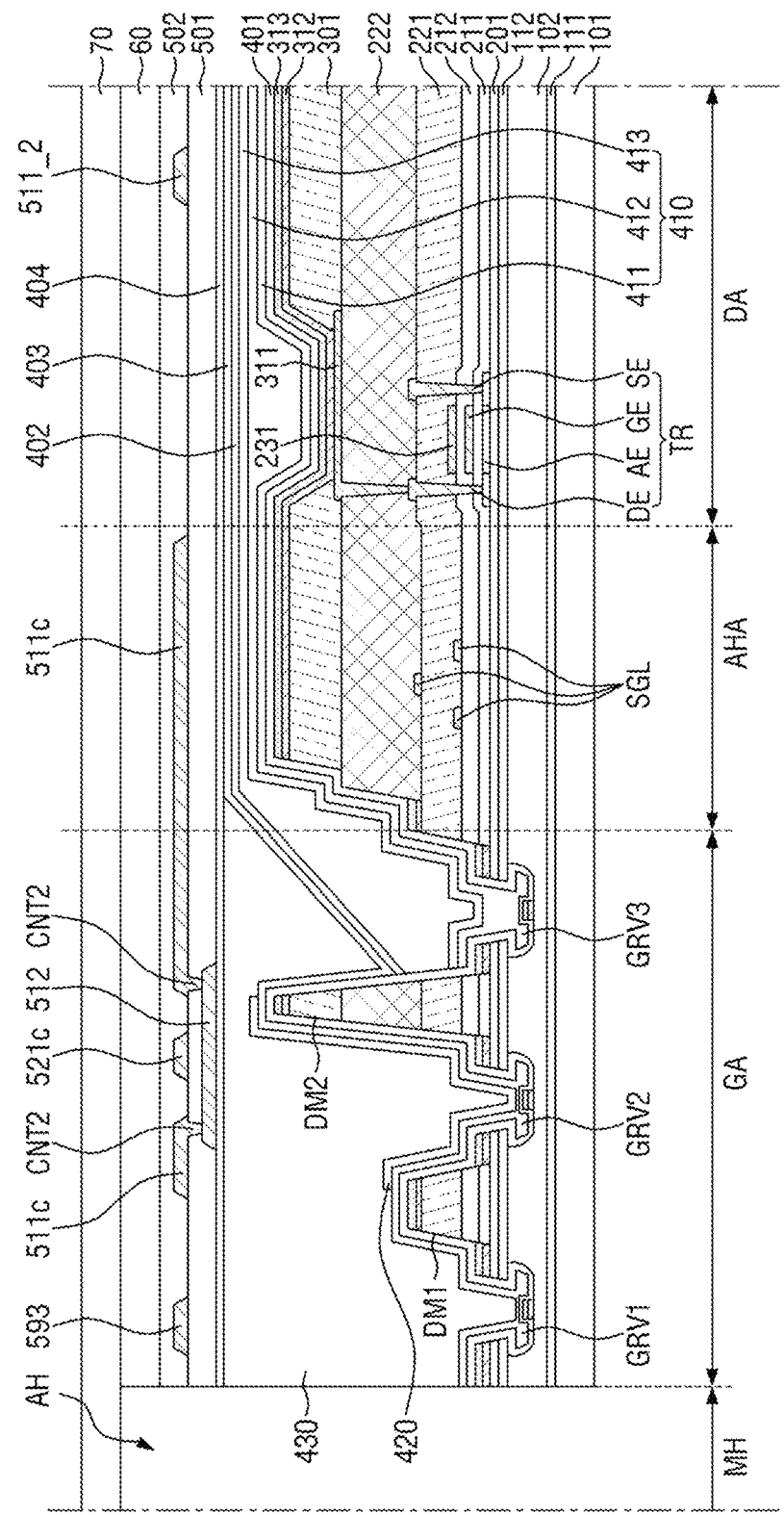
FIG. 30 is a cross-sectional view taken along line VII3-VII3' of FIG. 27.

FIG. 26 is a plan view illustrating the layout of an input sensing unit included in an OLED display device according to another embodiment of the invention. FIG. 27 is an enlarged plan view illustrating an area FF3 of FIG. 26. FIG. 28 is a cross-sectional view taken along line VII1-VII1' of FIG. 27. FIG. 29 is a cross-sectional view taken along line VII2-VII2' of FIG. 27. FIG. 30 is a cross-sectional view taken along line VII3-VII3' of FIG. 27.

Referring to FIGS. 26 through 30, an input sensing unit 50 differs from its counterpart of FIGS. 5, 9, and 10 in that it further includes first electrode patterns 591 and second electrode patterns 592.

The input sensing unit 50 may include the first electrode patterns 591 in each first sensor member (511_2a and 511_2b) of each first detection electrode 510 and may include the second electrode patterns 592 in each second sensor member 521_2 of each second detection electrode 520.

The first electrode patterns 591 may be disposed in each first detection electrode 510. The first electrode patterns 591 may be insulated from each first detection electrode 510. A plurality of first electrode patterns 591 may be arranged in substantially the same direction as each first sensor member (511_2a and 511_2b), i.e., in a second direction dr2. The first electrode patterns 591 may have a similar shape to each first sensor member (511_2a and 511_2b), i.e., a rhombus shape, but the inventive concepts are not limited thereto.

Pairs of adjacent first electrode patterns 591 may be connected by a third connecting wire 593. By designing the first electrode patterns 591 and the third connecting wire 593 to not overlap with each first sensor member (511_2a and 511_2b), which is disposed in the same layer as the first electrode patterns 591 and the third connecting wire 593, electrical interference between the first electrode patterns 591/the third connecting wire 593 and each first sensor member (511_2a and 511_2b) can be prevented. As a result, the electrical reliability of the input sensing unit 50 can be improved.

The first electrode patterns 591 and the third connecting wire 593 may extend across a first sensor member (511_2a and 511_2b) so that the first sensor member (511_2a and 511_2b) can be divided into first and second sub-sensor members 511_2a and 511_2b by the first electrode patterns 591 and the third connecting wire 593. The first and second sub-sensor members 511_2a and 511_2b may maintain their electrical connection to each other via a third bridge wire 513a.

The third bridge wire 513a may intersect the third connecting wire 593. In one embodiment, the third bridge wire 513a may be disposed in a first touch conductive layer, and the third connecting wire 593 and the first electrode patterns 591 may be disposed in a second touch conductive layer. A first touch insulating layer 501 may be interposed between the third connecting wire 593 and the third bridge wire 513a so that the third connecting wire 593 and the third bridge wire 513a can be insulated from each other.

The first touch insulating layer 501 may include a plurality of fourth contact holes CNT4, which expose parts of the third bridge wire 513a. Each of the first and second sub-sensor members 511_2a and 511_2b may include third connecting members 513. The third connecting members 513 may be in contact with the third bridge wire 513a via the fourth contact holes CNT4, and the first and second sub-sensor members 511_2a and 511_2b may be electrically connected.

In one embodiment, the first electrode patterns 591 and the third connecting wire 593 may form a noise detection electrode. The noise detection electrode may change the reference potential of each first detection electrode 510 using an output signal (i.e., a noise signal) and may thus offset (or eliminate) common mode noise that may be introduced into each first sensor member 511.

The first electrode patterns 591 may be connected to sixth signal lines 580. The sixth signal lines 580 may extend from touch pad terminals in a second pad area TPA2 along one side and/or the other side of a first non-sensing area NAA1 and may be disposed between fifth signal lines 570 and a sensing area AA.

The sixth signal lines 580 may be noise detection wires. In one embodiment, the sixth signal lines 580 may include first through eighth noise detection wires 581 through 588. A voltage signal for detecting noise may be applied to the sixth signal lines 580.

Two first electrode patterns 591 may be disposed adjacent to each other via a hole AH interposed therebetween, and a third connecting wire 593 connecting these two first electrode patterns 591 may be disposed to bypass a central part of the hole AH.

In one embodiment, the third connecting wire 593, a first connecting wire 511c, and a second connecting wire 521c may be sequentially arranged from a main hole area MH and may all be disposed to bypass the main hole area MH.

The third connecting wire 593 may intersect the second connecting wire 521c in a plan view. In order to prevent the third connecting wire 593 and the second connecting wire 521c from being short-circuited, a fourth bridge wire 594 may be provided at the intersection between the third connecting wire 593 and the second connecting wire 521c so that the third connecting wire 593 can maintain its electrical connection to the second connecting wire 521c via the fourth bridge wire 594. In one embodiment, the fourth bridge wire 594 may be disposed in the first touch conductive layer, and the second connecting wire 521c may be disposed in the second touch conductive layer. The first touch insulating layer 501 may include a plurality of fifth contact holes CNT4, which expose parts of the fourth bridge wire 594. The third connecting wire 593 may be in contact with the fourth bridge wire 594 via the fifth contact holes CNT4 and can maintain its electrical connection.

In one embodiment, the first, second, and third connecting wires 511c, 521c, and 593 may be disposed to pass through a groove area GA. In the groove area GA, the first, second, and third connecting wires 511c, 521c, and 593 do not overlap with signal lines SGL. The signal lines SGL are disposed in a peripheral area AHA, but the first, second, and third connecting wires 511c, 521c, and 593 are disposed to pass through the groove area GA. Accordingly, signal interference between the signal lines SGL and the first, second, and third connecting wires 511c, 521c, and 593 can be reduced.

The second electrode patterns 592 may be disposed in each second sensor member 521_2. The second electrode patterns 592 may be insulated from each second sensor member 520. A plurality of second electrode patterns 592 may be arranged in substantially the same direction as each second sensor member 521_2, i.e., in a first direction dr1. The second electrode patterns 592 may have a similar shape to each second sensor member 521_2, i.e., a rhombus shape, but the inventive concepts are not limited thereto.

The second electrode patterns 592 may be dummy patterns. The second electrode patterns 592 may be formed to make the area of each first sensor member (511_2a and 511_2b), which is reduced due to the formation of the first electrode patterns 591, similar to the area of each second sensor member 521_2. The second electrode patterns 592 may be island patterns, and thus, no connecting wires may be provided to connect pairs of adjacent second electrode patterns 592. The second electrode patterns 592 may be formed in the same layer as the first electrode patterns 591, e.g., in the second touch conductive layer. That is, each first sensor member (511_2a and 511_2b), each second sensor member 521_2, the first electrode patterns 591, the second electrode patterns 592, and the first, second, and third connecting wires 511c, 521c, and 594 may all be disposed in the same layer, e.g., in the second touch conductive layer.

Figure 31:
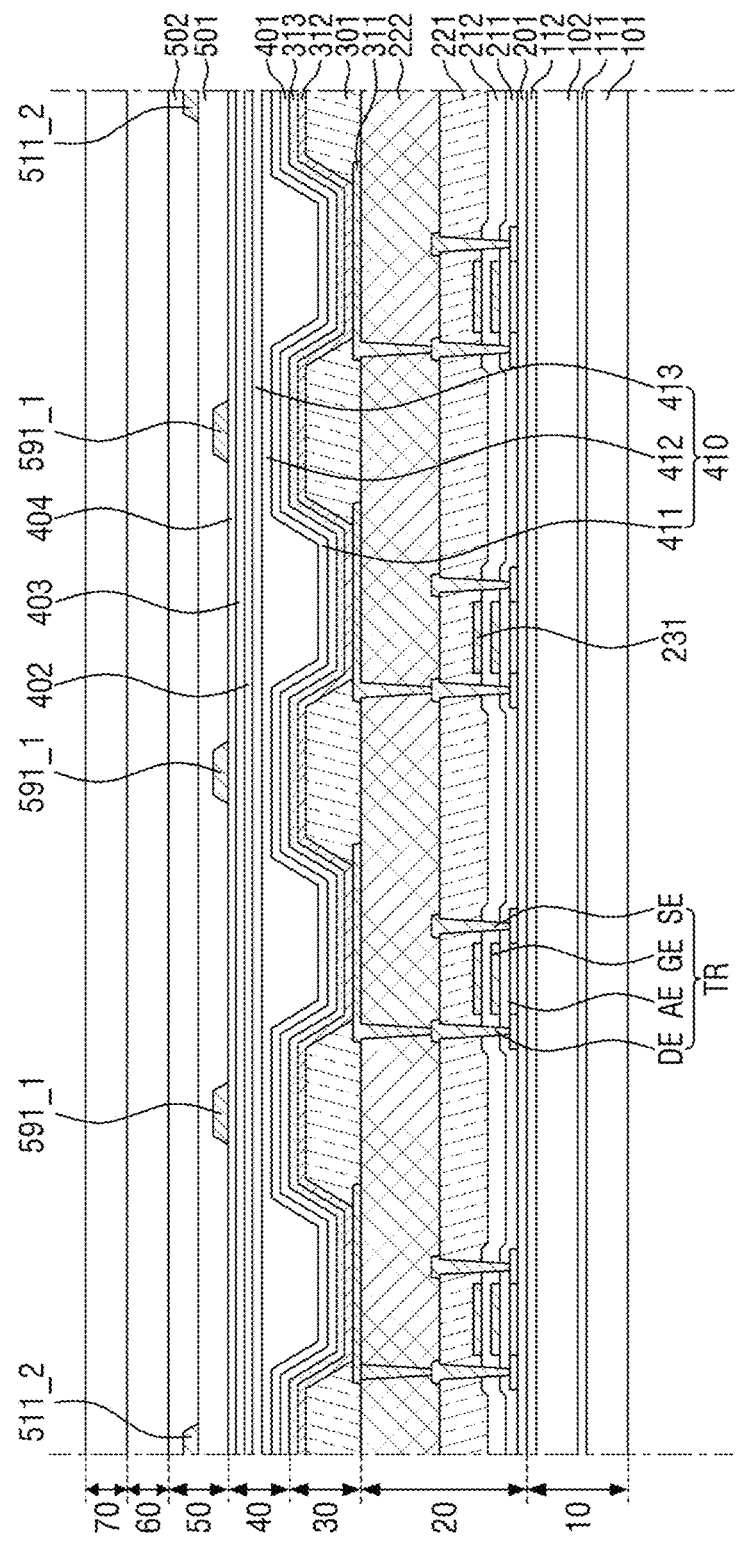
FIGS. 31 through 33 are cross-sectional views of an OLED display device constructed according to another embodiment of the invention.
Figure 32:
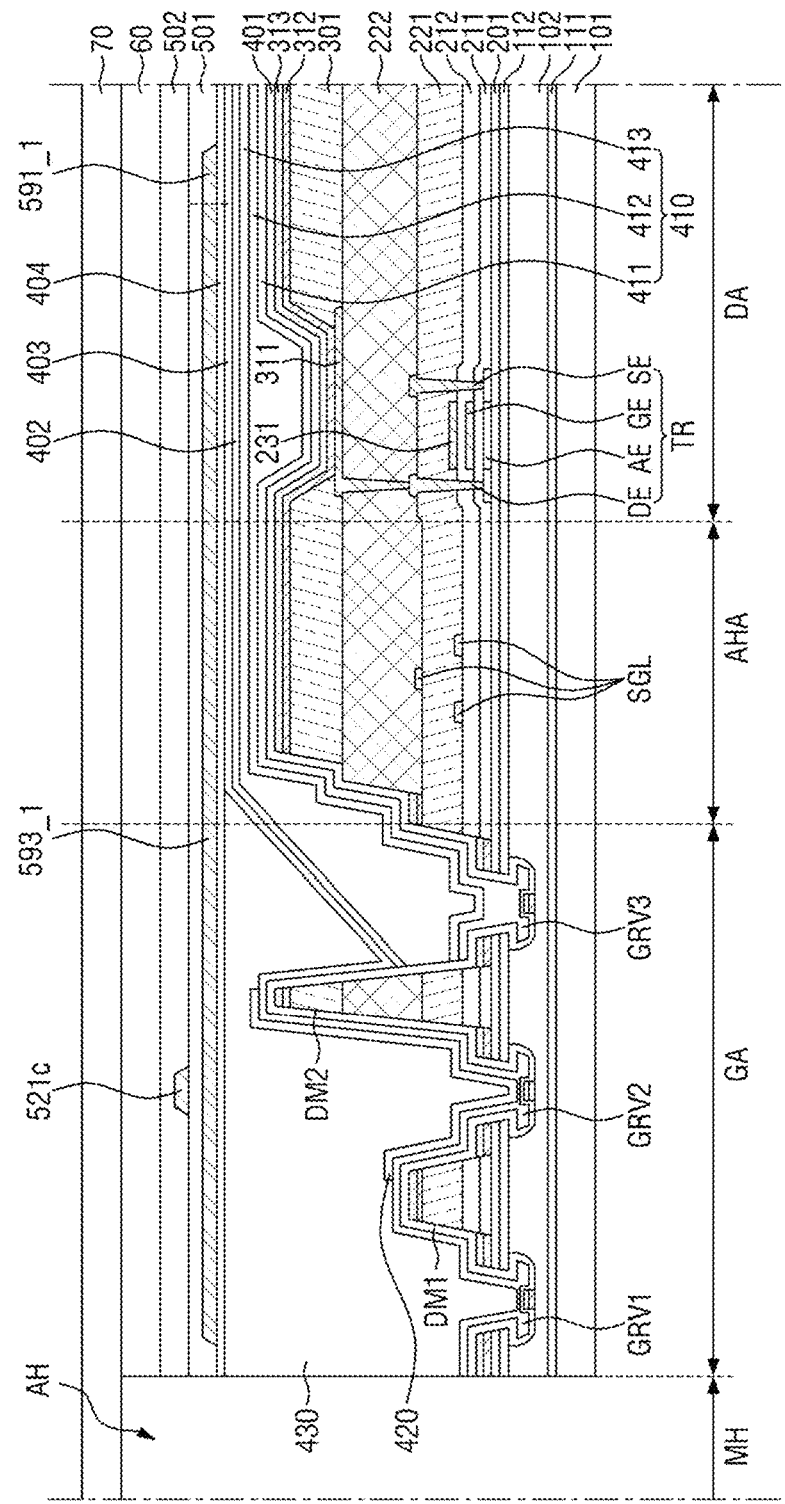
Figure 33:
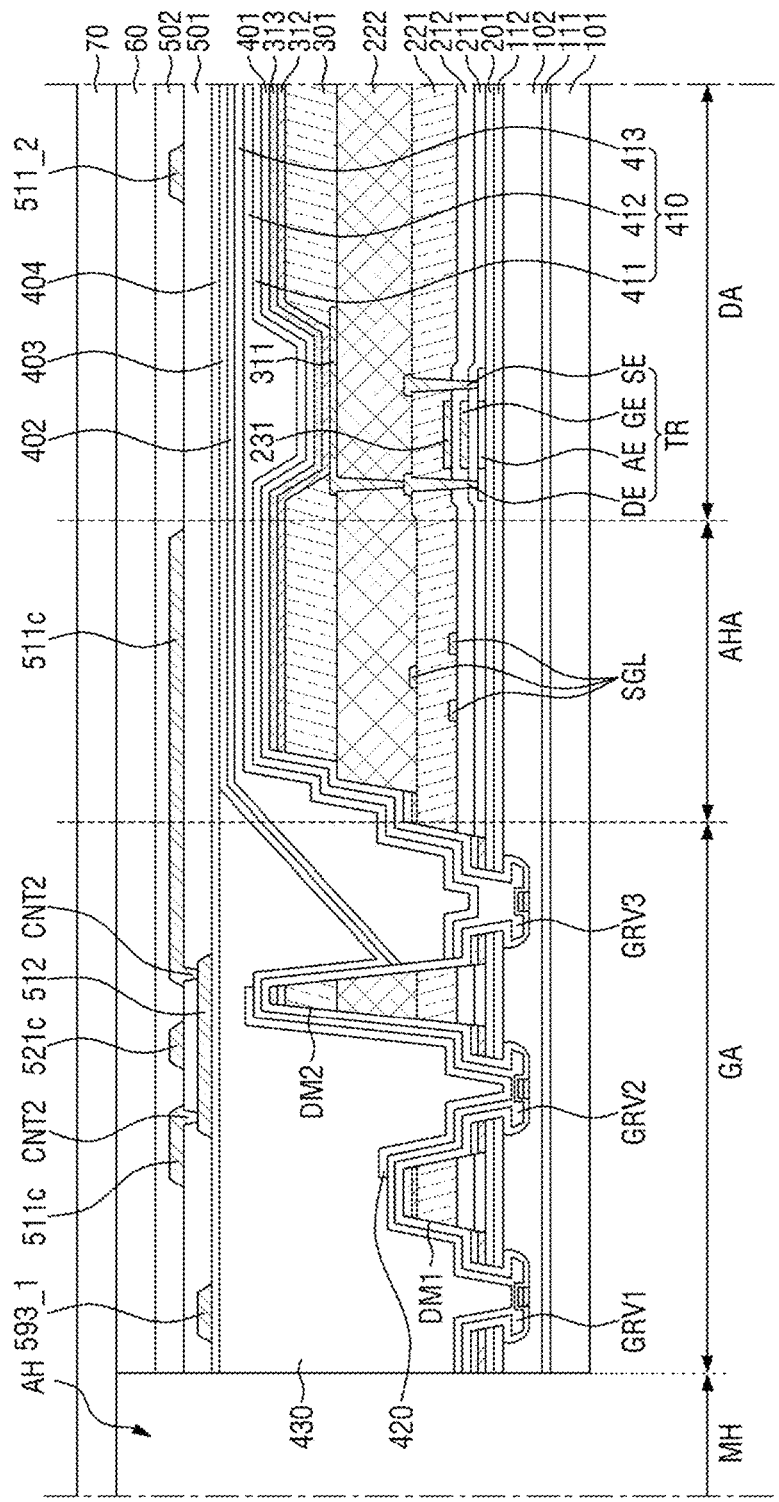

FIGS. 31 through 33 are cross-sectional views of an OLED display device according to another embodiment of the invention. FIGS. 31 through 33 illustrate a modified example of the OLED display device of FIGS. 28 through 30.

Referring to FIGS. 31 through 33, the OLED display device of FIGS. 31 through 33 differs from the OLED display device of FIGS. 28 through 30 in that first electrode patterns 591_1 and second electrode patterns 592 are disposed in a first touch conductive layer.

The first electrode patterns 591_1 may be disposed in the first touch conductive layer. A third connecting wire 593_1 may also be disposed in the first touch conductive layer.

The third connecting wire 593_1 may extend across a second connecting wire 521c and a third connecting member 513 in a plan view. Since the third connecting wire 593 may be disposed in the first touch conductive layer and the second connecting wire 521c and the third connecting member 513 may be disposed in a second touch conductive layer, the third connecting wire 593 can be insulated from the second connecting wire 521c and the third connecting member 513 without the aid of an additional bridge wire.

Figure 34:
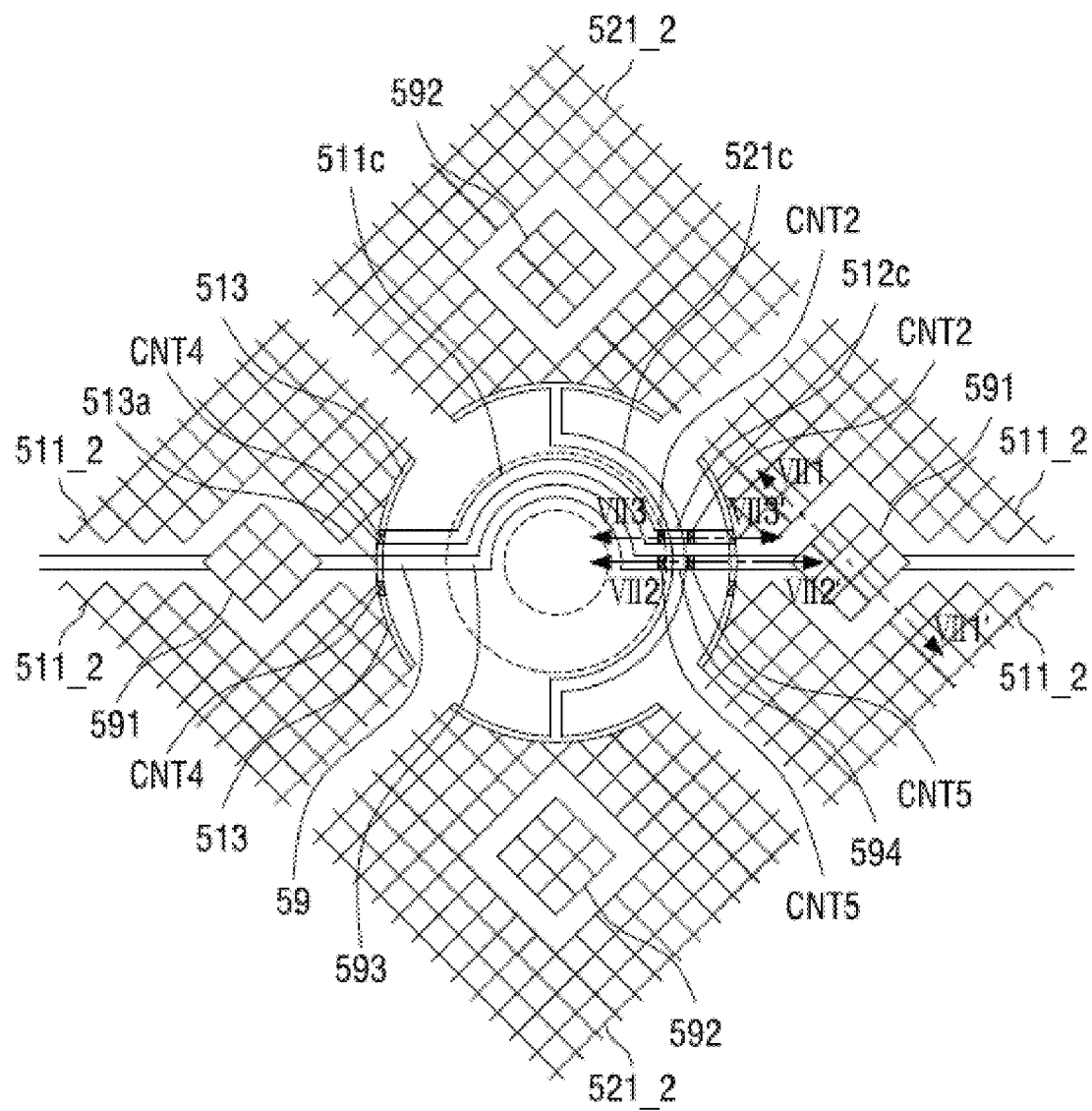
FIGS. 34 and 35 are enlarged plan views illustrating parts of input sensing units of OLED display devices constructed according to other embodiments of the invention.
Figure 35:
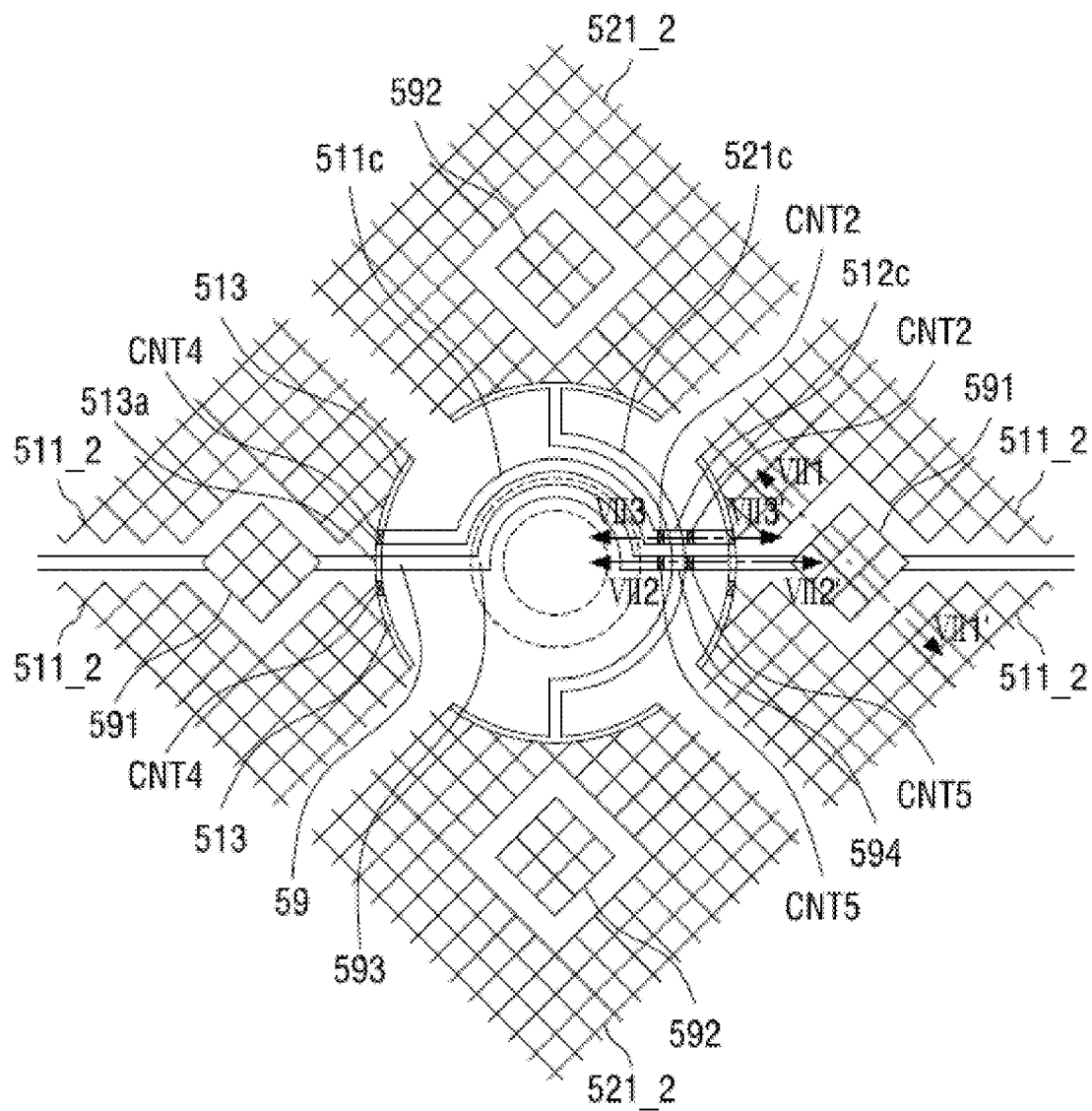

FIGS. 34 and 35 are enlarged plan views illustrating parts of input sensing units of OLED display devices according to other embodiments of the invention. FIGS. 34 and 35 illustrate modified examples of the input sensing unit of FIG. 27.

Referring to FIGS. 34 and 35, the input sensing units of FIGS. 34 and 35 differ from the input sensing unit of FIG. 27 in that at least one of first and second connecting wires 511c and 521c is disposed only in a peripheral area AHA.

Some of first second, and third connecting wires 511c, 521c, and 593 may not be disposed in a groove area GA. For example, as illustrated in FIG. 34, the second connecting wire 521c may not be disposed in the groove area GA and may be disposed to bypass a main hole area MH from the peripheral area AHA. In another example, as illustrated in FIG. 35, both the first and second connecting wires 511c and 521c may not be disposed in the groove area GA and may bypass the main hole area MH from the peripheral rea AHA.

Since some of the first, second, and third connecting wires 511c, 521c, and 593 may be disposed in the groove area GA and signal lines SGL are disposed only in the peripheral area AHA, signal interference can be reduced.

Figure 36:
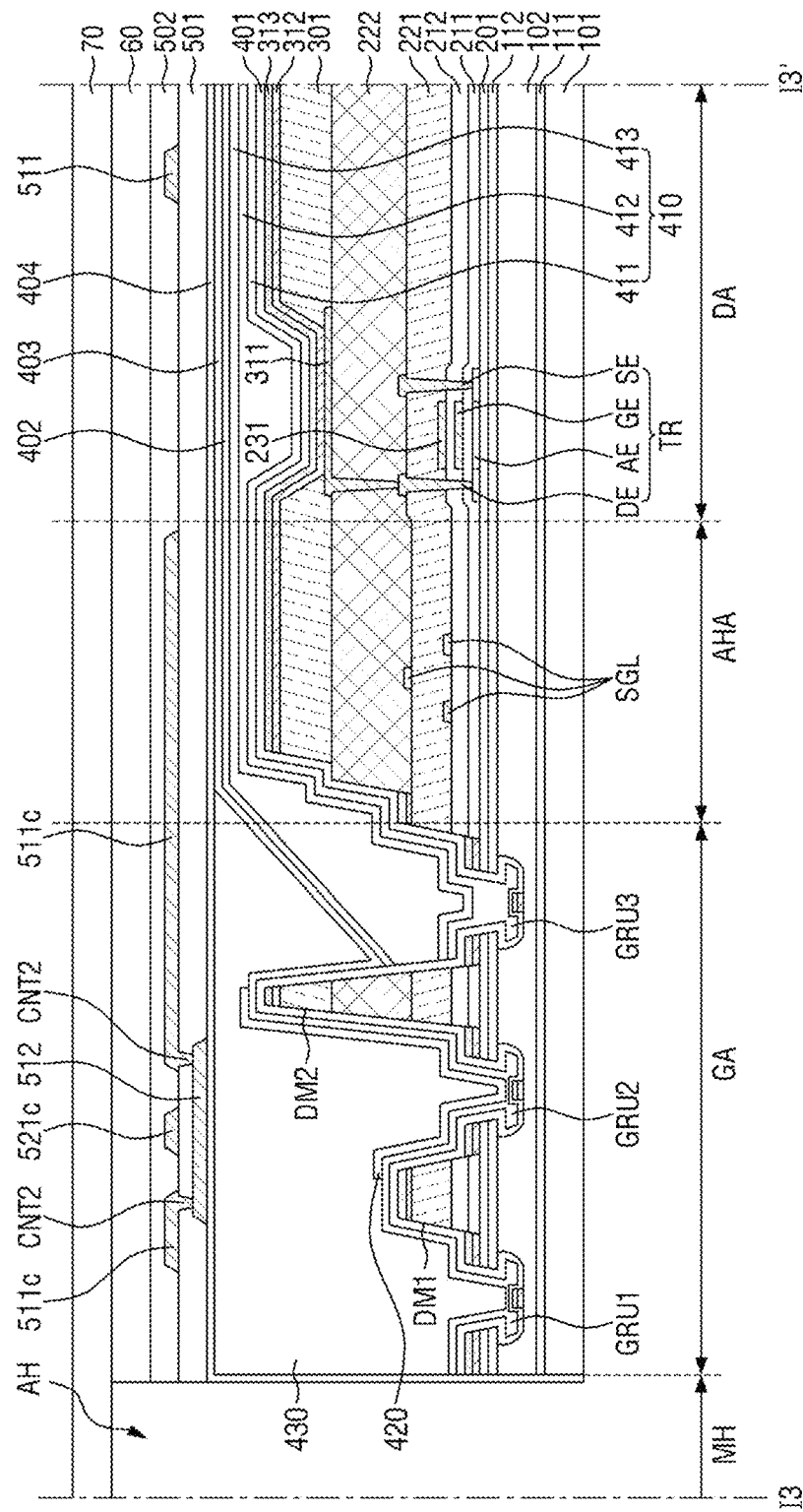
FIG. 36 is a cross-sectional view of an OLED display device according to another embodiment of the invention.

FIG. 36 is a cross-sectional view of an OLED display device according to another embodiment of the invention. FIG. 36 illustrates a modified example of the OLED display device of FIG. 10.

Referring to FIG. 36, the OLED display device of FIG. 36 differs from the OLED display device of FIG. 10 in that a fourth capping layer 404 extends to surround a sidewall of a light-emitting substrate 1000 that is in contact with a hole AH.

The fourth capping layer 404 may be formed to extend even between the edge of a main hole area MH and the light-emitting substrate 1000. The fourth capping layer 404 may planarize a sidewall of the hole AH. The fourth capping layer 404 can prevent a hole overcoat layer 430 from penetrating the main hole area MH.

Figure 37:
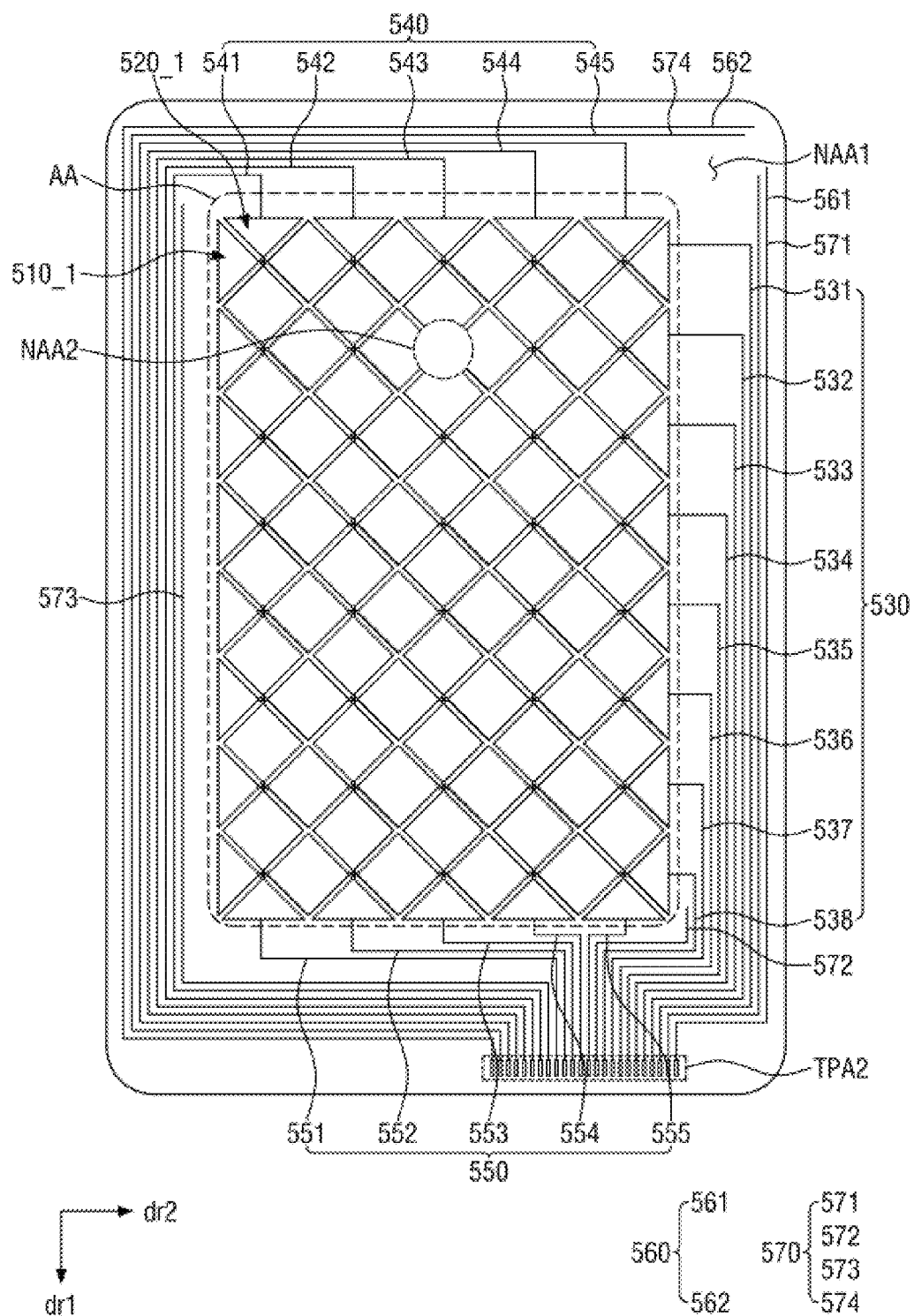
FIG. 37 is an enlarged plan view illustrating the layout of an input sensing unit of an OLED display device constructed according to another embodiment of the invention.

FIG. 37 is an enlarged plan view illustrating the layout of an input sensing unit of an OLED display device according to another embodiment of the invention. FIG. 37 illustrates a modified example of the input sensing unit of FIG. 5.

Referring to FIG. 37, the input sensing unit of FIG. 37 differs from its counterpart of FIG. 5 in the shape of detection electrodes (510_1 and 520_1).

The shape of the detection electrodes (510_1 and 520_1) is not limited to a mesh shape. The detection electrodes (510_1 and 520_1) may include transparent electrodes. The transparent electrodes may include a transparent conductive oxide such as indium tin oxide, indium zinc oxide, zinc oxide, or indium tin zinc oxide.

While the embodiments of the invention have been mainly described, they are merely examples and are not intended to limit the invention, and it will be understood by those of ordinary skill in the art that various modifications and applications which are not illustrated above can be made without departing from the essential characteristics of the embodiments of the invention. For example, the respective components which are specifically illustrated in the embodiments of the invention may be practiced with modifications. Further, the differences relating to such modifications and applications should be construed as being included in the scope of the invention as defined by the appended claims.

Although certain exemplary embodiments and implementations have been described herein, other embodiments and modifications will be apparent from this description.

Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate having a first area and a second area that surrounds the first area;
a light-emitting element disposed on the substrate in the second area;
a dam disposed on the substrate in the first area;
a first layer disposed on the light-emitting element;
a second layer disposed in the first area and covers the dam;
an input sensing unit disposed on the first layer and the second layer; and
a hole which penetrates a front surface of the substrate and a rear surface of the substrate,
wherein the first area is disposed between the second area and the hole in a plan view,
wherein the input sensing unit includes two first sensor members disposed in the second area, a first connecting wire disposed in the first area, a first bridge connector disposed in the first area and connected to the first connecting wire, and
wherein the two first sensor members are electrically connected via the first connecting wire and the first bridge connector.

2. The display device of claim 1, wherein the first connecting wire and the first bridge connector overlap the second layer.

3. The display device of claim 1, wherein the two first sensor members are disposed adjacent to each other in a first direction with the hole interposed therebetween.

4. The display device of claim 3, wherein:
the input sensing unit further includes two second sensor members and a second connector;
the two second sensor members are disposed adjacent to each other in a second direction that intersects the first direction with the hole interposed therebetween;
the second connector connects the two second sensor members; and
the second connector overlaps the second layer.

5. The display device of claim 4, wherein the second connector comprises a second connecting wire insulated from the first connecting wire.

6. The display device of claim 5, wherein the first bridge connector and the second connecting wire intersect and are insulated from each other.

7. The display device of claim 5, wherein the input sensing unit further includes a first touch conductive layer, a second touch conductive layer, and an insulating layer disposed between the first touch conductive layer and the second touch conductive layer, and
wherein the two first sensor members, the two second sensor members, the first connecting wire, and the second connecting wire are disposed in the first touch conductive layer.

8. The display device of claim 7, wherein the first bridge connector is disposed in the second touch conductive layer.

9. The display device of claim 4, wherein:
the input sensing unit further includes two first electrode patterns disposed in each of the two first sensor members and a third connector which connects the two first electrode patterns;

the two first electrode patterns are insulated from each of the two first sensor members; and
the third connector overlaps the second layer.

10. The display device of claim 9, wherein:
the input sensing unit further includes two second electrode patterns disposed in each of the two second sensor members; and
the two second electrode patterns are insulated from each of the two second sensor members.

11. The display device of claim 10, wherein the two second electrode patterns are dummy patterns.

12. The display device of claim 1, wherein:
the first layer includes a first inorganic layer, a second inorganic layer and an organic layer disposed between the first inorganic layer and the second inorganic layer; and
a portion of the first layer is disposed between the second layer and the substrate.

13. The display device of claim 12, further comprising a capping layer disposed on the first layer and the second layer,
wherein the capping layer includes an inorganic material, and
wherein the input sensing unit is disposed on the capping layer.

14. A display device comprising:
a light-emitting substrate including a hole penetrating a front surface of the light-emitting substrate and a rear surface of the light-emitting substrate; and
an input sensing unit disposed on the light-emitting substrate,
wherein:
the light-emitting substrate includes a substrate having a first area, a second area, and a third area that are surrounded by the first area;
the second area overlaps with the hole;
the third area is disposed between the second area and the first area in a plan view;
the input sensing unit includes a first electrode pattern which overlaps the first area, a second electrode pattern which overlaps the first area, a first connecting wire which overlaps the third area, and a first bridge connector connected to the first connecting wire; and
the first electrode pattern and the second electrode pattern are electrically connected via the first connecting wire and the first bridge connector.

15. The display device of claim 14, wherein the first connecting wire bypasses the hole in the plan view.

16. The display device of claim 14, wherein each of the first electrode pattern and the second electrode pattern has a mesh structure.

17. The display device of claim 14, wherein:
the input sensing unit further includes a first detection electrode adjacent to the first electrode pattern, a second detection electrode adjacent to the second electrode pattern, and a second connecting wire electrically connecting the first detection electrode and the second detection electrode;
the first detection electrode is spaced apart from the first electrode pattern; and
the second detection electrode is spaced apart from the second electrode pattern.

18. The display device of claim 17, wherein:
the second connecting wire bypasses the hole in the plan view; and
the second connecting wire is spaced apart from the first connecting wire.

19. The display device of claim 14, wherein:

the input sensing unit further includes a first touch conductive layer, a second touch conductive layer, and a touch insulating layer disposed between the first touch conductive layer and the second touch conductive layer;

the first bridge connector is disposed in the first touch conductive layer; and the first electrode pattern, the second electrode pattern and the first connecting wire are disposed in the second touch conductive layer.

20. The display device of claim 14, wherein:

the substrate includes a groove recessed from a front surface of the substrate toward a rear surface of the substrate; and the first connecting wire overlaps the groove.

21. The display device of claim 20, wherein the light-emitting substrate further includes an overcoat layer in the third area, and wherein the overcoat layer overlaps the groove.

22. The display device of claim 21, wherein the first connecting wire is disposed on the overcoat layer and overlaps the overcoat layer.

\* \* \* \* \*